United States Patent
Okuno et al.

(10) Patent No.: US 10,411,003 B2
(45) Date of Patent: Sep. 10, 2019

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Naoki Okuno, Sagamihara (JP); Kosei Nei, Yokohama (JP); Hiroaki Honda, Odawara (JP); Naoto Yamade, Isehara (JP); Hiroshi Fujiki, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 4 days.

(21) Appl. No.: 15/725,519

(22) Filed: Oct. 5, 2017

(65) Prior Publication Data

US 2018/0108647 A1  Apr. 19, 2018

(30) Foreign Application Priority Data

Oct. 14, 2016  (JP) .................................. 2016-202389

(51) Int. Cl.
*H01L 27/02* (2006.01)
*H01L 27/11519* (2017.01)
(Continued)

(52) U.S. Cl.
CPC .... *H01L 27/0207* (2013.01); *H01L 27/11519* (2013.01); *H01L 27/11521* (2013.01);
(Continued)

(58) Field of Classification Search
CPC ........... H01L 27/1225; H01L 29/42384; H01L 29/66969; H01L 29/7869; H01L 29/78693; H01L 29/78696
See application file for complete search history.

(56) References Cited

U.S. PATENT DOCUMENTS 5,528,032 A  6/1996 Uchiyama
5,731,856 A  3/1998 Kim et al.
(Continued)

FOREIGN PATENT DOCUMENTS

JP  2007-096055 A  4/2007
JP  2007-123861 A  5/2007
(Continued)

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.
(Continued)

*Primary Examiner* — Matthew L Reames
*Assistant Examiner* — John Bodnar
(74) *Attorney, Agent, or Firm* — Robinson Intellectual Property Law Office; Eric J. Robinson

(57) ABSTRACT

A transistor includes a first insulator over a substrate; a first oxide thereover; a second oxide in contact with at least part of the top surface of the first oxide; a first conductor and a second conductor each in contact with at least part of the top surface of the second oxide; a third oxide that is over the first conductor and the second conductor and is in contact with at least part of the top surface of the second oxide; a second insulator thereover; a third conductor which is over the second insulator and at least part of which overlaps with a region between the first conductor and the second conductor; and a third insulator which is over the third conductor and at least part of which is in contact with the top surface of the first insulator. The thickness of a region of the first insulator that is in contact with the third insulator is less than the thickness of a region of the first insulator that is in contact with the first oxide.

11 Claims, 25 Drawing Sheets

(51) Int. Cl.
*H01L 27/11565* (2017.01)
*H01L 29/786* (2006.01)
*H01L 27/11521* (2017.01)

(52) U.S. Cl.
CPC .. *H01L 27/11565* (2013.01); *H01L 29/78609* (2013.01); *H01L 29/78618* (2013.01); *H01L 29/78693* (2013.01); *H01L 29/78696* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,253,061 B2 | 8/2007 | Peng et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,977,254 B2 | 7/2011 | Peng et al. |
| 8,551,824 B2 | 10/2013 | Yamazaki et al. |
| 8,654,566 B2 | 2/2014 | Nagatsuka et al. |
| 8,748,240 B2 | 6/2014 | Yamazaki |
| 8,785,258 B2 | 7/2014 | Yamazaki |
| 8,828,794 B2 | 9/2014 | Yamazaki et al. |
| 8,829,586 B2 | 9/2014 | Endo et al. |
| 8,860,108 B2 | 10/2014 | Yamazaki et al. |
| 8,878,173 B2 | 11/2014 | Yamazaki |
| 8,921,853 B2 | 12/2014 | Yamazaki |
| 8,981,367 B2 | 3/2015 | Yoneda et al. |
| 8,981,370 B2 | 3/2015 | Tanaka et al. |
| 9,040,984 B2 | 5/2015 | Watanabe et al. |
| 9,231,475 B2 | 1/2016 | Takahashi |
| 9,293,602 B2 | 3/2016 | Yamazaki |
| 9,294,096 B2 | 3/2016 | Takemura |
| 9,318,506 B2 | 4/2016 | Endo et al. |
| 9,318,618 B2 | 4/2016 | Endo et al. |
| 9,378,776 B2 | 6/2016 | Koyama |
| 9,397,153 B2 | 7/2016 | Tanaka et al. |
| 9,450,080 B2 | 9/2016 | Yamazaki et al. |
| 9,698,277 B2 | 7/2017 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0121700 A1 | 6/2006 | Peng et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0284844 A1 | 11/2011 | Endo et al. |
| 2012/0040495 A1 | 2/2012 | Noda et al. |
| 2013/0140569 A1 | 6/2013 | Yoneda et al. |
| 2013/0153890 A1 | 6/2013 | Yoneda |
| 2013/0161610 A1 | 6/2013 | Yamazaki |
| 2013/0187152 A1 | 7/2013 | Yamazaki et al. |
| 2013/0277672 A1 | 10/2013 | Sano et al. |
| 2013/0334533 A1 | 12/2013 | Yamazaki |
| 2014/0008647 A1 | 1/2014 | Yamazaki |
| 2014/0038351 A1 | 2/2014 | Yamazaki et al. |
| 2014/0077205 A1 | 3/2014 | Yamazaki et al. |
| 2014/0103337 A1 | 4/2014 | Yamazaki et al. |
| 2014/0106504 A1 | 4/2014 | Yamazaki et al. |
| 2014/0152932 A1 | 6/2014 | Miyake |
| 2014/0183530 A1 | 7/2014 | Yamazaki et al. |
| 2014/0225104 A1 | 8/2014 | Yamazaki et al. |
| 2014/0319514 A1 | 10/2014 | Noda et al. |
| 2014/0326992 A1 | 11/2014 | Hondo et al. |
| 2014/0332800 A1 | 11/2014 | Hanaoka |
| 2014/0339546 A1* | 11/2014 | Yamazaki ........ H01L 29/78603 257/43 |
| 2014/0339547 A1 | 11/2014 | Hondo et al. |

(56) References Cited

U.S. PATENT DOCUMENTS

| | | |
|---|---|---|
| 2015/0028330 A1 | 1/2015 | Yamazaki et al. |
| 2015/0041803 A1 | 2/2015 | Endo et al. |
| 2015/0060845 A1 | 3/2015 | Shishido |
| 2015/0084046 A1 | 3/2015 | Kato et al. |
| 2015/0155387 A1 | 6/2015 | Yamazaki et al. |
| 2015/0179803 A1 | 6/2015 | Yamazaki et al. |
| 2015/0221679 A1 | 8/2015 | Yamazaki et al. |
| 2015/0221775 A1 | 8/2015 | Yamazaki et al. |
| 2015/0270403 A1 | 9/2015 | Katayama et al. |
| 2015/0311346 A1 | 10/2015 | Koezuka et al. |
| 2016/0035865 A1 | 2/2016 | Nagamatsu et al. |
| 2016/0056043 A1 | 2/2016 | Tanaka et al. |
| 2016/0071840 A1 | 3/2016 | Yamamoto et al. |
| 2016/0211381 A1 | 7/2016 | Kurokawa |
| 2016/0218225 A1 | 7/2016 | Yamazaki |
| 2016/0233235 A1 | 8/2016 | Miyairi et al. |
| 2016/0233339 A1 | 8/2016 | Okazaki |
| 2016/0240683 A1 | 8/2016 | Miyake et al. |
| 2016/0240684 A1 | 8/2016 | Yamazaki et al. |
| 2016/0254386 A1 | 9/2016 | Yamazaki et al. |

FOREIGN PATENT DOCUMENTS

| | | |
|---|---|---|
| JP | 2011-119674 A | 6/2011 |
| JP | 2015-135953 A | 7/2015 |

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

* cited by examiner

SEMICONDUCTOR DEVICE AND METHOD FOR MANUFACTURING THE SAME

BACKGROUND OF THE INVENTION

1. Field of the Invention

One embodiment of the present invention relates to a semiconductor device and a method for manufacturing the semiconductor device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device or a light-emitting display device), a projection device, a lighting device, an electro-optical device, a power storage device, a memory device, a semiconductor circuit, an imaging device, an electronic device, and the like may include a semiconductor device.

2. Description of the Related Art

A technique in which a transistor is formed using a semiconductor thin film has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

For example, a technique in which a display device is formed using a transistor including an oxide semiconductor (a zinc oxide or an In—Ga—Zn-based oxide) as an active layer is disclosed (see Patent Documents 1 and 2).

Moreover, in recent years, a technique in which an integrated circuit of a memory device is formed using a transistor including an oxide semiconductor has been disclosed (see Patent Document 3). In addition, not only the memory device but also an arithmetic device or other devices have been formed using a transistor including an oxide semiconductor.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119674

SUMMARY OF THE INVENTION

However, a transistor including an oxide semiconductor as a semiconductor layer has a problem in that the electrical characteristics are easily changed by oxygen vacancies or the like in the oxide semiconductor and thus the reliability becomes low. For example, the threshold voltage of the transistor is changed in some cases after a bias temperature stress test (BT test).

In view of the above, an object of one embodiment of the present invention is to provide a transistor with stable electrical characteristics. Another object of one embodiment of the present invention is to provide a transistor with normally-off electrical characteristics. Another object of one embodiment of the present invention is to provide a transistor having a low leakage current in an off state. Another object of one embodiment of the present invention is to provide a transistor having high reliability. Another object of one embodiment of the present invention is to provide a transistor having a small subthreshold swing value.

Another object of one embodiment of the present invention is to provide a semiconductor device including the transistor. Another object of one embodiment of the present invention is to provide a module including the semiconductor device. Another object of one embodiment of the present invention is to provide an electronic device including the semiconductor device or the module. An object of one embodiment of the present invention is to provide a novel semiconductor device. Another object of one embodiment of the present invention is to provide a novel module. Another object of one embodiment of the present invention is to provide a novel electronic device.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention achieves a reduction of oxygen vacancies in an oxide semiconductor by supplying oxygen to the oxide semiconductor from an insulator in the vicinity of the oxide semiconductor. In particular, oxygen is supplied to the oxide semiconductor from an insulator positioned below the oxide semiconductor (hereinafter, the insulator is referred to as a base insulating film in some cases).

In the case where oxygen is supplied to the oxide semiconductor from the base insulating film, oxygen can be added to the vicinity of the surface of the base insulating film, and the oxygen can be supplied to the oxide semiconductor by thermal diffusion. Addition of oxygen to the base insulating film can be performed in the following manner, for example: an insulating film containing oxygen is formed by a sputtering method or the like so that the insulating film is in contact with the top surface of the base insulating film, whereby oxygen can be added to the base insulating film at the same time as the formation of the insulating film.

However, in the case where the surface of the base insulating film is damaged at the time of oxygen addition to the base insulating film, even when oxygen is added to the base insulating film, diffusion of oxygen is prevented by a damaged region of the base insulating film, so that a sufficient amount of oxygen is not supplied to the oxide semiconductor in some cases. The damaged region of the base insulating film is formed by, for example, forming another film in contact with the top surface of the base insulating film.

Thus, by adding oxygen to the base insulating film after the damaged region of the base insulating film is removed, the added oxygen can be diffused in the base insulating film without being prevented by the damaged region.

Oxygen is supplied to the oxide semiconductor in such a manner, whereby a reduction in oxygen vacancies in the oxide semiconductor can be achieved.

One embodiment of the present invention is a semiconductor device including a first insulator over a substrate; a first oxide over the first insulator; a second oxide in contact with at least part of a top surface of the first oxide; a first conductor in contact with at least part of a top surface of the second oxide; a second conductor that is in contact with at least part of the top surface of the second oxide and faces the first conductor; a third oxide that is over the first conductor and the second conductor and is in contact with at least part of the top surface of the second oxide; a second insulator over the third oxide; a third conductor which is over the second insulator and at least part of which overlaps with a region between the first conductor and the second conductor; and a third insulator which is over the third conductor and at least part of which is in contact with a top surface of the first insulator. A side surface portion of the first oxide, a side surface portion of the third oxide, and a side surface portion of the second insulator are substantially aligned with one another. The thickness of a region of the first insulator that is in contact with the third insulator is less than the thickness of a region of the first insulator that is in contact with the first oxide.

In the above semiconductor device, it is preferable that a side surface portion of the first conductor be substantially aligned with a side surface portion of the second oxide, a side surface portion of the second conductor be substantially aligned with a side surface portion of the second oxide, and the side surface portions of the second oxide be located inward from side surface portions of the first oxide.

In the above semiconductor device, in a cross section in the channel width direction, a side surface portion of the third conductor is preferably located inward from a side surface portion of the first oxide.

In the above semiconductor device, a difference between the thickness of the region of the first insulator that is in contact with the third insulator and the thickness of the region of the first insulator that is in contact with the first oxide is preferably greater than or equal to 5 nm.

In the above semiconductor device, in the region of the first insulator that is in contact with the third insulator, the spin density at a g-factor of approximately 2.0 in ESR measurement is preferably lower than or equal to $2.0 \times 10^{17}$ spins/cm$^3$.

In the above semiconductor device, the thickness of a region of the first oxide that is in contact with the third oxide is preferably less than that of a region of the first oxide that is in contact with the second oxide.

In the above semiconductor device, the first oxide, the second oxide, and the third oxide preferably contain indium, an element M (Ti, Ga, Y, Zr, La, Ce, Nd, Sn, or Hf), zinc, and oxygen. In the above semiconductor device, the energy level of the conduction band minimum of each of the first oxide and the third oxide may be closer to the vacuum level than the energy level of the conduction band minimum of the second oxide is.

The above semiconductor device preferably includes a fourth conductor which is under the first insulator and at least part of which overlaps with the third conductor.

In the above semiconductor device, the third insulator preferably contains oxygen and aluminum.

Another embodiment of the present invention is a method for manufacturing a semiconductor device, including: forming a first insulating film over a substrate; forming a first oxide film, a second oxide film, and a first conductive film over the first insulating film; removing part of the second oxide film and part of the first conductive film selectively to form a first oxide, a first conductor, and a second conductor over the first oxide film; forming a third oxide film and a second insulating film over the first oxide film, the first oxide, the first conductor, and the second conductor; forming a third conductor over the second insulating film; performing dry etching treatment on the first oxide film, the third oxide film, and the second insulating film to form a second oxide, a third oxide, and a first insulator and remove the vicinity of a surface of a region of the first insulating film that does not overlap with the second oxide; forming a third insulating film over the third conductor by a sputtering method so that at least part of the third insulating film is in contact with the first insulating film; and performing heat treatment.

In the above method for manufacturing a semiconductor device, a gas containing chlorine is preferably used for the dry etching treatment.

Another embodiment of the present invention is a method for manufacturing a semiconductor device, including: forming a first insulating film over a substrate; forming a first oxide film, a second oxide film, and a first conductive film over the first insulating film; removing part of the second oxide film and part of the first conductive film selectively to form a first oxide, a first conductor, and a second conductor over the first oxide film; forming a third oxide film and a second insulating film over the first oxide film, the first oxide, the first conductor, and the second conductor; forming a third conductor over the second insulating film; performing dry etching treatment on the first oxide film, the third oxide film, and the second insulating film to form a second oxide, a third oxide, and a first insulator; performing wet etching treatment on the first insulating film to remove the vicinity of a surface of a region of the first insulating film that does not overlap with the second oxide; forming a third insulating film over the third conductor by a sputtering method so that at least part of the third insulating film is in contact with the first insulating film; and performing heat treatment.

In the above method for manufacturing a semiconductor device, the first oxide, the second oxide, and the third oxide preferably contain indium, an element M (Ti, Ga, Y, Zr, La, Ce, Nd, Sn, or Hf), zinc, and oxygen. In the above method for manufacturing a semiconductor device, the third insulating film preferably contains oxygen and aluminum.

According to one embodiment of the present invention, a transistor having stable electrical characteristics, a transistor having normally-off electrical characteristics, a transistor having a low leakage current in an off state, a highly reliable transistor, or a transistor having a small subthreshold swing value can be provided.

According to another embodiment of the present invention, a semiconductor device including the transistor, a module including the semiconductor device, an electronic device including the semiconductor device or the module, a novel semiconductor device, a novel module, or a novel electronic device can be provided.

Note that the description of these effects does not preclude the existence of other effects. One embodiment of the present invention does not have to have all the effects listed above. Other effects are apparent from and can be derived from the description of the specification, the drawings, the claims, and the like.

DETAILED DESCRIPTION OF THE INVENTION

Figure 1A:
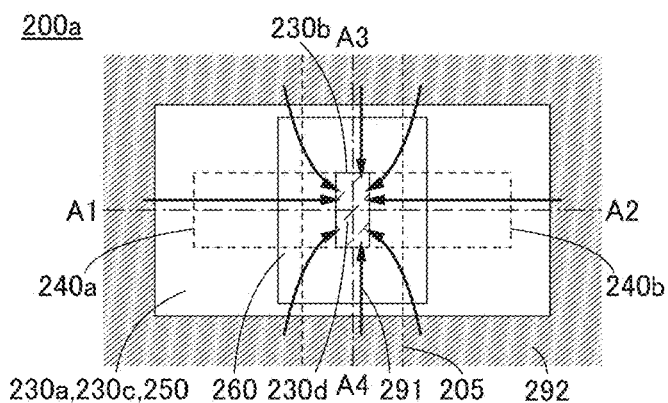
FIGS. 1A to 1D are a top view and cross-sectional views illustrating a transistor of one embodiment of the present invention.

Embodiments are described in detail with reference to the drawings. Note that the present invention is not limited to the following description. It is readily appreciated by those skilled in the art that modes and details of the present invention can be modified in various ways without departing from the spirit and scope of the present invention. Thus, the present invention should not be construed as being limited to the description in the following embodiments and example. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the present invention is not necessarily limited to the position, size, range, or the like as disclosed in the drawings and the like. For example, in the actual manufacturing process, a layer, a resist mask, or the like might be unintentionally reduced in size by treatment such as etching, which is not illustrated in some cases for easy understanding.

Especially in a top view (also referred to as a "plan view"), a perspective view, or the like, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Moreover, a term with an ordinal number in this specification and the like might not be provided with any ordinal number in a claim and the like.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

In addition, in this specification and the like, a term such as an "electrode" or a "wiring" does not limit the function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively, in this specification.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value, in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering side surfaces of a semiconductor, an effective channel width is greater than an apparent channel width, and its influence cannot be ignored in some cases. For example, in a miniaturized transistor having a gate electrode covering side surfaces of a semiconductor, the proportion of a channel formation region formed in the side surfaces of the semiconductor is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water also serves as an impurity in some cases. In the case of an oxide semiconductor, oxygen vacancies may be formed by entry of impurities. In the case where the semiconductor is silicon, examples of an impurity that changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "perpendicular" or "orthogonal" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification and the like, the terms "identical", "the same", "equal", "uniform", and the like (including synonyms thereof) used in describing calculation values and actual measurement values allow for a margin of error of ±20% unless otherwise specified.

In this specification and the like, in the case where an etching step (removal step) is performed after a resist mask is formed by a photolithography method, the resist mask is removed after the etching step, unless otherwise specified.

Note that the terms "film" and "layer" can be interchanged with each other depending on the case or circumstances. For example, the term "conductive layer" can be changed into the term "conductive film" in some cases. Furthermore, the term "insulating film" can be changed into the term "insulating layer" in some cases.

In addition, in this embodiment and the like, the term "insulator" can be replaced with the term "insulating film" or "insulating layer". The term "conductor" can be replaced with the term "conductive film" or "conductive layer". The term "semiconductor" can be replaced with the term "semiconductor film" or "semiconductor layer".

Furthermore, unless otherwise specified, a transistor described in this specification and the like is an enhancement-type (normally-off type) field-effect transistor. Unless otherwise specified, a transistor described in this specification and the like refers to an n-channel transistor. Thus, unless otherwise specified, the threshold voltage (also referred to as "$V_{th}$") is higher than 0 V.

Embodiment 1

In this embodiment, a transistor having favorable reliability and a method for manufacturing the transistor are described with reference to FIGS. 1A to 1D through FIGS. 13A to 13C. A transistor described in this embodiment includes an oxide semiconductor in a semiconductor layer. The reliability of the transistor including the oxide semiconductor can be improved by supplying excess oxygen to the oxide semiconductor to reduce oxygen vacancies.

<Structure Example of Transistor>

Figure 1B:
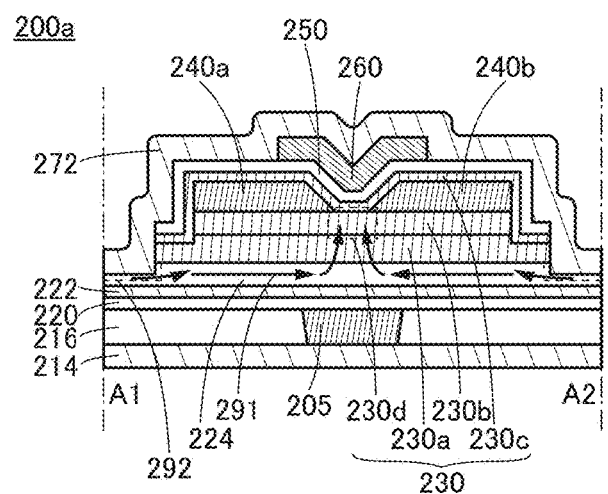
Figure 1C:
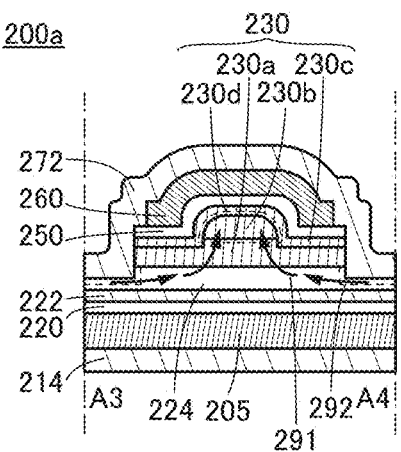
Figure 1D:
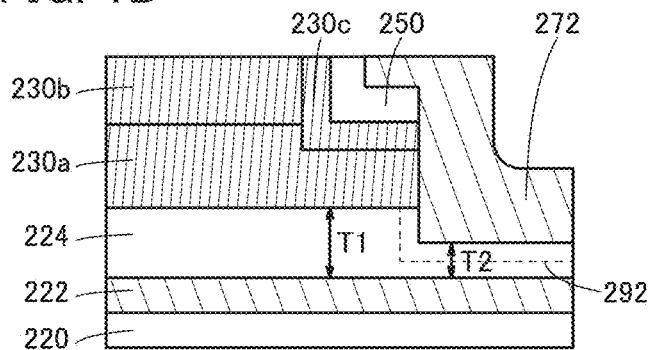

FIGS. 1A to 1D are a top view and cross-sectional views of a transistor 200a. Here, FIG. 1A is a top view of the transistor 200a. FIG. 1B is a cross-sectional view of the transistor 200a in the channel length direction taken along dashed-dotted line A1-A2 in FIG. 1A. FIG. 1C is a cross-sectional view of the transistor 200a in the channel width direction taken along dashed-dotted line A3-A4 in FIG. 1A. FIG. 1D is an enlarged view of the vicinity of a region where an insulator 224 and an insulator 272 are in contact with each other in FIG. 1B.

As illustrated in FIGS. 1A to 1D, the transistor 200a includes the insulator 224 over a substrate (not illustrated); an oxide 230a over the insulator 224; an oxide 230b in contact with at least part of the top surface of the oxide 230a; a conductor 240a in contact with at least part of the top surface of the oxide 230b; a conductor 240b that is in contact with at least part of the top surface of the oxide 230b and faces the conductor 240a; an oxide 230c that is over the conductors 240a and 240b and is in contact with at least part of the top surface of the oxide 230b; an insulator 250 over the oxide 230c; a conductor 260 which is over the insulator 250 and at least part of which overlaps with a region between the conductors 240a and 240b; and the insulator 272 which is over the conductor 260 and at least part of which is in contact with the top surface of the insulator 224. Here, a thickness T2 of a region of the insulator 224 that is in contact with the insulator 272 is less than a thickness T1 of a region of the insulator 224 that is in contact with the oxide 230a.

In the transistor 200a, an insulator 214 may be provided over the substrate. Furthermore, the transistor 200a may include an insulator 216 provided over the insulator 214 and a conductor 205 embedded in the insulator 216. Furthermore, the transistor 200a may include an insulator 220 provided over the insulator 216 and the conductor 205, an insulator 222 provided over the insulator 220, and the insulator 224 provided over the insulator 222.

Hereinafter, the oxide 230a, the oxide 230b, and the oxide 230c may be collectively referred to as an oxide 230. Furthermore, the conductor 240a and the conductor 240b may be collectively referred to as a conductor 240.

The insulator 214 can function as a barrier insulating film for preventing impurities such as water or hydrogen from entering the transistor 200a and the like from a lower layer. The insulator 214 is preferably formed using an insulating material that is less likely to transmit impurities such as water or hydrogen, and for example, is preferably formed using aluminum oxide or the like. Accordingly, diffusion of impurities such as water or hydrogen from a layer under the insulator 214 into a layer over the insulator 214 can be inhibited. Note that it is preferable that at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom be less likely to penetrate the insulator 214. Furthermore, hereinafter, the same applies to the description of an insulating material that is less likely to transmit impurities.

Furthermore, for the insulator 214, an insulating material that is less likely to transmit oxygen (e.g., an oxygen atom or an oxygen molecule) is preferably used. With this material, oxygen contained in the insulator 224 or the like can be inhibited from diffusing into lower layers. Thus, oxygen can be supplied to the oxide 230b effectively.

An opening is formed in the insulator 216, and the conductor 205 is formed to be embedded in the opening. At least part of the conductor 205 overlaps with the conductor 260. Here, the top surface of the conductor 205 can have substantially the same level as the top surface of the insulator 216. The conductor 205 can function as one of two gate electrodes.

The insulator 222 is preferably formed using an insulating material that is less likely to transmit oxygen and impurities such as water or hydrogen, and for example, is preferably formed using aluminum oxide or hafnium oxide. Accordingly, diffusion of impurities such as water or hydrogen from a layer under the insulator 222 into a layer over the insulator 222 can be inhibited. Furthermore, oxygen contained in the insulator 224 or the like can be inhibited from diffusing into lower layers.

The insulator 224 is preferably formed using an insulator from which oxygen is released by heating. Specifically, it is preferable to use an insulator with the following characteristics: the amount of oxygen that is released from the insulator in thermal desorption spectroscopy (TDS) and converted into oxygen atoms is $1.0 \times 10^{18}$ atoms/cm³ or more, preferably $3.0 \times 10^{20}$ atoms/cm³ or more. Note that oxygen released by heating is also referred to as excess oxygen. When the insulator 224 formed using such an insulator is formed in contact with the oxide 230, oxygen can be supplied to the oxide 230b effectively.

Furthermore, the concentration of impurities such as water, hydrogen, or nitrogen oxide in the insulator 224 is preferably lowered. The amount of hydrogen released from the insulator 224 that is converted into hydrogen molecules per area of the insulator 224 is less than or equal to $2 \times 10^{15}$ molecules/cm², preferably less than or equal to $1 \times 10^{15}$ molecules/cm², further preferably less than or equal to $5 \times 10^{14}$ molecules/cm² in TDS analysis in the range of 50° C. to 500° C., for example.

The insulators 220, 222, and 224 serve as a gate insulating film.

The oxide 230a is preferably formed using an oxide formed in an oxygen atmosphere, for example. Thus, the shape of the oxide 230a can be stable. Note that the components of the oxides 230a to 230c are described in detail later.

The thickness of a region of the oxide 230a that is in contact with the oxide 230c is preferably less than that of a region of the oxide 230a that is in contact with the oxide 230b.

It is preferable that impurities and oxygen vacancies in the oxide 230b be reduced so that the oxide 230b can be highly purified and intrinsic or substantially highly purified and intrinsic. Here, when a large number of oxygen vacancies are contained in the oxide, impurities are easily trapped by the oxygen vacancies. As the impurity concentration in the oxide increases, the density of defect states increases, and the density of trap states also increases. Charge trapped by the trap states in the oxide takes a long time to be released and may behave like fixed charge. Thus, a transistor whose channel region is formed in an oxide having a high density of trap states has unstable electrical characteristics and low reliability in some cases.

Thus, in order to give stable electrical characteristics and high reliability to the transistor, it is preferable to reduce oxygen vacancies in the oxide 230b by supplying oxygen to the oxide 230b so that the oxide 230b becomes highly purified and intrinsic or substantially highly purified and intrinsic.

For the oxide 230b, an oxide having an electron affinity higher than that of each of the oxides 230a and 230c may be used. For example, the oxide used as the oxide 230b has a higher electron affinity than the oxides 230a and 230c by 0.07 eV or more and 1.3 eV or less, preferably 0.1 eV or more and 0.7 eV or less, further preferably 0.1 eV or more and 0.4 eV or less. Note that the electron affinity refers to an energy difference between the vacuum level and the conduction band minimum.

The oxide 230b includes a first region, a second region, and a third region. In the top view, the third region is positioned between the first region and the second region. The transistor 200a includes the conductor 240a over and in contact with the first region of the oxide 230b. Furthermore, the transistor 200a includes the conductor 240b over and in contact with the second region of the oxide 230b. The conductor 240a can function as one of a source electrode and a drain electrode, and the conductor 240b can function as the other of the source electrode and the drain electrode. Thus, one of the first region and the second region of the oxide 230b can function as the source region and the other can function as the drain region. The third region of the oxide 230b can function as a channel formation region 230d.

Note that the number of oxygen vacancies included in the oxide 230b may be evaluated by a constant photocurrent method (CPM), for example. By the CPM, deep defect states due to oxygen vacancies in a sample can be evaluated. The amount of hydrogen trapped by oxygen vacancies included in the oxide 230b may be evaluated by electron spin resonance (ESR) analysis, for example. By the ESR, the conduction electrons due to hydrogen trapped by oxygen vacancies in a sample can be evaluated.

In the transistor 200a, it is preferable that a side surface portion of the conductor 240a be substantially aligned with one side surface portion of the oxide 230b and a side surface portion of the conductor 240b be substantially aligned with another side surface portion of the oxide 230b. Furthermore, in the transistor 200a, the side surface portions of the oxide 230b are preferably located inward from side surface portions of the oxide 230a.

Each of side surfaces of the conductors 240a and 240b that are closer to the conductor 260 preferably has a taper angle of less than 90°. The angle formed between the bottom surface and each of the side surfaces of the conductors 240a and 240b that are closer to the conductor 260 is preferably 45° or greater and 75° or less. When the conductors 240a and 240b are formed to have such a structure, the oxide 230c can be formed with good coverage also in a step portion formed by the conductor 240. Accordingly, for example, disconnection of the oxide 230c, which causes the oxide 230b to be in contact with the insulator 250 or the like, can be prevented.

The oxide 230c is formed over the conductor 240a, the conductor 240b, the oxide 230b, and the oxide 230a. Here, the oxide 230c is in contact with the top and side surfaces of the oxide 230b and the top surface of the oxide 230a. The oxide 230c may have a function of supplying oxygen to the oxide 230b. In addition, impurities such as water or hydrogen can be prevented from directly entering the oxide 230b from the insulator 250 by forming the insulator 250 over the oxide 230c. The oxide 230c is preferably formed using an oxide formed in an oxygen atmosphere, for example. In that case, the shape of the oxide 230c can be stable.

The insulator 250 can function as a gate insulating film. Like the insulator 224, the insulator 250 is preferably formed using an insulator from which oxygen is released by heating. When the insulator 250 formed using such an insulator is formed in contact with the oxide 230, oxygen can be supplied to the oxide 230b effectively. Furthermore, like the insulator 224, the concentration of impurities such as water or hydrogen in the insulator 250 is preferably lowered.

In the transistor 200a, it is preferable that a side surface portion of the insulator 250, a side surface portion of the oxide 230c, and a side surface portion of the oxide 230a be substantially aligned with one another.

The transistor 200a includes the conductor 260 over the insulator 250. The insulator 250 and the conductor 260 each include a region overlapping with the channel formation region 230d of the oxide 230b. The conductor 260 can function as a gate electrode of the transistor 200a.

As illustrated in FIG. 1C, in the cross section in the channel width direction of the transistor 200a, a side surface portion of the conductor 260 is preferably located inward from a side surface portion of the oxide 230a.

In the case where the conductor 205 is provided, one of the conductors 205 and 260 can function as a gate electrode and the other can function as a back gate electrode. The gate electrode and the back gate electrode are provided with the channel formation region in the semiconductor positioned therebetween. The potential of the back gate electrode may be the same as that of the gate electrode or may be a ground potential or a predetermined potential. By changing a potential of the back gate electrode independently of the potential of the gate electrode, the threshold voltage of the transistor can be changed.

The insulator 272 is provided to cover the oxide 230, the conductor 240, the insulator 250, and the conductor 260. Furthermore, the insulator 272 is provided in contact with at least the top surface of the insulator 224. The insulator 272 can function as a barrier insulating film that prevents impurities such as water or hydrogen from entering the transistor 200a or the like from an upper layer.

The insulator 272 is preferably formed using an insulating material that is less likely to transmit impurities such as water or hydrogen, and for example, is preferably formed using aluminum oxide. With the insulator 272 including the insulating material, impurities such as water or hydrogen can be inhibited from diffusing from a layer over the insulator 272 into a layer under the insulator 272.

Here, for the insulator 272, an oxide insulator that is formed by a sputtering method is preferably used, and for example, aluminum oxide is preferably used. With the insulator 272 formed using such an oxide insulator, oxygen can be added to a region of the insulator 224 that is in contact with the insulator 272, so that the insulator 224 can be in an oxygen excess state. Furthermore, the insulator 272 adds oxygen to a region of the insulator 250 that is in contact with the insulator 272 in some cases.

Figure 2A:
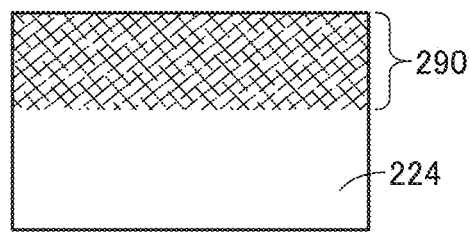
FIGS. 2A to 2C are schematic views illustrating states of diffusion of oxygen.
Figure 2B:
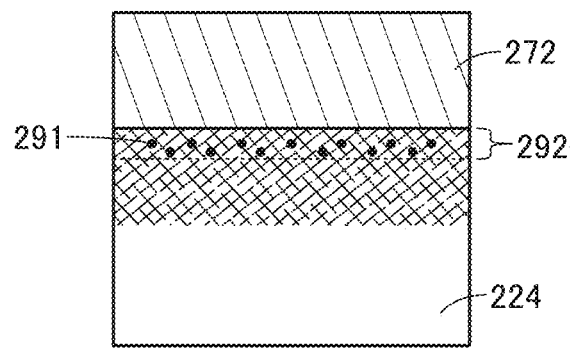
Figure 2C:
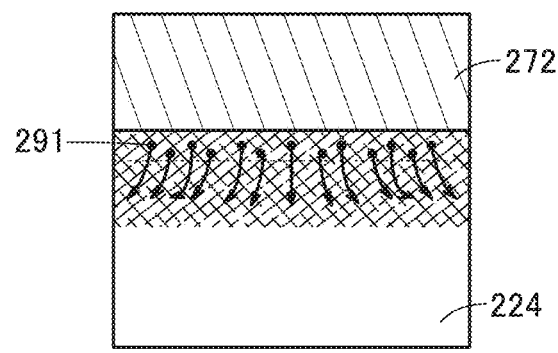

Steps of forming the insulator 272 over the insulator 224 and adding oxygen to the insulator 224 are described with reference to FIGS. 2A to 2C and FIGS. 3A to 3D. FIGS. 2A to 2C and FIGS. 3A to 3D are enlarged views of the vicinity of the interface between the insulators 224 and 272 illustrated in FIG. 1B. Here, FIGS. 2A to 2C illustrate steps in the case where the insulator 272 is formed without removing a damaged region 290 that is formed on the surface of the insulator 224 because of the formation of the oxide 230a or the like. FIGS. 3A to 3D illustrate steps in the case where the insulator 272 is formed after the removal of the damaged region 290 that is formed on the surface of the insulator 224 because of the formation of the oxide 230a or the like. Note that in the following description, a case where silicon oxide is typically used for the insulator 224 and aluminum oxide is typically used for the insulator 272 is described.

First, the steps illustrated in FIGS. 2A to 2C of forming the insulator 272 without removing the damaged region 290 and adding oxygen to the insulator 224 are described.

As illustrated in FIG. 2A, in the manufacturing process of the transistor 200a, the damaged region 290 is formed in the vicinity of the surface of the insulator 224 in some cases. The damaged region 290 can be formed by, for example, forming a film on the top surface of the insulator 224 by a sputtering method. In this case, sputtered particles and the like are beat against the vicinity of the surface of the insulator 224; accordingly, formation of oxygen vacancies, entry of impurity elements, or the like occur in the damaged region 290.

Furthermore, when a film provided over and in contact with the insulator 224 is removed by etching or the like, the damaged region 290 is exposed to an etching gas, and formation of more oxygen vacancies, entry of more impurity elements, or the like occur. In particular, in the case where the etching rate of the etching gas to the insulator 224 is low, the damaged region 290 is hardly etched during the etching; thus, more damage occurs. Furthermore, by forming another film over the exposed insulator 224, the damaged region 290 is exposed to a deposition gas, and formation of more oxygen vacancies, entry of more impurity elements, or the like occur.

In the damaged region 290, impurity elements included in the etching gas or the like are included at depths of approximately 0 nm to 10 nm from the surface of the insulator 224 as a reference, and the concentration of the impurity elements has a peak at a depth of approximately 5 nm in some cases. When ESR analysis is performed on the damaged region 290, a high peak appears at a g-factor of approximately 2.001 in some cases. The peak at a g-factor of approximately 2.001 is referred to as E' center and is due to the dangling bond of silicon. The spin density of a peak at a g-factor of approximately 2.001 is approximately $2.1 \times 10^{17}$ [spins/cm$^3$] in some cases.

Next, over the insulator 224, that is, over the damaged region 290, the insulator 272 is formed (see FIG. 2B). Although the details are described later in the steps illustrated in FIGS. 3A to 3D, by forming the insulator 272 by a sputtering method, oxygen 291 is added to the vicinity of the surface of the insulator 224 at the same time as the formation. Thus, the oxygen 291 is added to the damaged region 290. Note that a region where the concentration of the oxygen 291 is high, which is formed in the vicinity of the surface of the insulator 224, is referred to as an oxygen addition region 292 in some cases. The concentration of the oxygen 291 in the oxygen addition region 292 is higher than that in a layer below the oxygen addition region 292.

Next, heat treatment is performed, so that the oxygen 291 added to the oxygen addition region 292 is diffused (see FIG. 2C). However, diffusion of the oxygen 291 is prevented because of reaction to oxygen vacancies, impurity elements, or the like in the damaged region 290. Thus, it is difficult to supply oxygen to the oxide 230 through the insulator 224 by the steps illustrated in FIGS. 2A to 2C.

Next, the steps illustrated in FIGS. 3A to 3D of forming the insulator 272 after the damaged region 290 is removed and adding oxygen to the insulator 224 are described. First, as in FIG. 2A, the damaged region 290 is formed in the vicinity of the surface of the insulator 224 (see FIG. 3A).

Figure 3A:
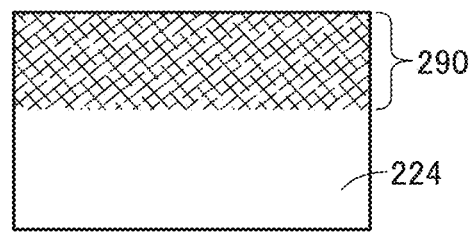
FIGS. 3A to 3D are schematic views illustrating states of diffusion of oxygen.
Figure 3B:

Next, the damaged region 290 formed in the vicinity of the surface of the insulator 224 is removed by dry etching or wet etching (see FIG. 3B). The etching rate to the insulator 224 is made high in the dry etching or the wet etching, so that the damaged region 290 can be removed from the insulator 224.

In consideration of the depth of the above-described damaged region 290, the insulator 224 is preferably removed to a depth of 5 nm or greater, further preferably 10 nm or greater, still further preferably 20 nm or greater, from the surface of the insulator 224 by etching. In the surface of the insulator 224 from which the damaged region 290 is removed, the spin density at a g-factor of approximately 2.0 is preferably less than or equal to $2.0 \times 10^{17}$ spins/cm$^3$ in ESR measurement.

Figure 3C:
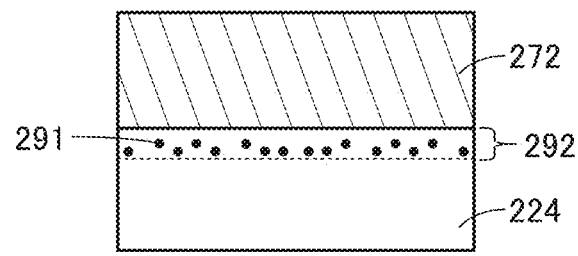

Next, over the insulator 224 that is exposed, the insulator 272 is formed (see FIG. 3C). Here, it is preferable that the insulator 272 be formed by a sputtering method and it is further preferable that the insulator 272 be formed by a sputtering method in an atmosphere containing oxygen. When the insulator 272 is formed by a sputtering method, the oxygen 291 is added to the vicinity of the surface of the insulator 224 (the interface between the insulator 224 and the insulator 272 after the formation of the insulator 272) at the same time as the formation. Accordingly, the oxygen addition region 292 is formed in the vicinity of the surface of the insulator 224. Although the oxygen 291 is added to the insulator 224 as an oxygen radical here, for example, the state of the oxygen 291 at the time of being added is not limited thereto. The oxygen 291 may be added to the insulator 224 as an oxygen atom, an oxygen ion, or the like. Note that by addition of the oxygen 291, oxygen in excess of the stoichiometric composition is contained in the insulator 224 in some cases, and the oxygen 291 in such a case can be called excess oxygen.

In such a manner, the oxygen 291 is added to the vicinity of the surface of the insulator 224. The oxygen 291 that is added is diffused from the oxygen addition region 292 in the insulator 224 by heat treatment (see FIG. 3D). In this step, unlike the step illustrated in FIG. 2C, the damaged region 290 is removed and the oxygen 291 is diffused in the insulator 224. At least during the heat treatment, the insulator 224 has a sufficiently large interatomic distance in terms of diffusion of the oxygen 291 and can be regarded as being porous for the oxygen 291. Thus, by performing heat treatment on the insulator 224, as illustrated in FIGS. 1A to 1C and FIG. 3D, the oxygen 291 can be diffused very easily. The heat treatment here may be performed at a temperature higher than or equal to 250° C. and lower than or equal to 650° C., preferably higher than or equal to 350° C. and lower than or equal to 450° C., for example. The oxygen 291 can be thus diffused in the insulator 224, mainly the oxygen addition region 292 having a high concentration of the oxygen 291.

Here, the insulator 272 is an insulator that transmits less oxygen than the insulator 224 and functions as a barrier film that blocks oxygen. Since the insulator 272 is formed over the insulator 224, the oxygen 291 diffused in the insulator 224 is not diffused above the insulator 224 but is diffused in the insulator 224 mainly laterally or downward. In such a manner, the oxygen 291 diffused in the insulator 224 is supplied to the oxide 230, particularly the channel formation region 230d of the oxide 230b.

At this time, when the insulator 222 having a function of blocking oxygen is provided between the insulator 224 and the conductor 205, the oxygen 291 diffused in the insulator 224 can be prevented from being extracted by the conductor 205. Furthermore, the oxygen 291 diffused in the insulator 224 can be prevented from being diffused below the insulator 224. Thus, the oxygen 291 can be supplied to a layer over the insulator 224, that is, the oxide 230.

In such a manner, the oxygen 291 can be supplied to the oxide 230, particularly the oxide 230b illustrated in FIGS. 1A to 1D, so that oxygen vacancies can be reduced. When hydrogen is trapped by oxygen vacancies in the oxide 230, a shallow donor level is formed. That is, by reducing oxygen vacancies, a highly purified intrinsic or substantially highly purified intrinsic oxide semiconductor can be obtained.

During heat treatment at 400° C. for 1 hour, the diffusion length of oxygen in the insulator 224 is estimated to be approximately 3 μm. Thus, the distance between the oxygen addition region 292 and the channel formation region 230d illustrated in FIG. 1A and the like is preferably less than or equal to 3 μm, further preferably less than or equal to 1 μm.

When the transistor 200a is fabricated with the damaged region 290 removed as described above, the thickness T2 of the region of the insulator 224 that is in contact with the insulator 272 is less than the thickness T1 of the region of the insulator 224 that is in contact with the oxide 230a, as illustrated in the enlarged view of FIG. 1D. The difference between the thickness T1 and the thickness T2 is greater than or equal to 5 nm, preferably greater than or equal to 10 nm, further preferably greater than or equal to 20 nm. Furthermore, the thickness T2 is at least greater than or equal to 3 nm, preferably greater than or equal to 5 nm, further preferably greater than or equal to 10 nm.

In the region of the insulator 224 that is in contact with the insulator 272, the spin density at a g-factor of approximately 2.0 in ESR measurement is preferably lower than or equal to $2.0 \times 10^{17}$ spins/cm$^3$.

By fabricating a transistor with the above structure, a transistor having normally-off electrical characteristics, a transistor having stable electrical characteristics, a transistor having a low leakage current in an off state, a highly reliable transistor, or a transistor having a small subthreshold swing value can be provided.

When the transistor 200a is positioned between the insulators 272 and 214, a large amount of oxygen can be contained in the insulator 224, the oxide 230, and the insulator 250 without diffusing outward. Furthermore, impurities such as water or hydrogen can be prevented from entering from a layer over the insulator 272 and a layer under the insulator 214, and thus the concentration of impurities in the insulator 224, the oxide 230, and the insulator 250 can be lowered.

In this manner, oxygen vacancies in the oxide 230b functioning as a semiconductor layer of the transistor 200a are reduced; accordingly, the electrical characteristics of the transistor 200a are made stable, and the reliability can be improved.

<Materials>

[Insulator]

The insulators 216, 220, 224, and 250 may be formed, for example, with a single layer or a stack of layers of an insulating material containing boron, carbon, nitrogen, oxygen, fluorine, magnesium, aluminum, silicon, phosphorus, argon, gallium, germanium, yttrium, zirconium, lanthanum, neodymium, hafnium, or tantalum. The insulators 216, 220, 224, and 250 are formed, for example, with a single layer or a stack of layers of one or more materials selected from silicon oxide, silicon oxynitride, silicon nitride oxide, silicon nitride, aluminum nitride, aluminum oxide, aluminum nitride oxide, aluminum oxynitride, magnesium oxide, gallium oxide, germanium oxide, yttrium oxide, zirconium oxide, lanthanum oxide, neodymium oxide, hafnium oxide, tantalum oxide, aluminum silicate, and the like. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

The insulators 214, 222, and 272 are preferably formed using insulating materials that are less likely to transmit impurities such as water or hydrogen than the insulators 224 and 250. Examples of such an insulating material that is less likely to transmit impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. A single layer or a stack of any of these materials may be used.

When an insulating material that is less likely to transmit impurities is used for the insulators 214 and 222, impurity diffusion from the substrate side into the transistor can be inhibited, and the reliability of the transistor can be improved. When an insulating material that is less likely to transmit impurities is used for the insulator 272, impurity diffusion from layers above the insulator 272 into the transistor can be inhibited, and the reliability of the transistor can be improved.

Note that for the insulators 214 and 272, a plurality of insulating layers formed of these materials may be stacked.

An insulating material that is less likely to transmit impurities herein refers to a material having a high oxidation resistance and a function of inhibiting the diffusion of oxygen and impurities such as water or hydrogen.

For example, the diffusion length of oxygen or hydrogen in aluminum oxide per hour under an atmosphere at 350° C. or 400° C. is much less than that in silicon oxide. Thus, it can be said that aluminum oxide is less likely to transmit impurities.

As an example of an insulating material that is less likely to transmit impurities, silicon nitride formed by a CVD method can be used. Here, diffusion of hydrogen into a semiconductor element including an oxide semiconductor, such as the transistor 200a, degrades the characteristics of the semiconductor element in some cases. Therefore, the transistor 200a is preferably sealed with a film that inhibits hydrogen diffusion. Specifically, the film that inhibits hydrogen diffusion is a film from which hydrogen is less likely to be released.

The released amount of hydrogen can be measured by TDS, for example. The amount of hydrogen released from the insulator 214 that is converted into hydrogen molecules per unit area of the insulator 214 is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in TDS analysis in the range from 50° C. to 500° C., for example.

When an oxide semiconductor is used for the oxide 230, the concentration of hydrogen in the insulator is preferably lowered in order to prevent an increase in the concentration of hydrogen in the oxide 230. Specifically, the concentration of hydrogen in the insulator, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is particularly preferable to lower the concentration of hydrogen in the insulators 216, 224, and 250. It is preferable to lower the concentration of hydrogen in at least the insulators 224 and 250 that are in contact with the oxide 230.

Furthermore, the nitrogen concentration in the insulator is preferably low in order to prevent an increase in the nitrogen concentration in the oxide 230. Specifically, the nitrogen concentration in the insulator, which is measured by SIMS, is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable that at least a region of the insulator 224 that is in contact with the oxide 230 and at least a region of the insulator 250 that is in contact with the oxide 230 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. In the case where a silicon oxide layer or a silicon oxynitride layer is used as the insulators 224 and 250, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ may be used.

In addition to the above-described signal, a signal due to nitrogen dioxide (NO$_2$) might be observed. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating layer whose spin density due to nitrogen dioxide (NO$_2$) is higher than or equal to $1\times10^{17}$ spins/cm$^3$ and lower than $1\times10^{18}$ spins/cm$^3$ as the insulators 224 and 250, for example.

Note that nitrogen oxide (NO$_x$) such as nitrogen dioxide (NO$_2$) forms a state in the insulating layer. The level is positioned in the energy gap of the oxide semiconductor. Thus, when nitrogen oxide (NO$_x$) diffuses to the interface between the insulating layer and the oxide semiconductor, an electron can potentially be trapped by the level on the insulating layer side. As a result, the trapped electrons remain in the vicinity of the interface between the insulating layer and the oxide semiconductor; thus, the threshold voltage of the transistor is shifted in the positive direction. Therefore, a shift in the threshold voltage of the transistor can be reduced when a film with a low nitrogen oxide content is used as the insulators 224 and 250.

As an insulating layer that releases little nitrogen oxide (NO$_x$), for example, a silicon oxynitride layer can be used. The silicon oxynitride layer is a layer of which the amount of released ammonia is larger than the amount of released nitrogen oxide (NO$_x$) in TDS; the typical amount of released ammonia is greater than or equal to $1\times10^{18}$/cm$^3$ and less than or equal to $5\times10^{19}$/cm$^3$. Note that the released amount of ammonia is the total amount of ammonia released by heat treatment in a range from 50° C. to 650° C. or a range from 50° C. to 550° C. in TDS.

Since nitrogen oxide (NO$_x$) reacts with ammonia and oxygen in heat treatment, the use of an insulating film that releases a large amount of ammonia reduces nitrogen oxide (NO$_x$).

At least one of the insulators 216, 224, and 250 is preferably formed using an insulator from which oxygen is released by heating. Specifically, it is preferable to use an insulator with the following characteristics: the amount of oxygen that is released from the insulator in TDS and converted into oxygen atoms is $1.0\times10^{18}$ atoms/cm$^3$ or more, preferably $3.0\times10^{20}$ atoms/cm$^3$ or more.

The insulating layer containing excess oxygen can also be formed by performing treatment for adding oxygen to an insulating layer. The treatment for adding oxygen can be performed by heat treatment in an oxygen atmosphere, an ion implantation method, an ion doping method, a plasma immersion ion implantation method, plasma treatment, or the like. The plasma treatment containing oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF voltage to the substrate side allows oxygen radicals generated by the high-density plasma to be efficiently introduced into a film to be processed. Alternatively, after plasma treatment using an inert gas with the apparatus, plasma treatment using oxygen in order to compensate released oxygen may be performed. As a gas for adding oxygen, an oxygen gas of $^{16}$O$_2$, $^{18}$O$_2$, or the like, a nitrous oxide gas, an ozone gas, or the like can be used. In this specification, the treatment for adding oxygen is also referred to as "oxygen doping treatment".

In addition, by oxygen doping treatment, the crystallinity of the semiconductor can be improved, and impurities such as water or hydrogen can be removed, in some cases. That is, "oxygen doping treatment" can also be referred to as "impurity removal treatment". In particular, when plasma treatment using oxygen is performed as oxygen doping treatment under a reduced pressure, the bond of hydrogen and the bond of water in the insulator to be processed or the oxide to be processed are cut; therefore, hydrogen and water are easily released. Accordingly, heating treatment is preferably performed in or after the plasma treatment. Moreover, when the heating treatment is performed twice before and after the plasma treatment, the concentration of impurities in a film to be processed can be reduced.

There is no particular limitation on the method for forming the insulator; depending on a material thereof, any of the following methods may be used: a sputtering method, an SOG method, spin coating, dipping, spray coating, a droplet discharging method (e.g., an ink-jet method), a printing method (e.g., screen printing or offset printing), or the like.

[Oxide Semiconductor]

An oxide semiconductor used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor is InMZnO containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Moreover, the band gap of an oxide semiconductor is greater than or equal to 2 eV; thus, when the oxide 230 in which oxygen vacancies and impurities are reduced as described above is used as an oxide semiconductor, a transistor with an extremely low off-state current can be achieved. Specifically, the off-state current per micrometer of channel width at room temperature (typically 25° C.) and at a source-drain voltage of 3.5 V can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits. A transistor using an oxide semiconductor in the oxide 230 has high withstand voltage between its source and drain. Thus, a transistor with favorable reliability can be provided. In addition, a transistor with high output voltage and high withstand voltage can be provided. Moreover, a semiconductor device or the like with favorable reliability can be provided. Furthermore, a semiconductor device with high output voltage and high withstand voltage can be provided.

<Structure>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, a lattice arrangement is distorted so that formation of a crystal grain boundary is inhibited. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced by indium, the layer can also be referred to as an (In,M,Zn) layer. When indium of the In layer is replaced by the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures that show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Atomic Ratio>

Next, preferred ranges of the atomic ratio of indium, the element M, and zinc contained in an oxide semiconductor according to the present invention are described with reference to FIGS. 12A to 12C. Note that the proportion of oxygen atoms is not illustrated in FIGS. 12A to 12C. The terms of the atomic ratio of indium, the element M, and zinc contained in the oxide semiconductor are denoted by [In], [M], and [Zn], respectively.

Figure 12A:
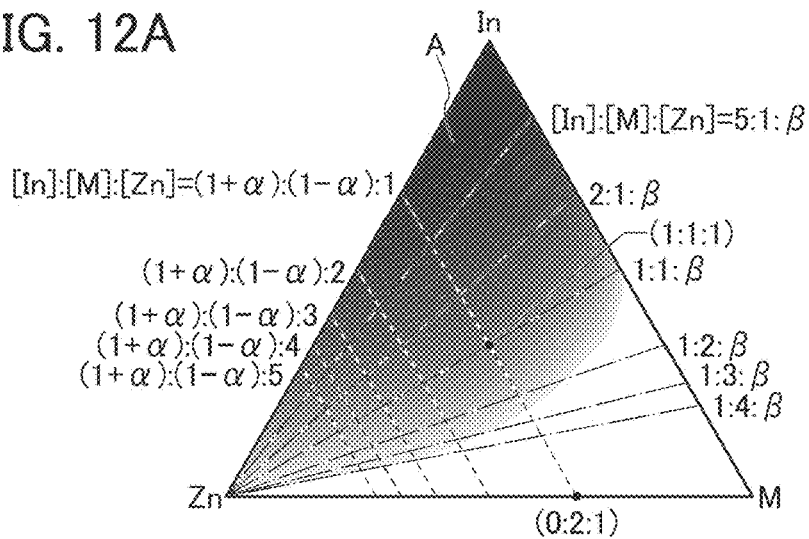
FIGS. 12A to 12C each illustrate an atomic ratio range of an oxide semiconductor of one embodiment of the present invention.
Figure 12B:
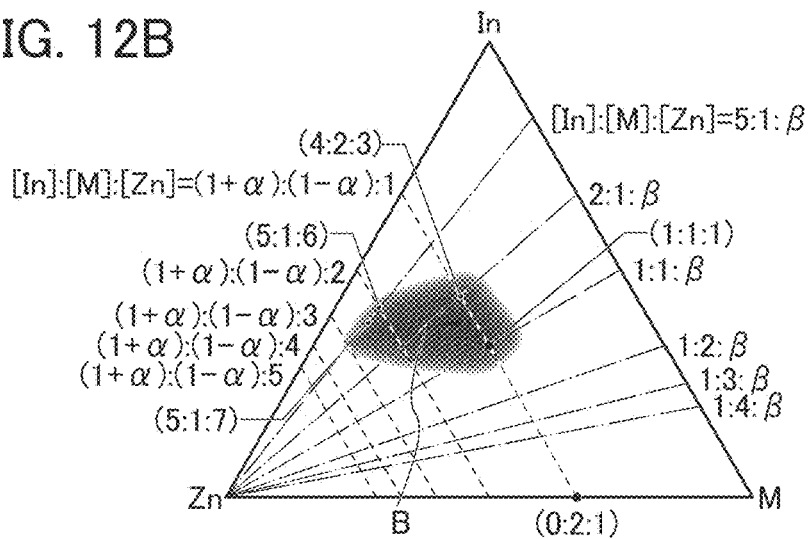
Figure 12C:
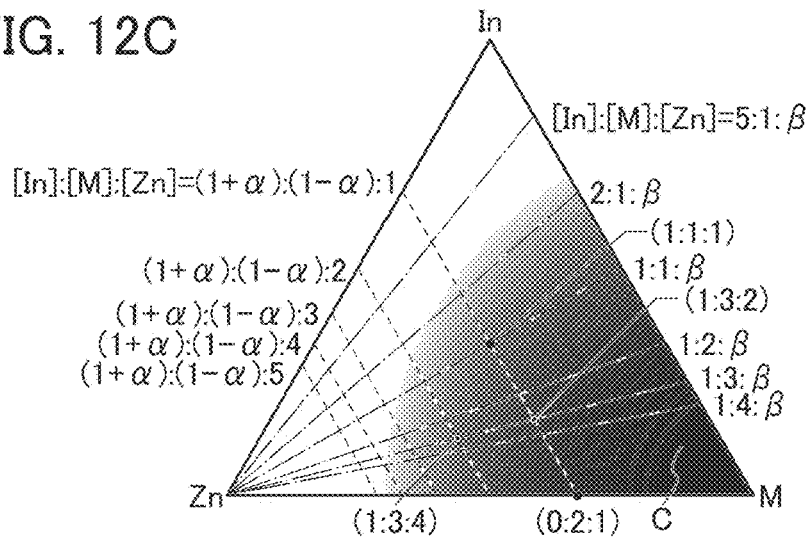

In FIGS. 12A to 12C, broken lines indicate a line where the atomic ratio [In]:[M]:[Zn] is $(1+\alpha):(1-\alpha):1$ $(-1 \leq \alpha \leq 1)$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ $(\beta \geq 0)$, a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, an oxide semiconductor with the atomic ratio of [In]:[M]:[Zn]=0:2:1 or a neighborhood thereof in FIGS. 12A to 12C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 12A represents examples of the preferred ranges of the atomic ratio of indium, the element M, and zinc contained in an oxide semiconductor.

The oxide semiconductor containing indium in a higher proportion can have high carrier mobility (electron mobility). Thus, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[Zn]=0:1:0 and the vicinity thereof (e.g., a region C in FIG. 12C), insulation performance becomes better.

Accordingly, an oxide semiconductor of one embodiment of the present invention preferably has an atomic ratio represented by the region A in FIG. 12A. With the atomic ratio, a stacked-layer structure with high carrier mobility and a few grain boundaries is easily obtained.

An oxide semiconductor with an atomic ratio in the region A, particularly in a region B in FIG. 12B, is excellent because the oxide semiconductor easily becomes a CAAC-OS and has high carrier mobility.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is formed with a sputtering apparatus, a film having an atomic ratio deviated from the atomic ratio of a target is formed. Depending on the substrate temperature in deposition, [Zn] in the film might be smaller than [Zn] in the target. Thus, the illustrated regions each represent an atomic ratio with which an oxide semiconductor tends to have specific characteristics, and boundaries of the regions A to C are not clear.

[Transistor Including Oxide Semiconductor]

Next, the case where the above-described oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with a low carrier density is preferably used for the transistor. In order to reduce the carrier density of the oxide semiconductor film, the concentration of impurities in the oxide semiconductor film is reduced so that the density of defect states can be reduced. In this specification and the like, a state with a low concentration of impurities and a low density of defect states is referred to as a highly purified intrinsic or substantially highly purified intrinsic state. For example, an oxide semiconductor whose carrier density is lower than $8\times10^{11}$/cm$^3$, preferably lower than $1\times10^{11}$/cm$^3$, further preferably lower than $1\times10^{10}$/cm$^3$, and greater than or equal to $1\times10^{-9}$/cm$^3$ is used.

A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

<Impurities>

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by SIMS) is set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; for example, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the concentration of hydrogen in the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor to which oxide is sufficiently supplied and in which impurities and oxygen vacancies are sufficiently reduced is used for a channel formation region in a transistor, the transistor can have normally-off electrical characteristics, stable electrical characteristics, and high reliability.

<Band Diagram>

Next, the case where the oxide semiconductor has a two-layer structure or a three-layer structure is described. A band diagram of a stacked-layer structure of an oxide semiconductor S1, an oxide semiconductor S2, and an oxide semiconductor S3 and insulators that are in contact with the stacked-layer structure, a band diagram of a stacked-layer structure of the oxide semiconductors S2 and S3 and insulators that are in contact with the stacked-layer structure, and a band diagram of a stacked-layer structure of the oxide semiconductors S1 and S2 and insulators that are in contact with the stacked-layer structure are described with reference to FIGS. 13A to 13C.

Figure 13A:
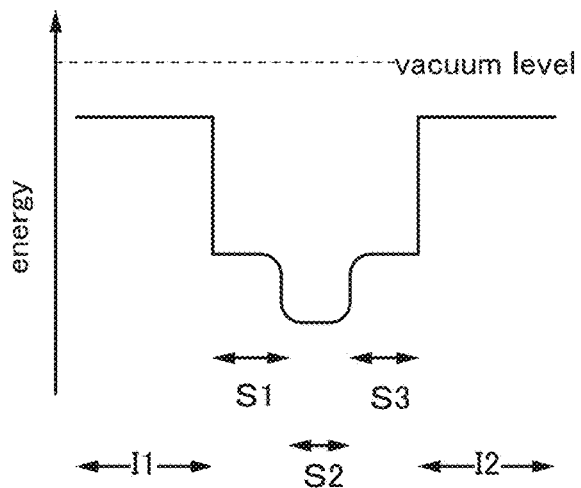
FIGS. 13A to 13C are band diagrams of stacked structures of oxide semiconductors.
Figure 13B:
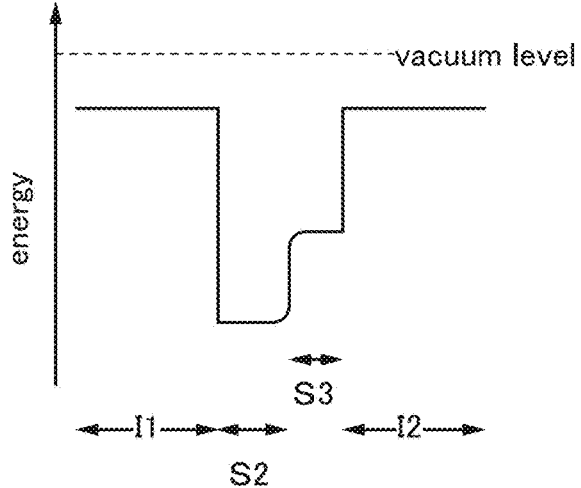
Figure 13C:
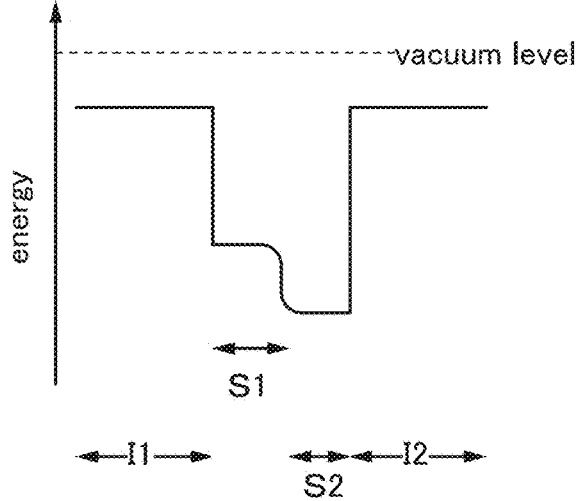

FIG. 13A is an example of a band diagram of a stacked-layer structure including an insulator I1, the oxide semiconductor S1, the oxide semiconductor S2, the oxide semiconductor S3, and an insulator I2 in a thickness direction. FIG. 13B is an example of a band diagram of a stacked-layer structure including the insulator I1, the oxide semiconductor S2, the oxide semiconductor S3, and the insulator I2 in a thickness direction. FIG. 13C is an example of a band diagram of a stacked-layer structure including the insulator I1, the oxide semiconductor S1, the oxide semiconductor S2, and the insulator I2 in a thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference in the conduction band minimum between the oxide semiconductor S2 and each of the oxide semiconductors S1 and S3 is preferably greater than or equal to 0.15 eV or greater than or equal to 0.5 eV, and less than or equal to 2 eV or less than or equal to 1 eV. That is, it is preferable that the electron affinity of the oxide semiconductor S2 be higher than the electron affinity of each of the oxide semiconductors S1 and S3, and the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As shown in FIGS. 13A to 13C, the conduction band minimum of each of the oxide semiconductors S1 to S3 is gradually varied. In other words, the conduction band minimum is continuously varied or continuously connected. In order to obtain such a band diagram, the density of defect states in a mixed layer formed at the interface between the oxide semiconductors S1 and S2 or the interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer having a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 12C may be used as the oxide semiconductors S1 and S3. Note that the region C illustrated in FIG. 12C represents atomic ratios [In]:[M]:[Zn] of 0:1:0, 1:3:2, and 1:3:4 and the vicinities thereof.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

Note that the oxide 230 used for the transistor 200a has the above-described three layer structure in this embodiment; however, one embodiment of the present invention is not limited thereto. For example, a two-layer structure without one of the oxide 230a and the oxide 230c may be employed. Alternatively, a single layer structure using any one of the oxide 230a, the oxide 230b, and the oxide 230c may be employed. Alternatively, a four-layer structure in which any one of the above-described semiconductors is provided over or under the oxide 230a or over or under the oxide 230c may be employed. Alternatively, an n-layer structure (n is an integer of 5 or more) may be employed in which any one of the semiconductors described as examples of the oxide 230a, the oxide 230b, and the oxide 230c is provided in two or more of the following positions: over the oxide 230a, under the oxide 230a, over the oxide 230c, and under the oxide 230c.

In this specification and the like, a transistor in which an oxide semiconductor is used for a semiconductor where a channel is formed is also referred to as an "OS transistor". In this specification and the like, a transistor in which silicon having crystallinity is used for a semiconductor where a channel is formed is also referred to as a "crystalline Si transistor".

The crystalline Si transistor tends to obtain relatively high mobility as compared to the OS transistor. On the other hand, the crystalline Si transistor has difficulty in obtaining extremely small off-state current unlike the OS transistor. Thus, it is important that the semiconductor material used for the semiconductor be selected depending on the purpose and the usage. For example, depending on the purpose and the usage, the OS transistor and the crystalline Si transistor may be used in combination.

An indium gallium oxide has a small electron affinity and an excellent oxygen-blocking property. Therefore, the oxide 230c preferably includes an indium gallium oxide. The gallium atomic ratio [Ga/(In+Ga)] is, for example, higher than or equal to 70%, preferably higher than or equal to 80%, further preferably higher than or equal to 90%.

Note that the oxide 230a and 230c may be gallium oxide. For example, when gallium oxide is used for the oxide 230c, a leakage current generated between the conductor 205 and the oxide 230 can be reduced. In other words, the off-state current of the transistor 200a can be reduced.

In that case, when a gate voltage is applied, a channel is formed in the oxide 230b having the highest electron affinity in the oxides 230a, 230b, and 230c.

In order to give stable electrical characteristics and favorable reliability to the transistor including an oxide semiconductor, it is preferable that impurities and oxygen vacancies in the oxide semiconductor be reduced to highly purify the oxide semiconductor so that at least the oxide 230b can be regarded as an intrinsic or substantially intrinsic oxide semiconductor. Furthermore, it is preferable that at least a channel formation region of the oxide 230b be regarded as an intrinsic or substantially intrinsic semiconductor.

[Conductor]

As a conductive material for forming the conductors 205, 240, and 260, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. Alternatively, a semiconductor having a high electric conductivity typified by polycrystalline silicon including an impurity element such as phosphorus, or silicide such as nickel silicide may be used.

A conductive material containing the above metal element and oxygen may be used. A conductive material containing the above metal element and nitrogen may be used. For example, a conductive material containing nitrogen such as titanium nitride or tantalum nitride may be used. Indium tin oxide (ITO), indium oxide containing tungsten, indium zinc oxide containing tungsten, indium oxide containing titanium, indium tin oxide containing titanium, indium zinc oxide, or indium tin oxide to which silicon is added may be used. Indium gallium zinc oxide containing nitrogen may be used.

A stack of a plurality of conductive layers formed with the above materials may be used. For example, a layered structure formed using a combination of a material containing any of the metal elements listed above and a conductive material containing oxygen may be used. Alternatively, a layered structure formed using a combination of a material containing any of the metal elements listed above and a conductive material containing nitrogen may be used. Alternatively, a layered structure formed using a combination of a material containing any of the metal elements listed above, a conductive material containing oxygen, and a conductive material containing nitrogen may be used.

[Substrate]

There is no particular limitation on a material used as a substrate as long as the material has heat resistance high enough to withstand at least heat treatment performed later. For example, a single crystal semiconductor substrate or a polycrystalline semiconductor substrate made of silicon, silicon carbide, or the like or a compound semiconductor substrate made of silicon germanium or the like can be used as the substrate. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. That is, the substrate is not limited to a simple supporting substrate, and may be a substrate where a device such as a transistor is formed. In this case, at least one of the gate, the source, and the drain of the transistor 200a may be electrically connected to the above-described device.

Further alternatively, as the substrate, a glass substrate of barium borosilicate glass, aluminoborosilicate glass, or the like, a ceramic substrate, a quartz substrate, a sapphire substrate, or the like can be used. Note that a flexible substrate may also be used as the substrate. In the case where a flexible substrate is used, a transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate preferably has a lower coefficient of linear expansion because deformation due to an environment is suppressed. The flexible substrate used as the substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Example of Method for Manufacturing Transistor>

Next, an example of a method for manufacturing the transistor 200a is described with reference to FIGS. 4A to 4H, FIGS. 5A to 5F, FIGS. 6A to 6D, and FIGS. 7A to 7C. Here, FIGS. 4A to 4H, FIGS. 5A to 5F, FIGS. 6A to 6D, and FIGS. 7A to 7C correspond to the cross-sectional view taken along line A1-A2 in FIG. 1B and the cross-sectional view taken along line A3-A4 in FIG. 1C.

Hereinafter, an insulating material for forming the insulators, a conductive material for forming the conductors, or a semiconductor material for forming the semiconductors can be formed by a sputtering method, a spin coating method, a chemical vapor deposition (CVD) method (including a thermal CVD method, a metal organic chemical vapor deposition (MOCVD) method, a plasma enhanced CVD (PECVD) method, a high density plasma CVD method, a low pressure CVD (LPCVD) method, an atmospheric pressure CVD (APCVD) method, and the like), an ALD method, a molecular beam epitaxy (MBE) method, or a pulsed laser deposition (PLD) method as appropriate.

By using the PECVD method, a high-quality film can be formed at a relatively low temperature. By using a deposition method that does not use plasma for deposition, such as the MOCVD method, the ALD method, or the thermal CVD method, a film can be formed with few defects because damage is not easily caused on a surface on which the film is formed.

In the case where a film is formed by an ALD method, a gas that does not contain chlorine is preferably used as a material gas.

First, over a substrate (not illustrated), the insulator 214 and the insulator 216 are formed in this order. In this embodiment, a single crystal silicon substrate (including a p-type semiconductor substrate or an n-type semiconductor substrate) is used as the substrate.

In this embodiment, aluminum oxide is formed by a sputtering method as the insulator 214. The insulator 214 may have a stacked-layer structure; for example, aluminum oxide deposited by an ALD method may be provided over or under aluminum oxide deposited by a sputtering method. As described above, the insulator 216 is preferably an insulator containing excess oxygen. After the formation of the insulator 216, oxygen doping treatment may be performed.

Next, a resist mask is formed over the insulator 216 and an opening corresponding to the conductor 205 is formed in the insulator 216. The resist mask can be formed by a photolithography method, a printing method, an inkjet method, or the like as appropriate. Formation of the resist mask by a printing method, an inkjet method, or the like needs no photomask; thus, manufacturing cost can be reduced.

The formation of the resist mask by a photolithography method can be performed in such a manner that a photosensitive resist is irradiated with light through a photomask and part of the resist that has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a part between a substrate and a projection lens filled with liquid (e.g., water). An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

The insulator 216 can be etched by a dry etching method, a wet etching method, or the like. Both the dry etching method and the wet etching method may be used. The resist mask is removed after the formation of the opening. When the opening in the insulator 216 is formed, part of the insulator 214 is also etched in some cases.

Next, a conductive film to be the conductor 205 is formed over the insulator 216. In this embodiment, a tungsten film is formed by a sputtering method as the conductive film to be the conductor 205.

Figure 4A:
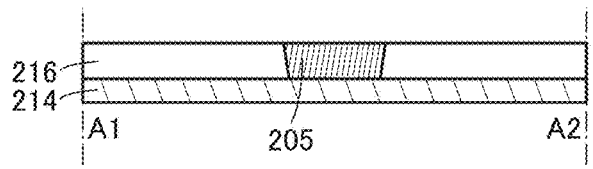
FIGS. 4A to 4H are cross-sectional views illustrating a method for manufacturing a transistor of one embodiment of the present invention.
Figure 4B:
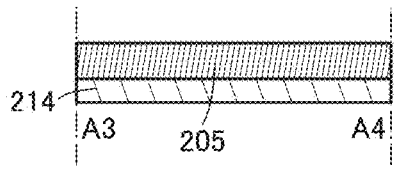

Next, the conductor 205 is formed by chemical mechanical polishing (CMP) treatment (see FIGS. 4A and 4B). By CMP treatment, part of the conductive film is removed. At this time, part of a surface of the insulator 216 is also removed in some cases. By the CMP treatment, unevenness of the sample surface can be reduced, and coverage with an insulating layer or a conductive layer to be formed later can be increased.

Figure 4C:
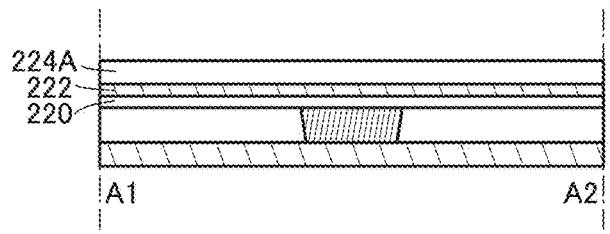
Figure 4D:
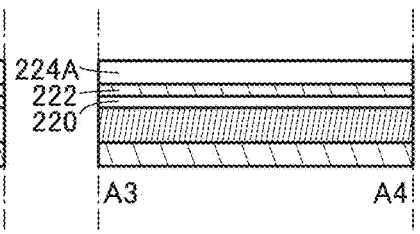

The insulator 220, the insulator 222, and an insulating film 224A are formed in this order over the insulator 216 and the conductor 205 (see FIGS. 4C and 4D). Here, the insulating film 224A is an insulator to be the insulator 224 in a later step. In this embodiment, hafnium oxide is deposited as the insulator 220 by an ALD method and silicon oxide is deposited as the insulator 224 and the insulating film 224A by a CVD method.

Here, the concentration of impurities such as water or hydrogen in the insulating film 224A is preferably lowered. Thus, impurities such as water or hydrogen are preferably diffused outward by heat treatment in an inert gas atmosphere containing nitrogen, a rare gas, or the like. The details of the heat treatment are described below. The insulating film 224A is preferably an insulating layer containing excess oxygen. Thus, oxygen doping treatment may be performed after the formation of the insulating film 224A.

Figure 4E:
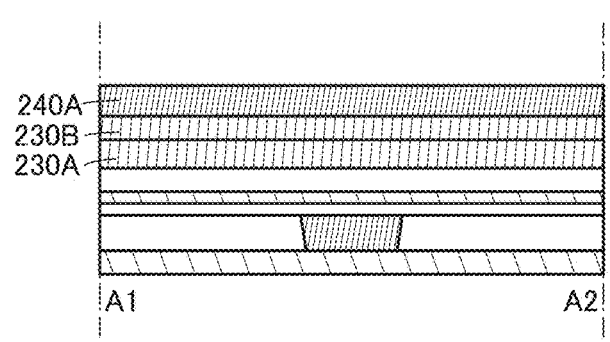
Figure 4F:
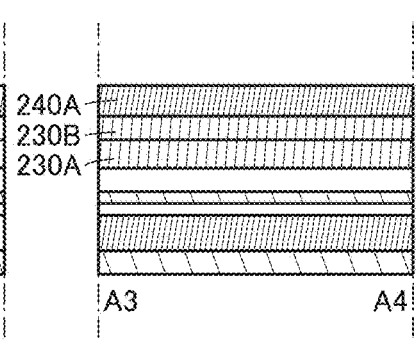

Next, an oxide film 230A, an oxide film 230B, and a conductive film 240A are formed in this order (see FIGS. 4E to 4F).

When the oxide 230 includes an oxide semiconductor, the oxide films 230A and 230B to be the oxide 230 are preferably formed by a sputtering method because the oxide 230 can have a higher density. A rare gas (typically argon), oxygen, or a mixed gas of a rare gas and oxygen may be used as a sputtering gas. Alternatively, deposition may be performed while the substrate is heated.

In addition, increasing the purity of a sputtering gas is also necessary. For example, an oxygen gas or a rare gas used as a sputtering gas is a gas that is highly purified to have a dew point of $-60°$ C. or lower, preferably $-100°$ C. or lower. By using the sputtering gas that is highly purified, entry of moisture or the like into the oxide 230 can be prevented as much as possible.

In the case where the oxide films 230A and 230B are formed by a sputtering method, it is preferable that moisture in a deposition chamber of a sputtering apparatus be removed as much as possible. For example, with an adsorption vacuum evacuation pump such as cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

In this embodiment, the oxide film 230A is formed by a sputtering method. Oxygen or a mixed gas of oxygen and a rare gas is used as the sputtering gas. When the proportion of oxygen in the sputtering gas is increased, the amount of excess oxygen in the oxide film to be formed can be increased.

At the formation of the oxide film 230A, part of oxygen contained in the sputtering gas is supplied to the insulating film 224A and the like in some cases. As the amount of oxygen contained in the sputtering gas increases, the amount of oxygen supplied to the insulating film 224A and the like increases. Thus, excess-oxygen regions can be formed in the insulating film 224A and the like. Moreover, part of oxygen supplied to the insulating film 224A and the like reacts with hydrogen left in the insulating film 224A and the like to produce water and the water is released from the insulating film 224A and the like by later heat treatment. Thus, the concentration of hydrogen in the insulating film 224A can be reduced.

Here, as illustrated in FIG. 3A, a damaged region is formed in the vicinity of the surface of the insulating film 224A because the oxide film 230A is formed by sputtering. In the following structure, until immediately before the insulator 272 is formed and oxygen is added to the insulator 224, it is preferable to prevent the top surface of the insulating film 224A from being exposed by processing the oxide film 230A into an island shape. When it is prevented, further formation of oxygen vacancies or further entry of impurity elements in the damaged region due to exposure of the top surface of the insulating film 224A to a deposition gas or an etching gas for another film can be reduced.

Next, the oxide film 230B is formed by a sputtering method. At this time, when the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

Note that when an oxygen-deficient oxide semiconductor is used as the oxide film 230B, an oxide film containing excess oxygen is preferably used as the oxide film 230A. After the formation of the oxide film 230B, oxygen doping treatment may be performed.

After the formation of the oxide films 230A and 230B, heat treatment is preferably performed. The details of the conditions for the heat treatment are described below. In this embodiment, the heat treatment is performed at 400° C. in an oxygen gas atmosphere for one hour. Accordingly, oxygen is introduced into the oxide films 230A and 230B. Further preferably, heat treatment is performed at 400° C. in a nitrogen gas atmosphere for one hour before the heat treatment performed in an oxygen gas atmosphere. By performing the heat treatment in a nitrogen gas atmosphere first, impurities such as water or hydrogen contained in the oxide films 230A and 230B are released, so that the concentration of impurities in the oxide films 230A and 230B can be reduced.

Then, the conductive film 240A is formed. Here, the conductive film 240A is an insulator to be the conductors 240a and 240b in a later step. In this embodiment, a tantalum nitride film is formed by a sputtering method as the conductive film 240A. Tantalum nitride has high oxidation resistance and thus is preferably used in the case where heat treatment is performed in a later step.

Next, the conductive film 240A is processed by a photolithography method, so that an opening is formed in a region overlapping with the conductor 205 of the conductive film 240A.

Note that when the opening is formed, the side surface on the opening side of the conductive film 240A is preferably tapered to the top surface of the oxide film 230B. Note that the taper angle is 30° or more and 90° or less, preferably 45° or more and 80° or less.

Figure 4G:
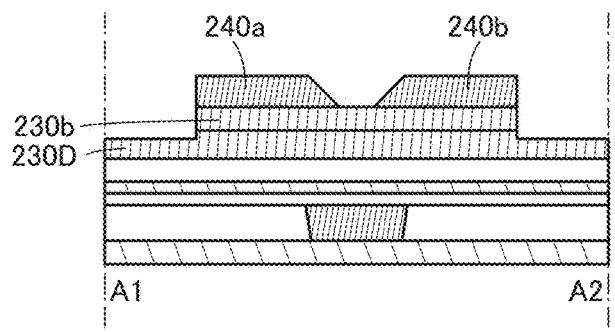
Figure 4H:
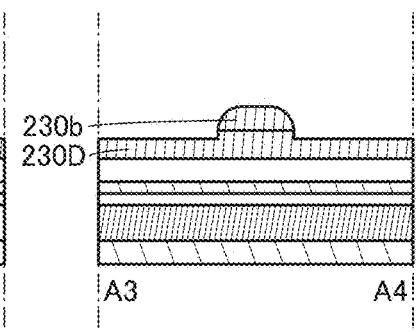

Next, part of the oxide film 230B and part of the conductive film 240A are selectively removed by a photolithography method, so that the oxide 230b, the conductor 240a, and the conductor 240b that have island shapes are formed (see FIGS. 4G and 4H).

Here, it is preferable that the oxide film 230A not be processed into an island shape and an oxide film 230D in which the vicinity of the surface of a region that does not overlap with the oxide 230b is removed be formed. When the oxide film 230D that has a film shape is left over the insulating film 224A, the top surface of the insulating film 224A can be prevented from being directly exposed to an etching gas or the like used in this process. Accordingly, further formation of oxygen vacancies or further entry of impurity elements in the damaged region of the surface of the insulating film 224A can be reduced.

The selective removal of the oxide film 230B and the conductive film 240A can be performed by a dry etching method, a wet etching method, or the like. Both the dry etching method and the wet etching method may be used.

By performing etching in such a manner, a side surface portion of the conductor 240a and one side surface portion of the oxide 230b are substantially aligned with each other, and a side surface portion of the conductor 240b and another side surface portion of the oxide 230b are substantially aligned with each other. Furthermore, by forming the oxide film 230D in such a manner, the thickness of the region of the oxide 230a that is in contact with the oxide 230c is less than the thickness of the region of the oxide 230a that is in contact with the oxide 230b.

Note that the step of forming the opening in the region overlapping with the conductor 205 of the conductive film 240A may be performed before or after the step of removing part of the oxide film 230B and part of the conductive film 240A selectively to process the oxide film 230B and the conductive film 240A into island shapes.

Next, heat treatment is preferably performed to further reduce impurities such as water or hydrogen contained in the oxide film 230D and the oxide 230b and to purify the oxide film 230D and the oxide 230b.

Plasma treatment using an oxidizing gas may be performed before the heat treatment. For example, plasma treatment using a nitrous oxide gas is performed. By the plasma treatment, the fluorine concentration in the exposed insulating layer can be lowered. Moreover, the plasma treatment is effective in removing an organic substance on the surface of a sample.

For example, the heat treatment is performed in an inert gas atmosphere containing nitrogen, a rare gas, or the like, an oxidizing gas atmosphere, or an ultra-dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert gas atmosphere refers to an atmosphere that contains the oxidizing gas at lower than 10 ppm and is filled with nitrogen or a rare gas. Although there is not particular limitation on the pressure during the heat treatment, the heat treatment is preferably performed under a reduced pressure.

By the heat treatment, at the same time as the release of the impurities, oxygen contained in the insulator 224 is diffused in the oxide film 230D and the oxide 230b and oxygen vacancies therein can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for released oxygen. Note that the heat treatment may be performed at any time after the oxide 230b is formed.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced. Note that in the case where a metal that is likely to diffuse when heated, such as Cu, is used for the conductor, the temperature of the heat treatment may be set to lower than or equal to 410° C., preferably lower than or equal to 400° C.

In this embodiment, after heat treatment is performed at 400° C. in a nitrogen gas atmosphere for 1 hour, heat treatment is performed at 400° C. in an oxygen gas atmosphere for 1 hour. By performing the heat treatment in a nitrogen gas atmosphere first, impurities such as water or hydrogen contained in the oxides 230a and 230b are released, so that the concentration of impurities in the oxides 230a and 230b is reduced. By performing the heat treatment in an oxygen gas atmosphere next, oxygen is introduced into the oxides 230a and 230b.

Next, an oxide film 230C to be the oxide 230c is formed. In this embodiment, like the oxide film 230A, the oxide film 230C is formed using an oxide containing a large amount of excess oxygen. When a semiconductor containing excess oxygen is used for the oxide film 230C, oxygen can be supplied to the oxide 230b by later heat treatment.

At the formation of the oxide film 230C, part of oxygen contained in the sputtering gas is supplied to the insulating film 224A and the like, and an excess oxygen region is formed in some cases, as in the case of the oxide film 230A. Part of oxygen supplied to the insulating film 224A and the like reacts with hydrogen left in the insulating film 224A and the like to produce water and is released from the insulating film 224A and the like by later heat treatment. Thus, the concentration of hydrogen in the insulating film 224A and the like can be reduced.

Oxygen doping treatment and/or heat treatment may be performed after the formation of the oxide film 230C. By the heat treatment, oxygen contained in the oxide films 230A and 230C can be supplied to the oxide 230b. By supplying oxygen to the oxide 230b, oxygen vacancies in the oxide 230b can be reduced. Thus, in the case where an oxygen-deficient oxide semiconductor is used for the oxide 230b, a semiconductor containing excess oxygen is preferably used for the oxide film 230C.

Figure 5A:
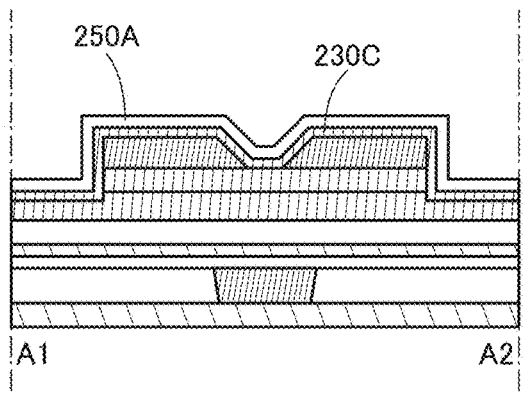
FIGS. 5A to 5F are cross-sectional views illustrating a method for manufacturing a transistor of one embodiment of the present invention.
Figure 5B:
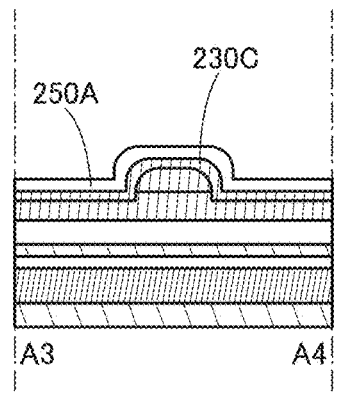
Figure 5C:
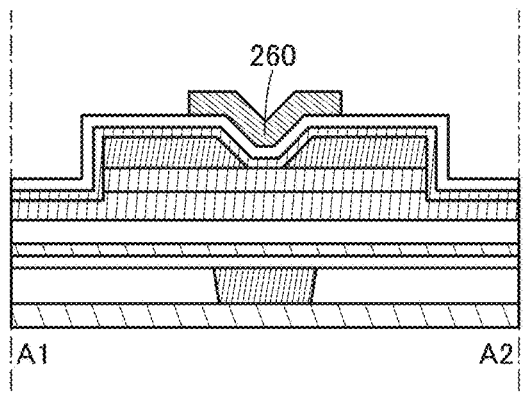
Figure 5D:
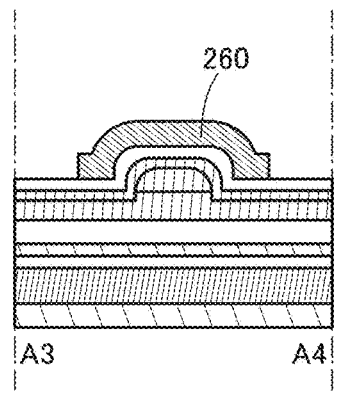

Next, an insulating film 250A is formed over the oxide film 230C (see FIGS. 5A and 5B). In this embodiment, a silicon oxynitride film is formed by a CVD method as the insulating film 250A. The insulating film 250A is preferably an insulating layer containing excess oxygen. The insulating film 250A may be subjected to oxygen doping treatment. Heat treatment may be performed after the formation of the insulating film 250A.

Next, a conductive film to be the conductor 260 is formed. The conductive film is subjected to a photolithography method, so that the conductor 260 is formed (see FIGS. 5C and 5D).

Figure 5E:
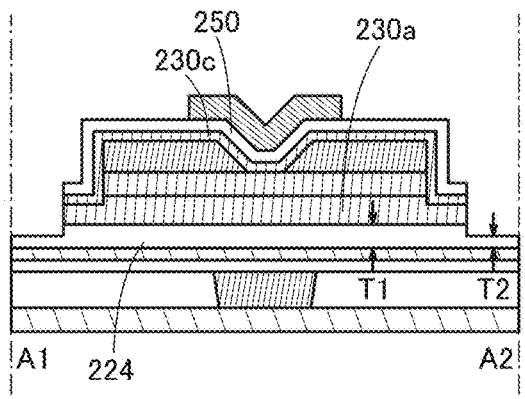
Figure 5F:
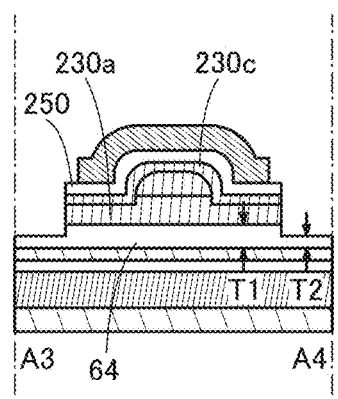

Next, part of the oxide film 230D, part of the oxide film 230C, and part of the insulating film 250A are selectively removed by a photolithography method, so that the oxide 230a, the oxide 230c, and the insulator 250 are formed (see FIGS. 5E and 5F).

Here, it is preferable that the vicinity of the surface of a region of the insulating film 224A that does not overlap with the oxide 230a be removed by the etching of the oxide film 230D, the oxide film 230C, and the insulating film 250A so that the insulator 224 is formed. When the vicinity of the surface is removed, as illustrated in FIG. 3B, the damaged region formed because of the formation of the oxide film 230A can be removed.

The thickness T2 of the region of the insulator 224 in which the top surface is exposed is less than the thickness T1 of the region of the insulator 224 that is in contact with the oxide 230a. The difference between the thickness T1 and the thickness T2 is greater than or equal to 5 nm, preferably greater than or equal to 10 nm, further preferably greater than or equal to 20 nm. Furthermore, the thickness T2 is at least greater than or equal to 3 nm, preferably greater than or equal to 5 nm, further preferably greater than or equal to 10 nm.

The etching of the oxide film 230D, the oxide film 230C, the insulating film 250A, and the damaged region of the insulating film 224A can be performed by a dry etching method, a wet etching method, or the like. Both the dry etching method and the wet etching method may be used.

In the case where the dry etching treatment is performed, for example, a gas containing chlorine (a chlorine-based gas such as a $Cl_2$ gas, a $BCl_3$ gas, a $SiCl_4$ gas, or a $CCl_4$ gas) is preferable for the etching gas. Furthermore, a gas containing fluorine (a fluorine-based gas such as a $C_4F_6$ gas, a $C_2F_6$ gas, a $C_4F_8$ gas, a $CF_4$ gas, a $SF_6$ gas, a $NF_3$ gas, or a $CHF_3$ gas) is preferable. Moreover, an oxygen gas, a helium gas, an argon gas, a hydrogen gas, or the like can be added to any of the above gases as appropriate.

As the dry etching method, a parallel plate reactive ion etching (RIE) method or an inductively coupled plasma (ICP) etching method can be used. In order to etch the film into desired shapes, the etching condition (the amount of electric power applied to a coil-shaped electrode, the amount of electric power applied to an electrode on a substrate side, the temperature of the electrode on the substrate side, or the like) is adjusted as appropriate.

In the above description, the oxide film 230D, the oxide film 230C, the insulating film 250A, and the insulating film 224A are simultaneously etched; however, this embodiment is not limited thereto. For example, the oxide film 230D, the oxide film 230C, and the insulating film 250A may be etched first, and the damaged region of the insulating film 224A may be etched in a different condition.

For example, after etching of the oxide film 230D, the oxide film 230C, and the insulating film 250A, the damaged region may be removed by etching the vicinity of the surface of the insulating film 224A using hydrofluoric acid-based etchant (e.g., hydrofluoric acid, buffered fluoric acid, a mixed solution of hydrofluoric acid and nitric acid, ammonium fluoride, and a mixed solution of ammonium fluoride and nitric acid). Here, buffered fluoric acid is a mixed solution of hydrofluoric acid (HF) and ammonium fluoride ($NH_4F$), and for example, a solution with a ratio of HF:$NH_4F$ (weight ratio)=1:100 to 1:10 can be used.

When the oxide film 230D, the oxide film 230C, and the insulating film 250A are etched and then the vicinity of the surface of the insulating film 224A is etched in a different condition as described above, the insulating film 224A can be prevented from being etched too much, and thus the insulator 224 can be accurately etched to have the thickness T2. Furthermore, when wet etching is performed on the damaged region of the insulator 224, impurity elements attached to the top of the insulator 224 can be washed.

By performing etching as described above, the side surface portion of the oxide 230b is located inward from the side surface portion of the oxide 230a. Furthermore, the side surface portion of the insulator 250, the side surface portion of the oxide 230c, and the side surface portion of the oxide 230a are substantially aligned with one another. By forming the oxide 230a after the formation of the conductor 260, the side surface portion of the conductor 260 is located inward from the side surface portion of the oxide 230a in the cross section in the channel width direction of the transistor 200a, as illustrated in FIG. 5F.

Figure 6A:
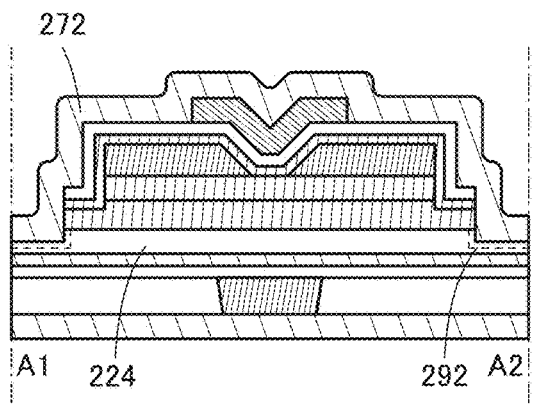
FIGS. 6A to 6D are cross-sectional views illustrating a method for manufacturing a transistor of one embodiment of the present invention.
Figure 6B:
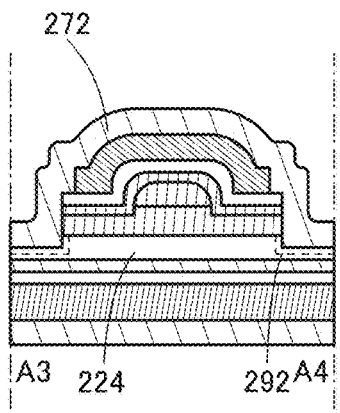

Next, the insulator 272 is formed over the conductor 260 by a sputtering method (see FIGS. 6A and 6B). Here, the insulator 272 is formed so that at least part of the insulator 272 is in contact with the insulator 224. In this embodiment, the thickness of the insulator 272 is 5 nm or greater and 100 nm or less, preferably 5 nm or greater and 20 nm or less, further preferably 5 nm or greater and 10 nm or less, approximately.

The insulator 272 is preferably formed in an atmosphere containing oxygen by a sputtering method. The insulator 272 is preferably formed using an insulating material that is less likely to transmit impurities such as water or hydrogen. In this embodiment, as the insulator 272, an aluminum oxide film is formed in an atmosphere containing oxygen by a sputtering method. Accordingly, as illustrated in FIG. 3C and the like, the insulator 272 can add oxygen in the vicinity of the surface of the insulator 224, and the oxygen addition region 292 can be formed. Although the oxygen is added as an oxygen radical here, for example, the state of the oxygen at the time of being added is not limited thereto. The oxygen may be added as an oxygen atom, an oxygen ion, or the like. Heat treatment in a later step can diffuse oxygen so that oxygen can be supplied to the oxide 230b effectively.

The insulator 272 is preferably formed while the substrate is being heated. The substrate is heated preferably to higher than 100° C. and lower than or equal to 300° C., further preferably higher than or equal to 120° C. and lower than or equal to 250° C. By making the substrate temperature higher than 100° C., water in the oxide 230 can be removed. Furthermore, water can be prevented from adsorbing on the surface of the formed film. Moreover, by forming the insulator 272 while the substrate is being heated in this manner, oxygen can be diffused into the oxide 230 during the deposition.

When the transistor 200a is positioned between the insulators 272 and 214 as described above, a large amount of oxygen can be contained in the insulator 224, the oxide 230, and the insulator 250 without diffusing outward. Furthermore, impurities such as water or hydrogen can be prevented from entering from a layer over the insulator 272 and a layer below the insulator 214, and thus the concentration of impurities in the insulator 224, the oxide 230, and the insulator 250 can be lowered.

Figure 6C:
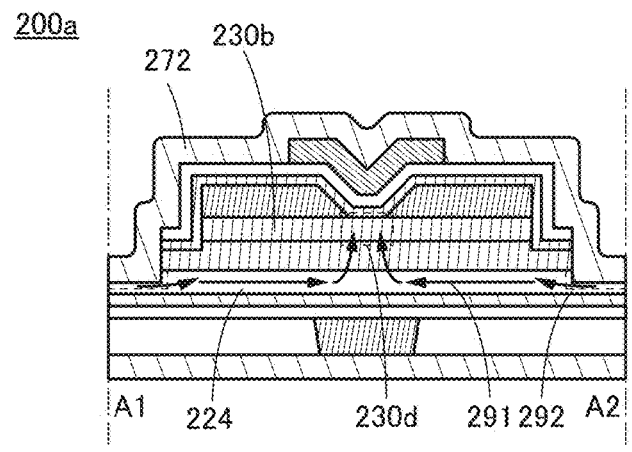
Figure 6D:
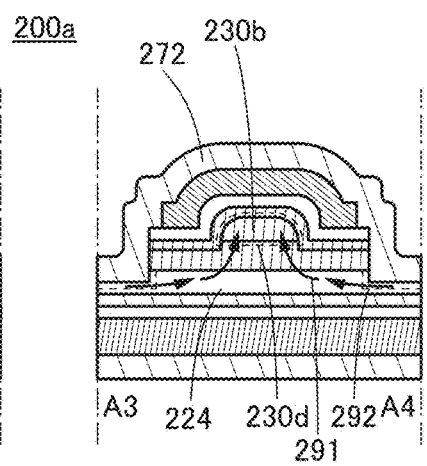

Next, heat treatment is performed (see FIGS. 6C and 6D). The heat treatment may be performed at a temperature higher than or equal to 250° C. and lower than or equal to 650° C., preferably higher than or equal to 300° C. and lower than or equal to 500° C. The heat treatment may be performed in an oxygen atmosphere. Alternatively, the heat treatment may be performed under an inert gas atmosphere or an atmosphere containing an oxidizing gas at 10 ppm or more, 1% or more, or 10% or more. Here, as the inert gas, for example, a nitrogen gas or a rare gas can be used. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate released oxygen. In this embodiment, the heat treatment is performed at 400° C. in an oxygen gas atmosphere for one hour.

Figure 3D:
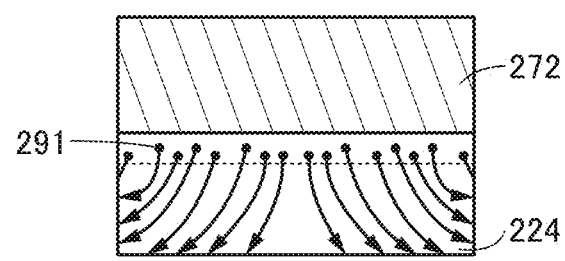

As described above, in this embodiment, the damaged region is not formed on the surface of the insulator 224. Thus, by the heat treatment, as illustrated in FIG. 3D, oxygen can be diffused from the oxygen addition region 292 of the insulator 224 without being prevented by the damaged region. Accordingly, oxygen added to the insulator 224 in the step illustrated in FIGS. 6A and 6B can be supplied to the oxide 230. Therefore, oxygen vacancies in the oxide 230a, the oxide 230b, and the oxide 230c can be reduced. Here, the insulators 214 and 272 can prevent oxygen from diffusing over and under the transistor 200a, and thus oxygen can be supplied to the oxide 230b effectively.

In this manner, oxygen vacancies in the oxide 230b functioning as a semiconductor layer of the transistor 200a are reduced, and impurities such as water or hydrogen are reduced; accordingly, the transistor 200a can have normally-off electrical characteristics, the electrical characteristics of the transistor 200a can be stable, and the reliability can be improved.

Modification Example

The structure of the semiconductor device in this embodiment is not limited to the structure in FIGS. 1A to 1D. Modification examples of the transistor described in this embodiment are described below with reference to FIGS. 7A to 7C, FIGS. 8A to 8C, FIGS. 9A to 9C, FIGS. 10A to 10C, and FIGS. 11A to 11C.

Figure 7A:
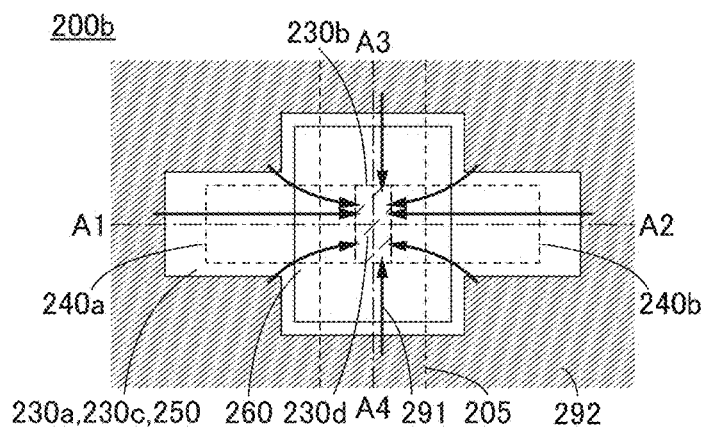
FIGS. 7A to 7C are a top view and cross-sectional views illustrating a transistor of one embodiment of the present invention.
Figure 7B:
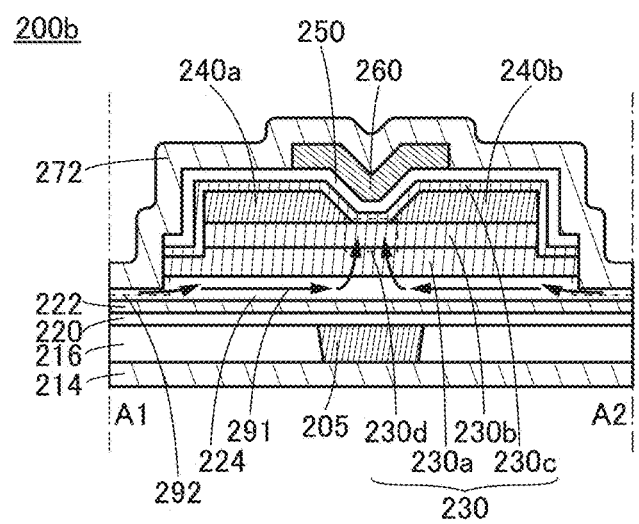
Figure 7C:
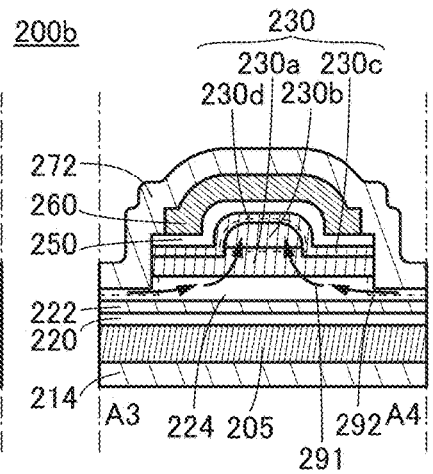

As one modification example, first, a transistor 200b is described with reference to FIGS. 7A to 7C. Here, FIG. 7A is a top view of the transistor 200b. FIG. 7B is a cross-sectional view of the transistor 200b in the channel length direction taken along dashed-dotted line A1-A2 in FIG. 7A. FIG. 7C is a cross-sectional view of the transistor 200b in the channel width direction taken along dashed-dotted line A3-A4 in FIG. 7A. Note that FIGS. 8A to 8C, FIGS. 9A to 9C, FIGS. 10A to 10C, and FIGS. 11A to 11C illustrate top views and cross-sectional views similarly.

As illustrated in FIG. 7A, the transistor 200b differs from the transistor 200a in that the top surfaces of the oxide 230a, the oxide 230c, and the insulator 250 have cruciform shapes. The other structure of the transistor 200b is similar to that of the transistor 200a, and the description of the transistor 200a can be referred to.

When the top surfaces of the oxide 230a, the oxide 230c, and the insulator 250 have cruciform shapes as illustrated in FIG. 7A, the area of a region where the insulator 272 and the insulator 224 are in contact with each other, that is, the area of the oxygen addition region 292 can be greater than the area in the case where the top surfaces of the oxide 230a, the oxide 230c, and the insulator 250 have substantially rectangular shapes, like the transistor 200a. Accordingly, the amount of oxygen added to the insulator 224 can be increased and the distance between the oxygen addition region 292 and the channel formation region 230d can be reduced; thus, the oxygen 291 can be supplied to the oxide 230b, particularly the channel formation region 230d.

Note that although the top surfaces of the oxide 230a, the oxide 230c, and the insulator 250 are cruciform shapes here, the shapes of the top surfaces are not limited thereto and may be set as appropriate. For example, the shapes of the top surfaces of the oxide 230a, the oxide 230c, and the insulator 250 may be cruciform shapes with rounded corners.

Figure 8A:
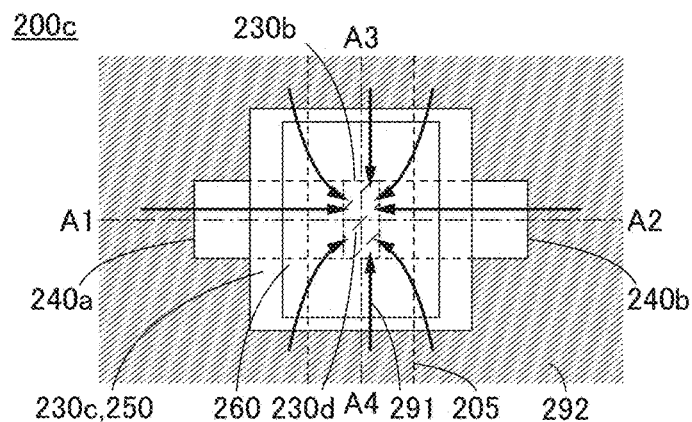
FIGS. 8A to 8C are a top view and cross-sectional views illustrating a transistor of one embodiment of the present invention.
Figure 8B:
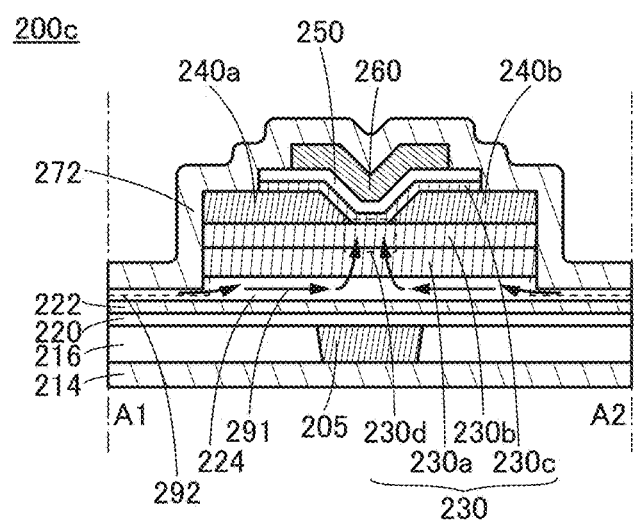
Figure 8C:
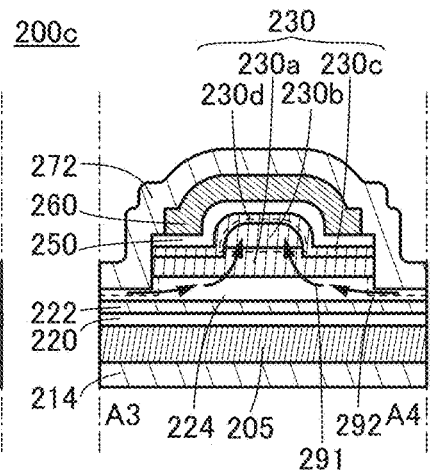

Next, as another modification example, a transistor 200c is described with reference to FIGS. 8A to 8C. As illustrated in FIGS. 8A to 8C, the transistor 200c differs from the transistor 200a in that a side surface portion of the conductor 240a is substantially aligned with one side surface portion of the oxide 230a and one side surface portion of the oxide 230b, and a side surface portion of the conductor 240b is substantially aligned with another side surface portion of the oxide 230a and another side surface portion of the oxide 230b. Furthermore, the transistor 200c differs from the transistor 200a in that the oxide 230c and the insulator 250 do not cover end portions of the conductor 240a, the conductor 240b, and the oxide 230b. The other structure of the transistor 200c is similar to that of the transistor 200a, and the description of the transistor 200a can be referred to.

Figure 9A:
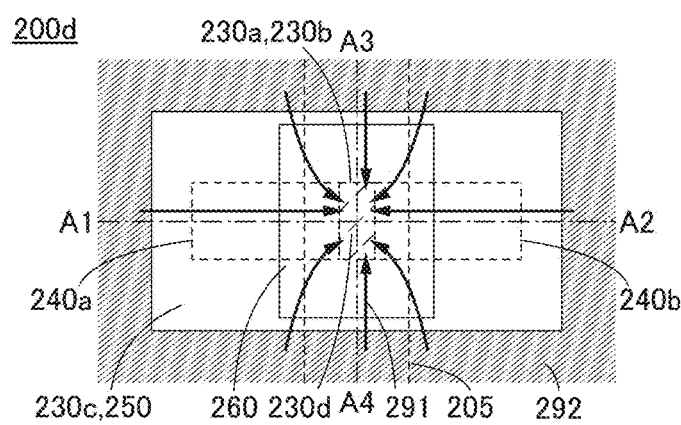
FIGS. 9A to 9C are a top view and cross-sectional views illustrating a transistor of one embodiment of the present invention.
Figure 9B:
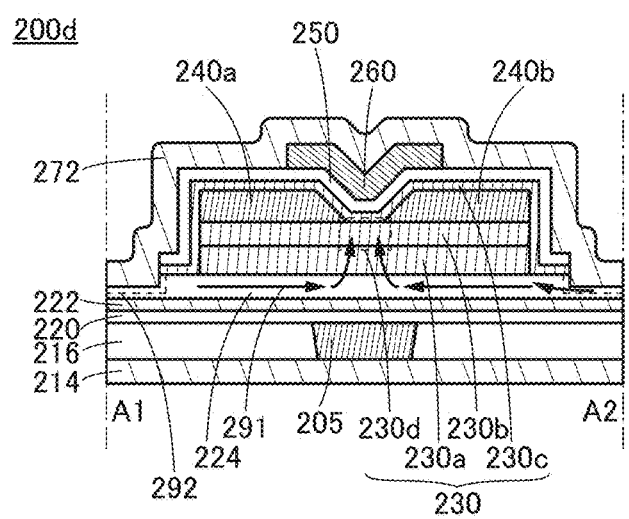
Figure 9C:
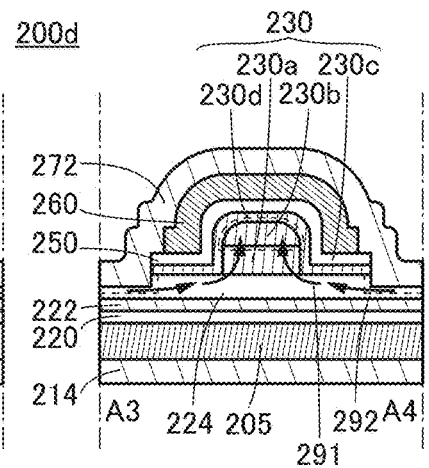

Next, as another modification example, a transistor 200d is described with reference to FIGS. 9A to 9C. As illustrated in FIGS. 9A to 9C, the transistor 200d differs from the transistor 200a in that a side surface portion of the conductor 240a is substantially aligned with one side surface portion of the oxide 230a and one side surface portion of the oxide 230b, and a side surface portion of the conductor 240b is substantially aligned with another side surface portion of the oxide 230a and another side surface portion of the oxide 230b. Furthermore, the transistor 200d differs from the transistor 200a in that the oxide 230c and the insulator 250 cover end portions of the conductor 240a, the conductor 240b, the oxide 230b, and the oxide 230a and part of the oxide 230c is in contact with the top surface of the insulator 224. The other structure of the transistor 200d is similar to that of the transistor 200a, and the description of the transistor 200a can be referred to.

Figure 10A:
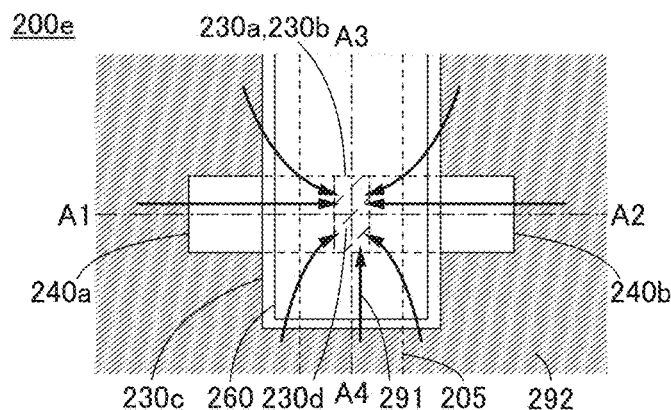
FIGS. 10A to 10C are a top view and cross-sectional views illustrating a transistor of one embodiment of the present invention.
Figure 10B:
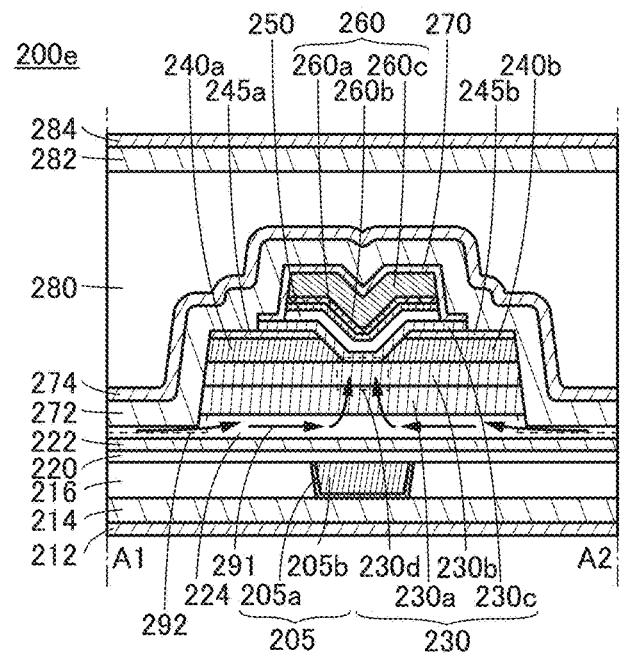
Figure 10C:
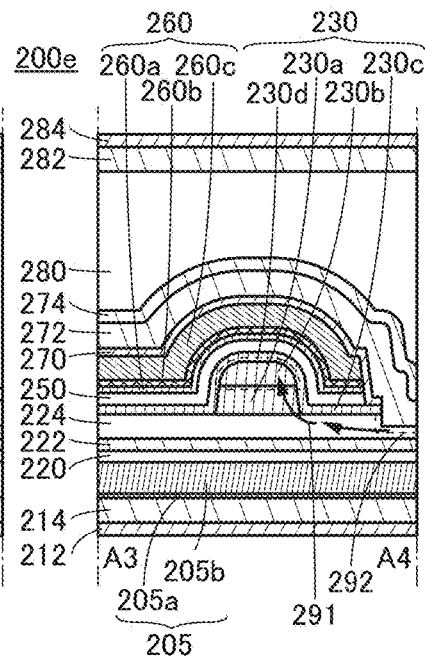

Next, as another modification example, a transistor 200e is described with reference to FIGS. 10A to 10C. As illustrated in FIGS. 10A to 10C, the transistor 200e is an example in which some components of the transistor 200c have stacked structures.

In the transistor 200e, an insulator 212 is provided below the insulator 214. Here, like the insulator 214, the insulator 212 is preferably formed using an insulating material that is less likely to transmit impurities such as water or hydrogen, and for example, is preferably formed using aluminum oxide. By forming the insulator 212 by an ALD method, even in the case where cracks or pinholes are formed in the insulator 214, the insulator 212 can be formed with good coverage to fill the cracks or the pinholes.

In the transistor 200e, a stacked-layer structure in which a conductor 205b is provided over a conductor 205a is used for the conductor 205. Here, a conductive material that is less likely to transmit impurities such as water or hydrogen is preferably used for the conductor 205a. Furthermore, the conductor 205a is preferably formed using tantalum, tantalum nitride, ruthenium, ruthenium oxide, or the like, and may be a single layer or a stack. Note that it is preferable that at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom and oxygen (e.g., an oxygen atom or an oxygen molecule) be less likely to penetrate the conductor 205a. When the conductor 205a has a function of inhibiting penetration of oxygen, the conductivity of the conductor 205b can be prevented from being lowered because of oxidation.

Furthermore, in the transistor 200e, a barrier film 245a is provided over and in contact with the conductor 240a, and a barrier film 245b is provided over and in contact with the conductor 240b. The barrier films 245a and 245b have a function of inhibiting penetration of impurities such as water or hydrogen and oxygen. Aluminum oxide or the like can be used for the barrier films 245a and 245b, for example. The barrier films 245a and 245b formed using aluminum oxide or the like can prevent surrounding excess oxygen from being used for oxidation of the conductors 240a and 240b. Furthermore, an increase in the electric resistance values of the conductors 240a and 240b due to the oxidation can be prevented.

Furthermore, in the transistor 200e, a stacked-layer structure in which a conductor 260a, a conductor 260b, and a conductor 260c are provided in this order is used for the conductor 260. The conductor 260a is preferably an oxide having conductivity. For example, the metal oxide that can be used as the oxide 230a, 230b, or 230c can be used. In particular, an In—Ga—Zn-based oxide with a metal atomic ratio of In:Ga:Zn=4:2:3 to 4.1 and the vicinity thereof, which has high conductivity, is preferably used. When the conductor 260a is formed using such an oxide, oxygen can be prevented from entering the conductors 260b and 260c, and an increase in electric resistance value of the conductors 260b and 260c due to oxidation can be prevented. Moreover, excess oxygen can be supplied to the oxide 230b. The conductor 260b is preferably a conductor that can add impurities such as nitrogen to the conductor 260a to improve the conductivity of the conductor 260a. For example, titanium nitride or the like is preferably used for the conductor 260b.

Furthermore, in the transistor 200e, a barrier film 270 is preferably provided over the conductor 260. Here, for the barrier film 270, a material that is less likely to transmit oxygen is preferably used, and aluminum oxide or the like can be used, for example. The barrier film 270 formed using aluminum oxide or the like can prevent surrounding excess oxygen from being used for oxidation of the conductor 260. Thus, the barrier film 270 functions as a gate cap for protecting a gate. Note that the barrier film 270 is not necessarily provided.

Furthermore, in the transistor 200e, an insulator 274 is provided over the insulator 272. Here, like the insulator 272, the insulator 274 is preferably formed using an insulating material that is less likely to transmit impurities such as water or hydrogen, and for example, is preferably formed using aluminum oxide or the like. By forming the insulator 274 by an ALD method, even in the case where cracks or pinholes are formed in the insulator 272, the insulator 274 can be formed with good coverage to fill the cracks or the pinholes.

Furthermore, in the transistor 200e, an insulator 280 functioning as an interlayer film is preferably provided over the insulator 274. Moreover, an insulator 282 and an insulator 284 are preferably provided over the insulator 280. The insulator 282 may have a component similar to the insulator 272, and the insulator 284 may have a component similar to the insulator 274.

Figure 11A:
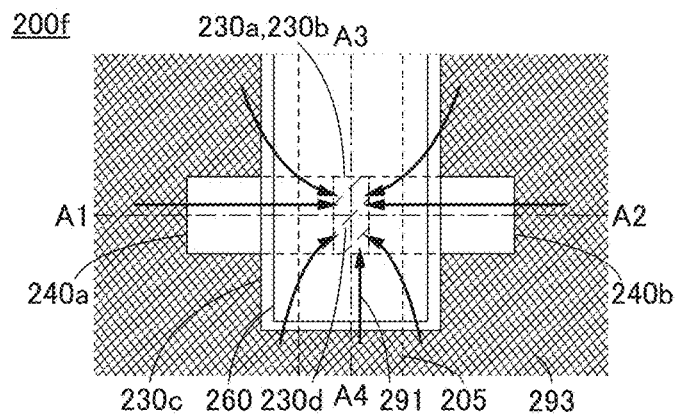
FIGS. 11A to 11C are a top view and cross-sectional views illustrating a transistor of one embodiment of the present invention.
Figure 11B:
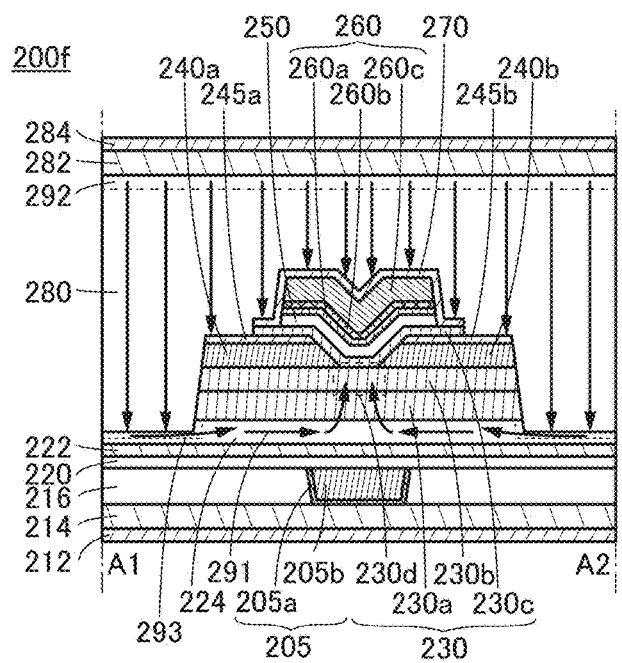
Figure 11C:
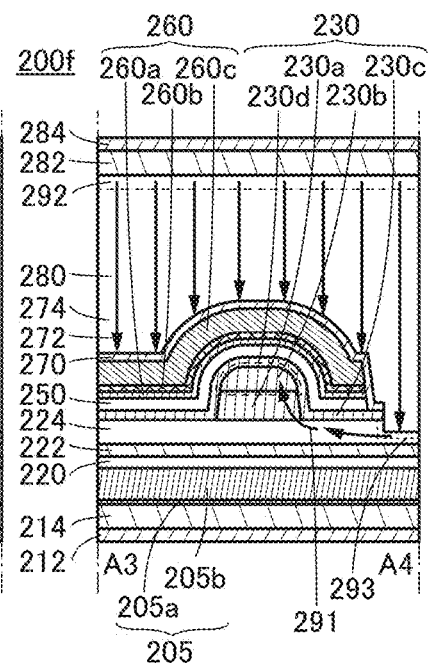

In the case where the insulator 282 that has a component similar to the insulator 272 is provided over the insulator 280 as in the transistor 200e, the insulators 272 and 274 are not necessarily provided. A transistor 200f having such a structure is illustrated in FIGS. 11A to 11C. The transistor 200f differs from the transistor 200e in that the insulators 272 and 274 are not provided. The other structure of the transistor 200f is similar to that of the transistor 200e, and the description of the transistor 200e can be referred to.

In the transistor 200f, the oxygen addition region 292 is formed in the vicinity of the surface of the insulator 280 (the vicinity of the interface between the insulators 280 and 282). A region of the insulator 224 that is in contact with the insulator 280 is referred to as a region 293. Here, a damaged region formed in the vicinity of the surface of the insulator 224 (over the region 293) is removed as in the above-described transistor. Thus, the oxygen 291 diffused from the oxygen addition region 292 is supplied to the insulator 224 through the region 293. As in the above-described transistor, the oxygen 291 supplied to the insulator 224 is diffused in the insulator 224 and is supplied to the oxide 230.

In the above manner, one embodiment of the present invention can provide a transistor having stable electrical characteristics, a transistor having normally-off electrical characteristics, a transistor having a low leakage current in an off state, a highly reliable transistor, or a transistor having a small subthreshold swing value.

This embodiment can be implemented in an appropriate combination with any of the structures described in the other embodiments, Example, and the like.

Embodiment 2

<Composition of CAC-OS>

Described below is the composition of a cloud-aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility ($\mu$) can be achieved.

A semiconductor element including a CAC-OS has high reliability. Thus, the CAC-OS is suitably used in a variety of semiconductor devices typified by a memory device.

At least part of this embodiment can be implemented in combination with any of the other embodiments described in this specification as appropriate.

Embodiment 3

Figure 14:
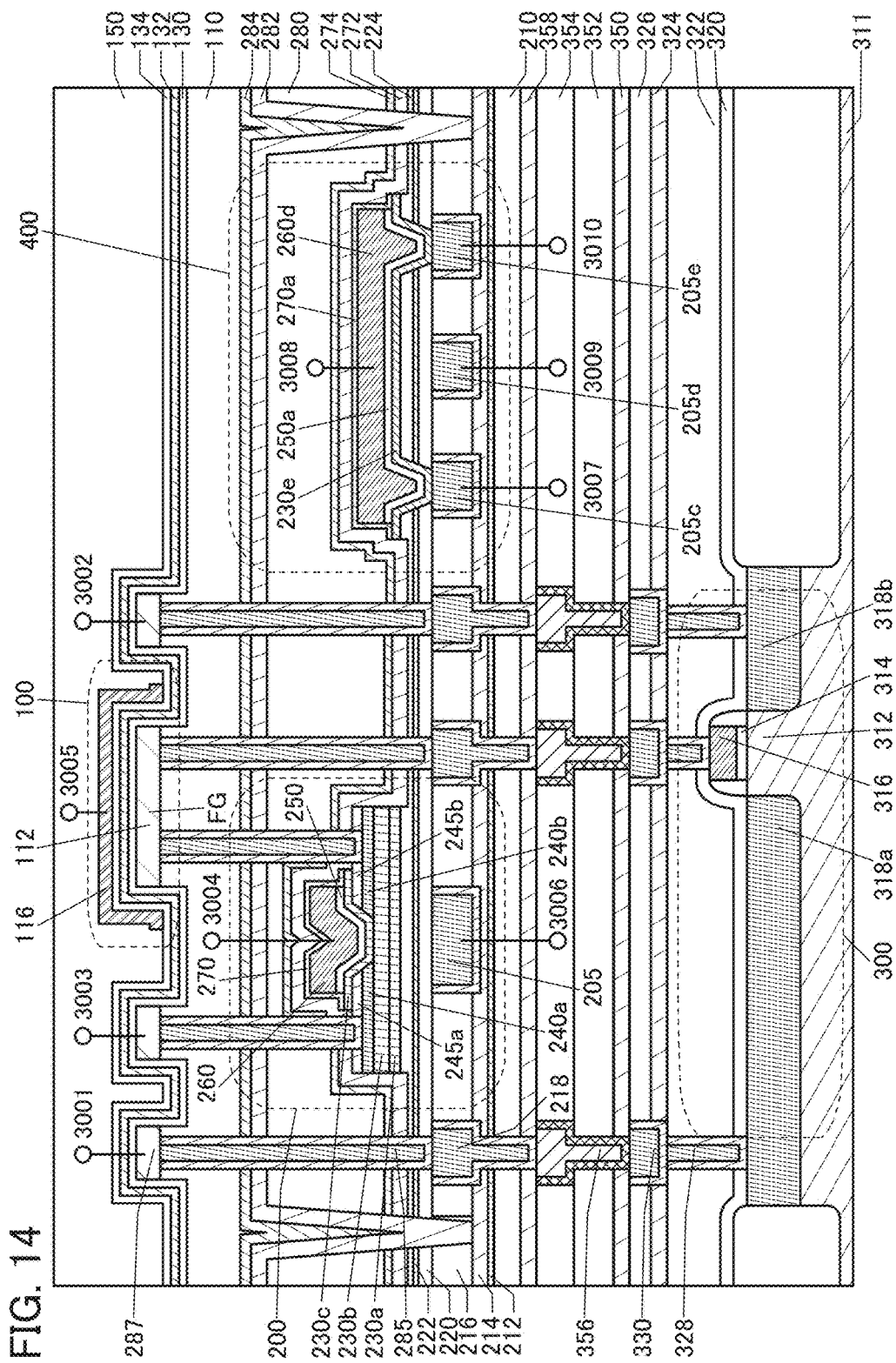
FIG. 14 is a cross-sectional view illustrating a semiconductor device of one embodiment of the present invention.

In this embodiment, an embodiment of a semiconductor device is described with reference to FIG. 14.
[Memory Device]
FIG. 14 illustrates an example of a memory device using the semiconductor device of one embodiment of the present invention.

The memory device in FIG. 14 includes a transistor 400, a transistor 300, a transistor 200, and a capacitor 100. Here, the insulator 212, the insulator 214, the insulator 216, the conductor 205, the insulator 220, the insulator 222, the insulator 224, the oxide 230a, the oxide 230b, the conductor 240a, the conductor 240b, the barrier film 245a, the barrier film 245b, the oxide 230c, the insulator 250, the conductor 260, the barrier film 270, the insulator 272, the insulator 274, the insulator 280, the insulator 282, and the insulator 284 are provided in and near the transistor 200 illustrated in FIG. 14, like the transistor described in the above embodiment.

The transistor 200 is a transistor in which a channel is formed in a semiconductor layer including an oxide semiconductor. Since the off-state current of the transistor 200 is small, by using the transistor 200 in a memory device, stored data can be retained for a long time. In other words, such a memory device does not require refresh operation or has an extremely low frequency of the refresh operation, which leads to a sufficient reduction in power consumption of the memory device.

Moreover, supplying a negative potential to a back gate of the transistor 200 can further reduce the off-state current of the transistor 200. In that case, with a structure capable of maintaining the back gate voltage of the transistor 200, stored data can be retained for a long time without power supply.

The transistor 400 and the transistor 200 are formed in the same tier and thus can be fabricated in parallel. The transistor 400 includes the insulator 216; a conductor 205c, a conductor 205d, and a conductor 205e that are provided in openings of the insulator 216; the insulator 220, the insulator 222, and the insulator 224 thereover; an oxide 230e over the insulator 224; an insulator 250a over the oxide 230e; and the conductor 260d over the insulator 250a. The conductor 205c, the conductor 205d, and the conductor 205e are in the same tier as the conductor 205. The conductor 260d is in the same tier as the conductor 260.

The conductors 205c and 205e are in contact with the oxide 230e through openings formed in the insulators 220, 222, and 224. Thus, the conductors 205c and 205e can function as source and drain electrodes. One of the conductors 260d and 205d can function as a gate electrode, and the other can function as a back gate electrode.

In the oxide 230e functioning as a semiconductor layer of the transistor 400, oxygen vacancies and impurities such as hydrogen or water are reduced, as in the oxide 230c or the like. Thus, the threshold voltage of the transistor 400 can be higher than 0 V, the off-state current can be reduced, and $I_{cut}$ can be noticeably reduced. Note that $I_{cut}$ refers to a drain current when the back gate voltage and the top gate voltage are each 0 V.

The back gate voltage of the transistor 200 is controlled by the transistor 400. For example, a top gate and a back gate of the transistor 400 are diode-connected to a source thereof, and the source of the transistor 400 and the back gate of the transistor 200 are connected to each other. When the negative potential of the back gate of the transistor 200 is held in the structure, the top gate-source voltage and the back gate-source voltage of the transistor 400 are each 0 V. Since the $I_{cut}$ of the transistor 400 is extremely small, the structure allows the negative potential of the back gate of the transistor 200 to be held for a long time without power supply to the transistor 200 and the transistor 400. Accordingly, the memory device including the transistor 200 and the transistor 400 can retain stored data for a long time.

In FIG. 14, a wiring 3001 is electrically connected to a source of the transistor 300, and a wiring 3002 is electrically connected to a drain of the transistor 300. A wiring 3003 is electrically connected to one of a source and a drain of the transistor 200, a wiring 3004 is electrically connected to a gate of the transistor 200, and a wiring 3006 is electrically connected to the back gate of the transistor 200. A gate of the transistor 300 and the other of the source and the drain of the transistor 200 are electrically connected to one electrode of the capacitor 100. A wiring 3005 is electrically connected to the other electrode of the capacitor 100. A wiring 3007 is electrically connected to the source of the transistor 400, a wiring 3008 is electrically connected to the gate of the transistor 400, a wiring 3009 is electrically connected to the back gate of the transistor 400, and a wiring 3010 is electrically connected to the drain of the transistor 400. The wiring 3006, the wiring 3007, the wiring 3008, and the wiring 3009 are electrically connected to each other.

<Memory Device Configuration 1>

The memory device in FIG. 14 has a feature that the potential of the gate of the transistor 300 can be held, and thus enables writing, retaining, and reading of data as follows.

Writing and retaining of data are described. First, the potential of the wiring 3004 is set to a potential at which the transistor 200 is on, so that the transistor 200 is turned on. Accordingly, the potential of the wiring 3003 is supplied to a node FG where the gate of the transistor 300 and the one electrode of the capacitor 100 are electrically connected to each other. That is, predetermined charge is supplied to the gate of the transistor 300 (writing). Here, one of two kinds of charge that provide different potential levels (hereinafter referred to as low-level charge and high-level charge) is supplied. After that, the potential of the wiring 3004 is set to a potential at which the transistor 200 is off, so that the transistor 200 is turned off. Thus, the charge is retained in the node FG (retaining).

Since the off-state current of the transistor 200 is small, the charge of the node FG is retained for a long time.

Next, reading of data is described. An appropriate potential (reading potential) is supplied to the wiring 3005 while a predetermined potential (constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the wiring 3005 that is needed to turn on the transistor 300. Thus, the potential of the wiring 3005 is set to a potential $V_0$ that is between $V_{th\_H}$ and $V_{th\_L}$, whereby charge supplied to the node FG can be determined. For example, in the case where the high-level charge is supplied to the node FG in writing, the transistor 300 is turned on when the potential of the wiring 3005 becomes $V_0$ ($>V_{th\_H}$). In the case where the low-level charge is supplied to the node FG in writing, the transistor 300 still remains off even when the potential of the wiring 3005 becomes $V_0$ ($<V_{th\_L}$). Thus, the data retained in the node FG can be read by determining the potential of the wiring 3002.

By arranging the memory devices illustrated in FIG. 14 in a matrix, a memory cell array can be formed.

Note that in the case where memory cells are arrayed, it is necessary that data of a desired memory cell be read in read operation. For example, in the case of a NOR-type memory cell array, only data of a desired memory cell can be read by turning off the transistors 300 of memory cells from which data is not read. In this case, a potential at which the transistor 300 is turned off regardless of the charge supplied to the node FG, that is, a potential lower than $V_{th\_H}$ is supplied to the wiring 3005 connected to the memory cells from which data is not read. Alternatively, in the case of a NAND-type memory cell array, for example, only data of a desired memory cell can be read by turning on the transistors 300 of memory cells from which data is not read. In this case, a potential at which the transistor 300 is turned on regardless of the charge supplied to the node FG, that is, a potential higher than $V_{th\_L}$ is supplied to the wiring 3005 connected to the memory cells from which data is not read.

<Memory Device Configuration 2>

The memory devices illustrated in FIG. 14 do not necessarily include the transistor 300. Also in that case, data can be written and retained in a manner similar to that of the memory device described above.

For example, data reading in the memory device without the transistor 300 is described. When the transistor 200 is turned on, the wiring 3003 that is in a floating state and the capacitor 100 are brought into conduction, and the charge is redistributed between the wiring 3003 and the capacitor 100. As a result, the potential of the wiring 3003 is changed. The amount of change in the potential of the wiring 3003 varies depending on the potential of the one electrode of the capacitor 100 (or the charge accumulated in the capacitor 100).

For example, the potential of the wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the wiring 3003 when the potential $V_1$ is retained ($=(C_B \times V_{B0} + C \times V_1)/(C_B + C)$) is higher than the potential of the wiring 3003 when the potential $V_0$ is retained ($=(C_B \times V_{B0} + C \times V_0)/(C_B + C)$).

Then, by comparing the potential of the wiring 3003 with a predetermined potential, data can be read.

In the case of employing the configuration, a transistor using silicon may be used for a driver circuit for driving a memory cell, and a transistor using an oxide semiconductor may be stacked as the transistor 200 over the driver circuit.

When including a transistor using an oxide semiconductor and having a small off-state current, the memory device described above can retain stored data for a long time. In other words, power consumption of the memory device can be reduced because refresh operation becomes unnecessary or the frequency of refresh operation can be extremely low. Moreover, stored data can be retained for a long time even when power is not supplied (note that a potential is preferably fixed).

In the memory device, a high voltage is not needed for data writing and deterioration of elements is unlikely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the memory device of one embodiment of the present invention does not have a limit on the number of times data can be rewritten and the reliability thereof is drastically improved. Furthermore, data is written depending on the on/off state of the transistor, whereby high-speed operation can be achieved.

<Memory Device Structure>

FIG. 14 illustrates an example of the memory device of one embodiment of the present invention. The memory device includes the transistor 400, the transistor 300, the transistor 200, and the capacitor 100. The transistor 200 is provided over the transistor 300, and the capacitor 100 is provided over the transistor 300 and the transistor 200.

The transistor 300 is provided over a substrate 311 and includes a conductor 316, an insulator 314, a semiconductor region 312 that is part of the substrate 311, and low-resistance regions 318a and 318b functioning as source and drain regions.

The transistor 300 is either a p-channel transistor or an n-channel transistor.

It is preferable that a region of the semiconductor region 312 where a channel is formed, a region in the vicinity thereof, the low-resistance regions 318a and 318b functioning as source and drain regions, and the like include a semiconductor such as a silicon-based semiconductor, further preferably single crystal silicon. Alternatively, a material containing germanium (Ge), silicon germanium (SiGe), gallium arsenide (GaAs), gallium aluminum arsenide (GaAlAs), or the like may be included. Silicon whose effective mass is controlled by applying stress to the crystal lattice and thereby changing the lattice spacing may be included. Alternatively, the transistor 300 may be a high-electron-mobility transistor (HEMT) with GaAs and GaAlAs or the like. Note that an SOI substrate may be used as the substrate 311.

The low-resistance regions 318a and 318b include an element that imparts n-type conductivity, such as arsenic or phosphorus, or an element that imparts p-type conductivity, such as boron, in addition to a semiconductor material used for the semiconductor region 312.

The conductor 316 functioning as a gate electrode can be formed using a semiconductor material such as silicon including an element that imparts n-type conductivity, such as arsenic or phosphorus, or an element that imparts p-type conductivity, such as boron, or a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 300 illustrated in FIG. 14 is just an example and is not limited to the structure illustrated therein; an appropriate transistor may be used in accordance with a circuit configuration or a driving method. For example, the transistor 300 may be a fin transistor. When the memory device has the structure described in <Memory device configuration 2>, the transistor 300 is not necessarily provided.

An insulator 320, an insulator 322, an insulator 324, and an insulator 326 are stacked in this order so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 300 or the like underlying the insulator 322. For example, the top surface of the insulator 322 may be planarized by planarization treatment using a CMP method or the like to increase the level of planarity.

The insulator 324 is preferably formed using a film with a barrier property that prevents impurities such as water or hydrogen from diffusing from the substrate 311, the transistor 300, or the like into regions where the transistor 200 and the transistor 400 are provided. A barrier property refers to a function of inhibiting the diffusion of impurities such as water or hydrogen. For example, the diffusion length of hydrogen in the film with a barrier property at 350° C. or at 400° C. is less than or equal to 50 nm per hour, preferably less than or equal to 30 nm per hour, further preferably less than or equal to 20 nm per hour.

As an example of the film having a barrier property against hydrogen, silicon nitride formed by a CVD method can be given. The diffusion of hydrogen into a semiconductor element including an oxide semiconductor, such as the transistor 200, degrades the characteristics of the semiconductor element in some cases. Therefore, a film that inhibits the diffusion of hydrogen is preferably provided between the transistors 200 and 400 and the transistor 300. Specifically, the film that inhibits the diffusion of hydrogen is a film from which hydrogen is unlikely to be released.

The released amount of hydrogen can be measured by TDS, for example. The amount of hydrogen released from the insulator 324 that is converted into hydrogen molecules per unit area of the insulator 324 is less than or equal to $2 \times 10^{15}$ molecules/cm$^2$, preferably less than or equal to $1 \times 10^{15}$ molecules/cm$^2$, further preferably $5 \times 10^{14}$ molecules/cm$^2$ in TDS analysis in the range from 50° C. to 500° C., for example.

Note that the dielectric constant of the insulator 326 is preferably lower than that of the insulator 324. For example, the relative dielectric constant of the insulator 326 is preferably lower than 4, further preferably lower than 3. For example, the relative dielectric constant of the insulator 326 is preferably 0.7 times or less that of the insulator 326, further preferably 0.6 times or less that of the insulator 324. In the case where a material with a low dielectric constant is used for an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where part of a conductor functions as a wiring and part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance. Each of the plugs and wirings may be formed of a plurality of layers. For example, a conductive material is further formed after a seed layer or a barrier layer formed of a conductive material or a layer for improving the adhesion between a conductive material that is formed later and an insulator is formed to form a conductor. For example, a material selected from titanium, titanium nitride, tantalum, and tantalum nitride is formed as a first layer, and then tungsten, molybdenum, aluminum, or copper is formed, so that a conductor can be formed.

A wiring layer may be provided over the insulator 326 and the conductor 330. For example, in FIG. 14, an insulator 350, an insulator 352, and an insulator 354 are stacked in this order. Furthermore, a conductor 356 is formed in the insulator 350, the insulator 352, and the insulator 354. The conductor 356 functions as a plug or a wiring. Note that the conductor 356 may be formed using a material that is similar to or different from the materials for the conductors 328 and 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. In such a structure, the transistor 300 can be separated from the transistors 200 and 400 by a barrier layer, so that the diffusion of hydrogen from the transistor 300 into the transistors 200 and 400 can be inhibited.

Note that as the conductor having a barrier property against hydrogen, tantalum nitride is preferably used, for example. By stacking tantalum nitride and tungsten, which has high conductivity, the diffusion of hydrogen from the transistor 300 can be inhibited while the conductivity of a wiring is ensured. In this case, a tantalum nitride layer having a barrier property against hydrogen is preferably in contact with the insulator 350 having a barrier property against hydrogen.

An insulator 358, an insulator 210, the insulator 212, the insulator 214, and the insulator 216 are stacked in this order over the insulator 354. A material having a barrier property against oxygen or hydrogen is preferably used for any of the insulator 358, the insulator 210, the insulator 212, the insulator 214, and the insulator 216.

The insulator 358, the insulator 212, and the insulator 214 are each preferably formed using, for example, a film having a barrier property that prevents impurities such as water or hydrogen from diffusing from the substrate 311, a region where the transistor 300 is provided, or the like into the regions where the transistor 200 and the transistor 400 are provided. Therefore, the insulator 358, the insulator 212, and the insulator 214 can be formed using a material similar to that for the insulator 324.

As an example of the film having a barrier property against hydrogen, silicon nitride formed by a CVD method can be given. The diffusion of hydrogen into a semiconductor element including an oxide semiconductor, such as the transistor 200, degrades the characteristics of the semiconductor element in some cases. Therefore, a film that inhibits the diffusion of hydrogen is preferably provided between the transistors 200 and 400 and the transistor 300. Specifically, the film that inhibits the diffusion of hydrogen is a film from which hydrogen is unlikely to be released.

As the film having a barrier property against hydrogen, for example, as each of the insulator 212 and the insulator 214, a metal oxide such as aluminum oxide, hafnium oxide, or tantalum oxide is preferably used.

In particular, aluminum oxide has an excellent blocking effect that prevents the passage of oxygen and impurities such as water or hydrogen that cause a change in electrical characteristics of the transistor. Accordingly, the use of aluminum oxide can prevent entry of impurities such as water or hydrogen into the transistors 200 and 400 in and after a manufacturing process of the transistor. In addition, release of oxygen from the oxide in the transistor 200 can be inhibited. Therefore, aluminum oxide is suitably used as a protective film for the transistors 200 and 400.

For example, the insulator 210 and the insulator 216 can be formed using a material similar to that for the insulator 320. The use of a material with a relatively low dielectric constant for the insulators can reduce the parasitic capacitance between wirings. For example, a silicon oxide film, a silicon oxynitride film, or the like can be used as the insulator 216.

A conductor 218, conductors included in the transistor 200 and the transistor 400 (the conductor 205, a conductor 205c, a conductor 205d, and a conductor 205e), and the like are embedded in the insulator 358, the insulator 210, the insulator 212, the insulator 214, and the insulator 216. Note that the conductor 218 functions as a plug or a wiring that is electrically connected to the capacitor 100 or the transistor 300. The conductor 218 can be formed using a material similar to that for the conductor 328 and the conductor 330.

In particular, the conductor 218 in a region in contact with the insulator 358, the insulator 212, and the insulator 214 is preferably a conductor having a barrier property against oxygen, hydrogen, and water. In such a structure, the transistor 300 and the transistor 200 can be completely separated by the layer having a barrier property against oxygen, hydrogen, and water, so that the diffusion of hydrogen from the transistor 300 into the transistors 200 and 400 can be inhibited.

The transistors 200 and 400 are provided over the insulator 216. The insulators 282 and 284 are provided over the transistors 200 and 400. The insulators 282 and 284 can be formed using materials similar to those for the insulators 214 and 212. Thus, the insulators 282 and 284 function as protective films for the transistors 200 and 400. Furthermore, as illustrated in FIG. 14, the insulator 214 and the insulators 282 and 284 are preferably in contact with each other by forming openings in the insulators 216, 220, 222, 224, 272, 274, and 280. In such a structure, the transistors 200 and 400 can be sealed with the insulators 214, 282, and 284, and entry of impurities such as water or hydrogen can be prevented.

An insulator 110 is provided over the transistor 200 and the transistor 400. The insulator 110 can be formed using a material similar to that for the insulator 320. The use of a material with a relatively low dielectric constant for the insulator can reduce the parasitic capacitance between wirings. For example, a silicon oxide film or a silicon oxynitride film can be used as the insulator 110.

A conductor 285 and the like are embedded in the insulator 220, the insulator 222, the insulator 224, the insulator 272, the insulator 274, and the insulator 110.

Note that the conductor 285 functions as a plug or a wiring that is electrically connected to the capacitor 100, the transistor 200, or the transistor 300. The conductor 285 can be formed using a material similar to that for the conductor 328 and the conductor 330.

For example, in the case where the conductor 285 is formed to have a stacked-layer structure, it preferably includes a conductor that is unlikely to be oxidized (that has high oxidation resistance). It is particularly preferable that a conductor having high oxidation resistance be provided so as to be in contact with the insulator 224 including an excess oxygen region. Such a structure permits inhibition of absorption of excess oxygen from the insulator 224 by the conductor 285. Furthermore, the conductor 285 preferably includes a conductor having a barrier property against hydrogen. In particular, when a conductor having a barrier property against impurities such as water or hydrogen is provided in contact with the insulator 224 including an excess oxygen region, the diffusion of impurities in the conductor 285 and part of the conductor 285 and the diffusion of impurities from the outside through the conductor 285 can be inhibited.

A conductor 287, the capacitor 100, and the like are provided over the insulator 110 and the conductor 285. The capacitor 100 includes a conductor 112, an insulator 130, an insulator 132, an insulator 134, and a conductor 116. The conductor 112 and the conductor 116 function as the electrodes of the capacitor 100, and the insulator 130, the insulator 132, and the insulator 134 function as dielectrics of the capacitor 100.

The conductor 287 functions as a plug or a wiring that is electrically connected to the capacitor 100, the transistor 200, or the transistor 300. The conductor 112 functions as the one electrode of the capacitor 100. The conductor 287 and the conductor 112 can be formed at the same time.

For the conductor 287 and the conductor 112, a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

The insulator 130, the insulator 132, and the insulator 134 can each be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the use of a high dielectric constant (high-k) material, such as aluminum oxide, for the insulator 132 can increase the capacitance per unit area of the capacitor 100. Furthermore, a material having high dielectric strength, such as silicon oxynitride, is preferably used for the insulator I30 and the insulator 134. When a ferroelectric is located between insulators with high dielectric strength, electrostatic breakdown of the capacitor 100 can be suppressed and the capacitor can have large capacitance.

The conductor 116 is provided so as to cover the top and side surfaces of the conductor 112 with the insulator 130, the insulator 132, and the insulator 134 therebetween. In the structure where the side surfaces of the conductor 112 are wrapped by the conductor 116 with the insulators therebetween, capacitance is also formed on the side surfaces of the conductor 112, resulting in an increase in the capacitance per unit projected area of the capacitor. Thus, the memory device can be reduced in area, highly integrated, and miniaturized.

Note that the conductor 116 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 116 is formed concurrently with another component such as a conductor, Cu, Al, or the like, which is a low-resistance metal material, may be used.

An insulator 150 is provided over the conductor 116 and the insulator 134. The insulator 150 can be formed using a material similar to that for the insulator 320. The insulator 150 may function as a planarization film that covers roughness due to underlying layers.

The above is the description of the structure example. With the use of the structure, a change in electrical characteristics can be suppressed and reliability can be improved in a memory device including a transistor including an oxide semiconductor. Alternatively, a memory device with low power consumption can be provided.

At least part of this embodiment can be implemented in combination with any of the other embodiments described in this specification as appropriate.

Embodiment 4

In this embodiment, one embodiment of a semiconductor device is described with reference to FIGS. 15A and 15B and FIGS. 16A and 16B.

<Semiconductor Wafer and Chip>

Figure 15A:
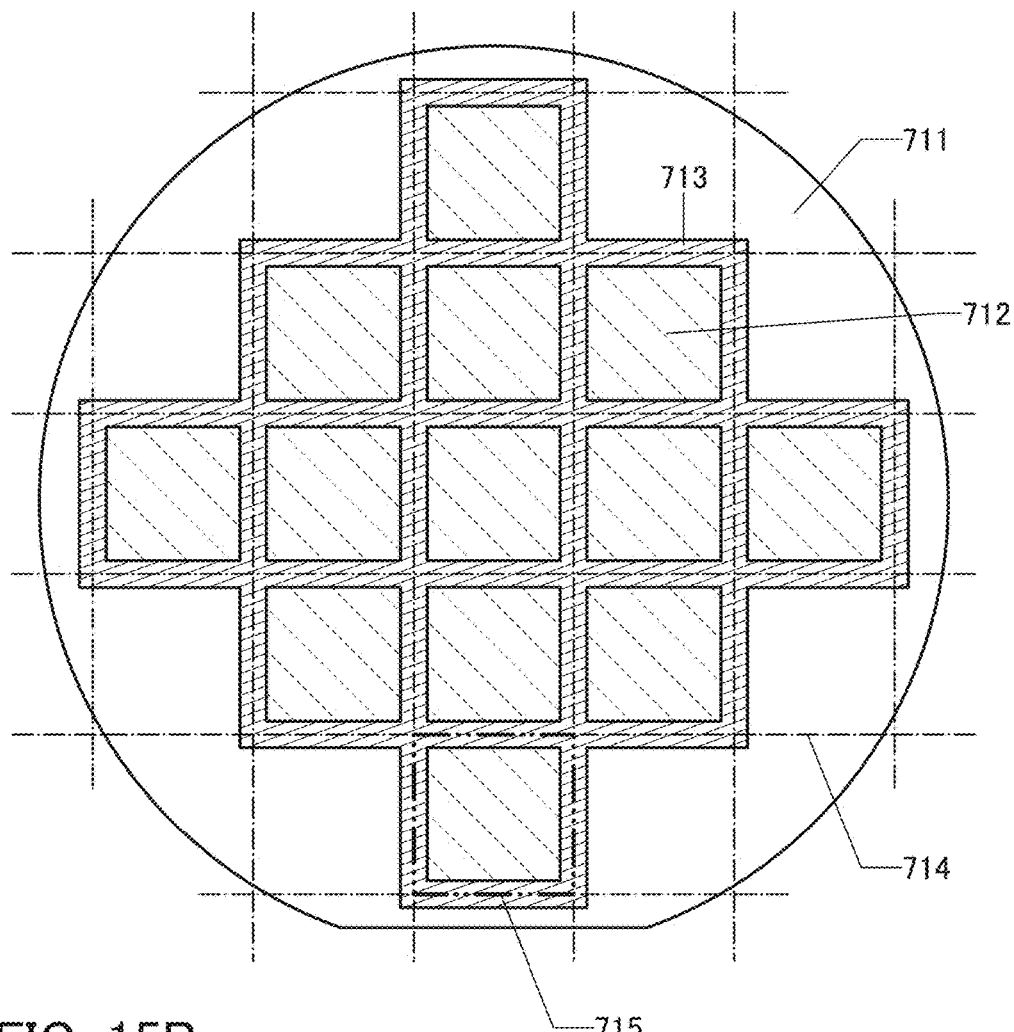
FIGS. 15A and 15B are top views of a semiconductor wafer of one embodiment of the present invention.

FIG. 15A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device or a memory device according to one embodiment of the present invention, a CPU including the semiconductor device, or the like can be provided in the circuit region 712.

Figure 15B:
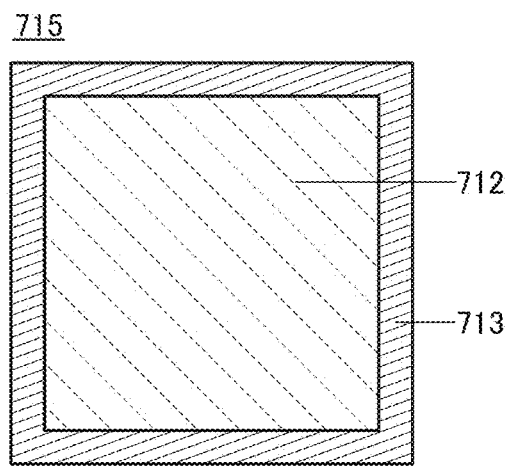

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 15B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield that is caused by the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation regions 713 allows a reduction in the usage of the pure water. Therefore, the cost of manufacturing semiconductor devices can be reduced. Thus, semiconductor devices can be manufactured with improved productivity.

<Electronic Component>

Figure 16A:
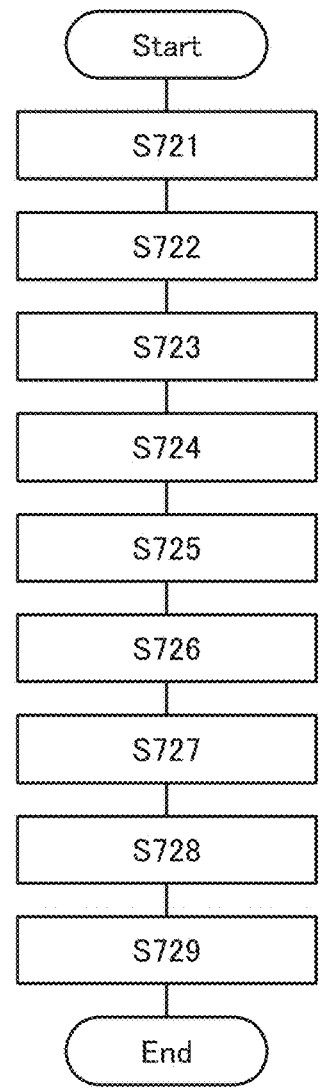
FIG. 16A is a flowchart showing a manufacturing process of an electronic component.

An example of an electronic component using the chip 715 is described with reference to FIGS. 16A and 16B. Note that the electronic component is also referred to as a semiconductor package or an IC package. The electronic component has a plurality of standards, names, and the like depending on a terminal extraction direction, a terminal shape, and the like.

The electronic component is completed when the semiconductor device described in any of the above embodiments is combined with components other than the semiconductor device in an assembly process (post-process).

The post-process is described with reference to a flow chart in FIG. 16A. After the semiconductor device of one embodiment of the present invention and the like are provided over the substrate 711 in a pre-process, a back surface grinding step in which a back surface (a surface where the semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. For example, ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip to the lead can be protected from external mechanical force, and deterioration of characteristics (decrease in reliability) due to moisture, dust, or the like can be reduced.

Subsequently, the lead of the lead frame is plated in a lead plating step (Step S726). Through the plating process, rust of the lead can be prevented, and soldering for mounting the chip on a printed circuit board in a later step can be performed with higher reliability. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 16B:
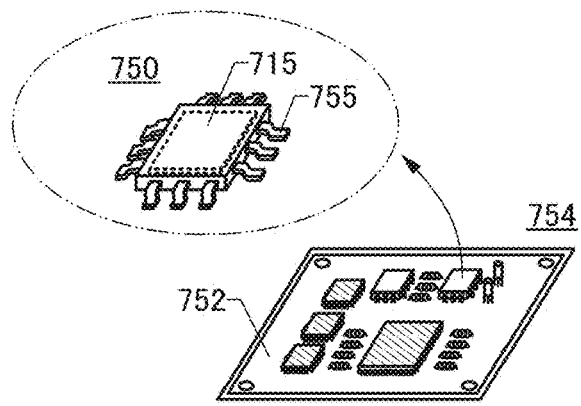
FIG. 16B is a schematic perspective view of the electronic component.

FIG. 16B is a perspective schematic diagram of a completed electronic component. FIG. 16B is a perspective schematic diagram illustrating a quad flat package (QFP) as an example of the electronic component. An electronic component 750 in FIG. 16B includes a lead 755 and the chip 715. The electronic component 750 may include more than one chip 715.

The electronic component 750 in FIG. 16B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

At least part of this embodiment can be implemented in combination with any of the other embodiments described in this specification as appropriate.

Example 1

In this example, samples were fabricated by forming an In—Ga—Zn oxide film (hereinafter referred to as an IGZO film) over a silicon oxide film, removing the IGZO film, forming an aluminum oxide film, and removing the aluminum oxide film, and the analysis results of the samples are described.

First of all, the above samples were fabricated and evaluated by TDS. A method for fabricating Samples 1A and 1B used for the TDS evaluation is described below.

First, for each of Samples 1A and 1B, by thermal oxidation of a silicon wafer, a silicon oxide film was formed on a surface of the silicon wafer to have a target thickness of 100 nm. The thermal oxidation was performed at 950° C. in an oxygen atmosphere containing HCl at 3 volume % for 3 hours and 39 minutes.

Furthermore, the following steps were performed on Sample 1B.

First, an IGZO film was formed to have a target thickness of 40 nm by a DC sputtering method. Note that a target whose atomic ratio of In to Ga and Zn was 1:3:4 was used for the formation of the IGZO film (hereinafter, the IGZO film is referred to as an IGZO film (134)). As the deposition gases, an argon gas at 40 sccm and an oxygen gas at 5 sccm were used. The deposition pressure was 0.7 Pa (measured by Miniature Gauge MG-2 manufactured by CANON ANELVA CORPORATION). The deposition power was 500 W. The substrate temperature was 200° C. The distance between the target and the substrate was 60 mm.

Furthermore, an IGZO film was successively formed to have a target thickness of 20 nm by a DC sputtering method. Note that a target whose atomic ratio of In to Ga and Zn was 1:1:1 was used for the formation of the IGZO film (hereinafter, the IGZO film is referred to as an IGZO film (111)). As the deposition gases, an argon gas at 30 sccm and an oxygen gas at 15 sccm were used. The deposition pressure was 0.7 Pa (measured by Miniature Gauge MG-2 manufactured by CANON ANELVA CORPORATION). The deposition power was 500 W. The substrate temperature was 300° C. The distance between the target and the substrate was 60 mm.

Next, heat treatment was performed at 400° C. in a nitrogen atmosphere for one hour. In addition, heat treatment was performed at 400° C. in an oxygen atmosphere for one hour.

Next, the IGZO film (134) and the IGZO film (111) were removed by a dry etching method.

The removal of the IGZO film (134) and the IGZO film (111) was performed in two steps by etching treatment and ashing treatment. The conditions of the etching treatment were as follows: the pressure was 1.2 Pa; the RF power was 1000 W on the upper side and 400 W on the lower side; and as the etching gases, a methane gas at 20 sccm and an argon gas at 80 sccm were used. The etching treatment was performed until 23 seconds after an endpoint was detected by a device. The conditions of the ashing treatment were as follows: the pressure was 2.6 Pa; the RF power was 500 W on the upper side and 50 W on the lower side; the oxygen gas was 200 sccm; and the treatment time was 60 seconds.

Next, an aluminum oxide film was formed to have a target thickness of 140 nm by a RF sputtering method. Note that an $Al_2O_3$ target was used for the formation of the aluminum oxide film. As the deposition gases, an argon gas at 25 sccm and an oxygen gas at 25 sccm were used. The deposition pressure was 0.4 Pa (measured by B-A Gauge BRG-1B manufactured by CANON ANELVA CORPORATION). The deposition power was 2500 W. The substrate temperature was 250° C. The distance between the target and the substrate was 60 mm.

Next, heat treatment was performed at 400° C. in an oxygen atmosphere for one hour.

Next, wet etching in which the solution temperature was 100° C. was performed to remove the aluminum oxide film. For the wet etching, a mixed acid aluminum solution (aqueous solution containing 2.0 weight % nitric acid, 9.8 weight % acetic acid, and 72.3 weight % phosphoric acid) produced by Wako Pure Chemical Industries, Ltd. was used.

Figure 17:
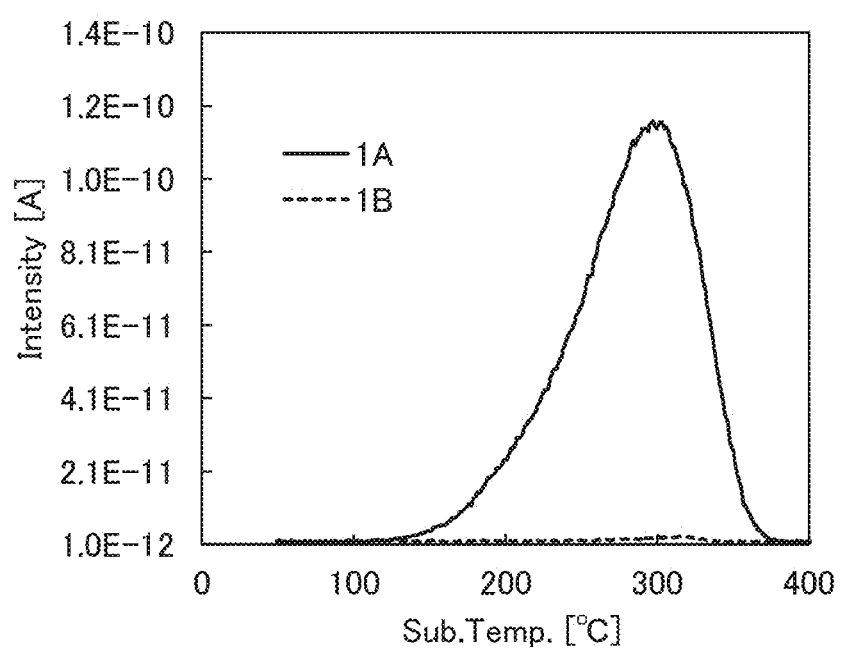
FIG. 17 is a graph showing results of TDS analysis in Example.

Sample 1A and Sample 1B formed in the above manner were subjected to TDS analysis, and the results are shown in FIG. 17. Note that in the TDS analysis, the amount of a released gas with a mass-to-charge ratio m/z of 32, which corresponds to an oxygen molecule, was measured. In FIG. 17, the horizontal axis represents substrate heating temperature [° C.] and the vertical axis represents intensity proportional to the amount of the released gas.

As shown in FIG. 17, Sample 1A shows a profile with a peak around a substrate temperature of 300° C., and release of oxygen molecules was observed. In contrast, in a profile of Sample 1B, a peak was not observed, and release of oxygen molecules was not observed.

As described in the above embodiments, it can be expected that oxygen is added to the silicon oxide film by forming the aluminum oxide film over the silicon oxide film by a sputtering method. However, the amount of oxygen molecules released from Sample 1B in which the aluminum oxide film was formed over the silicon oxide film is extremely smaller than that of Sample 1A in which the aluminum oxide film was not formed over the silicon oxide film.

This is probably because a damaged region was formed in the vicinity of the surface of the silicon oxide film of Sample 1B by the formation of the IGZO films and the dry etching treatment of the IGZO films.

Thus, next, the damaged region on the surface of the silicon oxide film was evaluated by ESR analysis. For the ESR analysis, Sample 1C and Sample 1D were used. Sample 1C was fabricated by the same method as that of Sample 1A. Like Sample 1B, Sample 1D is a sample in which a silicon oxide film was formed on a silicon wafer, the IGZO film (134) and the IGZO film (111) were formed thereover in this order, and the IGZO film (134) and the IGZO film (111) were removed.

Note that the removal of the IGZO film (134) and the IGZO film (111) of Sample 1D was performed in two steps that are etching treatment and ashing treatment. The conditions of the etching treatment were as follows: the pressure was 0.6 Pa; the RF power was 1000 W on the upper side and 400 W on the lower side; and as the etching gases, a methane gas at 18 sccm and an argon gas at 42 sccm were used. The etching treatment was performed until 13 seconds after an endpoint was detected by a device. The conditions of the ashing treatment were as follows: the pressure was 2.6 Pa; the RF power was 500 W on the upper side and 50 W on the lower side; the oxygen gas was 200 sccm; and the treatment time was 60 seconds.

Figure 18:
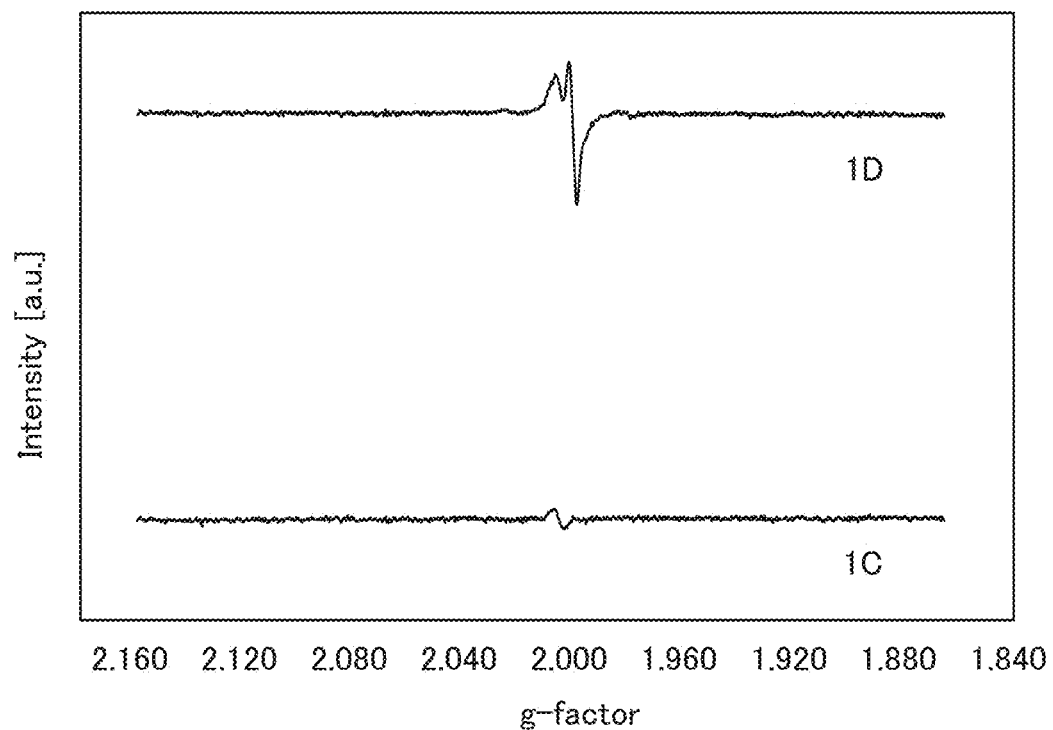
FIG. 18 is a graph showing results of ESR measurement in Example.

Sample 1C and Sample 1D formed in the above manner were subjected to ESR analysis, and the results are shown in FIG. 18. The ESR analysis was performed under the following conditions: the measurement temperature was 10 K; the microwave power was 0.1 mW; and the frequency was 9.56 GHz. In FIG. 18, the horizontal axis represents a g-factor, and the vertical axis represents arbitrary intensity.

As shown in FIG. 18, a large peak was not observed for Sample 1C, but a large peak was observed at a g-factor of approximately 2.001 in Sample 1D. The peak at a g-factor of approximately 2.001 in Sample 1D is referred to as E' center and is due to the dangling bond of silicon. That is, a larger number of dangling bonds were formed on the surface of the silicon oxide film in Sample 1D than in Sample 1C. This shows that a damaged region was formed on the surface of the silicon oxide film in Sample 1D as described in the above embodiments. Thus, in Sample 1B, one reason why release of oxygen was not observed by TDS measurement in Sample 1B is probably the formation of the damaged region on the surface of the silicon oxide film.

The spin density at a g-factor of approximately 2.001 that was measured in Sample 1C is $2.1\times10^{17}$ [spins/cm$^3$]. The spin density at a g-factor of approximately 2.001 that was measured in Sample 1D is $1.0\times10^{16}$ [spins/cm$^3$]. Thus, as described in the above embodiments, in a transistor, at the surface of an insulating film (e.g., a silicon oxide film) whose top surface is in contact with an oxide film (e.g., the IGZO film (134)) or the like, the spin density at a g-factor of approximately 2.0 is preferably less than or equal to $2.0\times10^{17}$ [spins/cm$^3$].

Next, substrate side depth profile (SSDP)-SIMS analysis (SIMS analysis from a back side) was performed to evaluate the state of oxygen diffusion in the silicon oxide film. Sample 1E and Sample 1F were used for the SSDP-SIMS analysis. Sample 1E was fabricated by forming an aluminum oxide film over a sample fabricated by the same method as that of Sample 1C. Like Sample 1D, Sample 1F is a sample in which a silicon oxide film, the IGZO film (134), and the IGZO film (111) were formed over a silicon wafer in this order, the IGZO film (134) and the IGZO film (111) were removed, and an aluminum oxide film was formed.

Note that the aluminum oxide film of Sample 1E and Sample 1F was formed to have a target thickness of 140 nm by an RF sputtering method. Note that an Al$_2$O$_3$ target was used for the formation of the aluminum oxide film. As the deposition gases, an argon gas at 25 sccm and an oxygen gas at 25 sccm were used. The deposition pressure was 0.4 Pa (measured by B-A Gauge BRG-1B manufactured by CANON ANELVA CORPORATION). The deposition power was 2500 W. The substrate temperature was 250° C. The distance between the target and the substrate was 60 mm. Note that as the oxygen gas used as the sputtering gas, a gas whose oxygen molecule ($^{18}$O$_2$) includes oxygen atoms having a mass number of 18 was used.

Furthermore, in Sample 1E and Sample 1F, after the formation of the aluminum oxide film, heat treatment was performed at 400° C. in an oxygen atmosphere for one hour.

Figure 19:
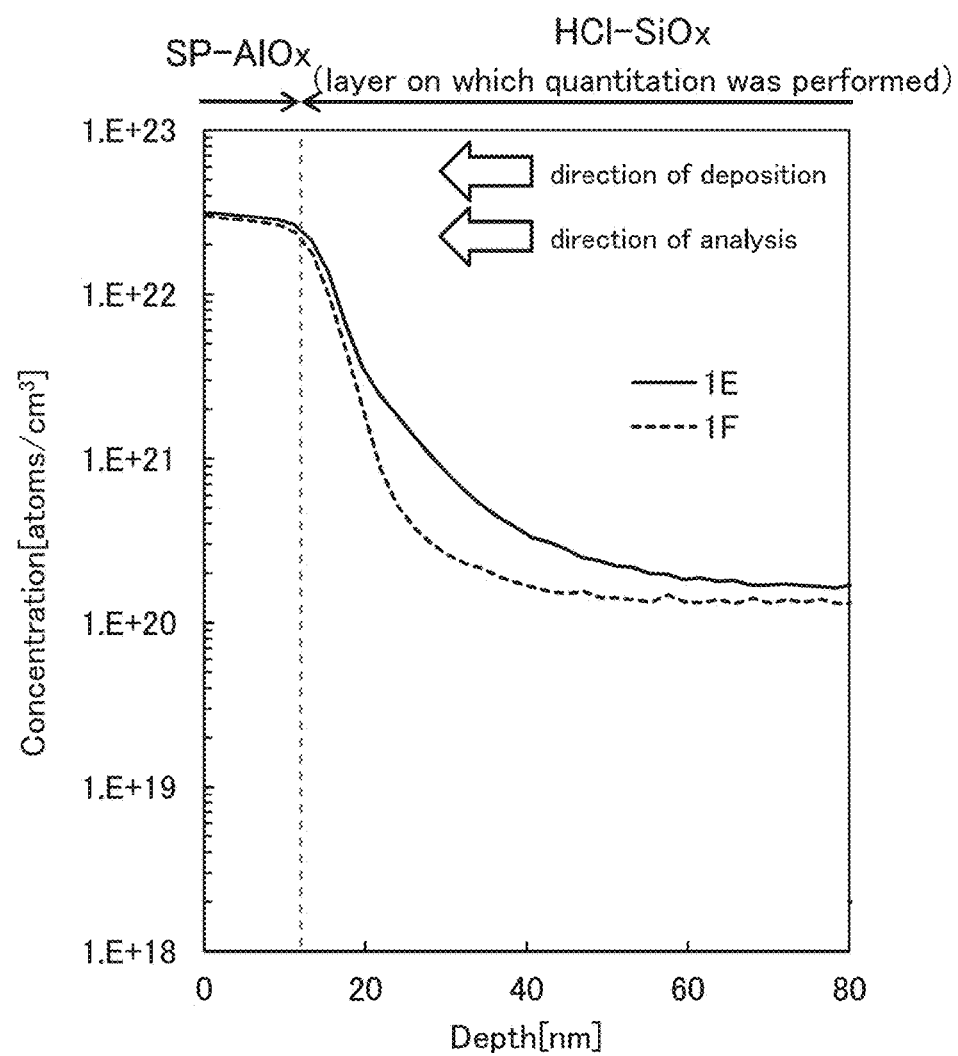
FIG. 19 is a graph showing results of SSDP-SIMS measurement in Example.

FIG. 19 shows $^{18}$O detected in the SSDP-SIMS analysis performed on Sample 1E and Sample 1F fabricated in the above manner. In FIG. 19, the horizontal axis represents a depth [nm], and the vertical axis represents the concentration of $^{18}$O [atoms/cm$^3$]. Note that SIMS analysis was performed by using an ADEPT-1010 quadrupole mass spectrometry instrument manufactured by ULVAC-PHI, Inc.

As shown in FIG. 19, the diffusion amount of $^{18}$O is smaller in Sample 1F than in Sample 1E. That is, in Sample 1F, the thermal diffusion of oxygen added to the vicinity of the surface of the silicon oxide film by the formation of the aluminum oxide film is inhibited. This shows that when the IGZO film (134) and the IGZO film (111) were formed by a sputtering method and etched using a methane gas and an argon gas, a damaged region preventing oxygen diffusion was formed in the vicinity of the surface of the silicon oxide film.

Next, time-of-flight secondary ion mass spectrometry (TOF-SIMS) was used to evaluate the damaged region of the surface of the silicon oxide film. For the TOF-SIMS analysis, Sample 1G, Sample 1H, and Sample 1J were used. Sample 1G is a sample having a similar structure to that of Sample 1C. Sample 1H is a sample having a similar structure to that of Sample 1D.

In Sample 1J, the formation of the IGZO film (134) and the IGZO film (111) and the performance of the heat treatment after the formation of the IGZO films, which were performed on Sample 1H, were not performed, and dry etching treatment similar to that of Sample 1H was performed on the silicon oxide film. Note that etching treatment that is the first step of the dry etching of Sample 1J was performed for 100 seconds.

Figure 20:
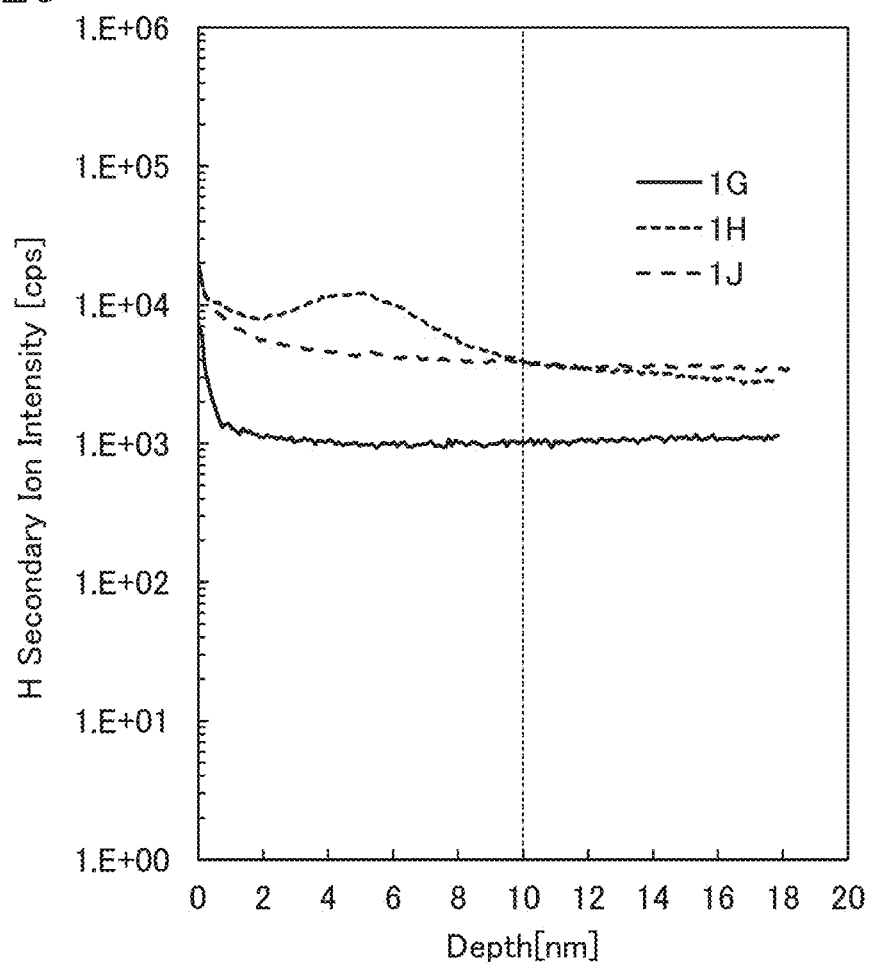
FIG. 20 is a graph showing results of TOF-SIMS measurement in Example.

FIG. 20 shows the results of detection of hydrogen in the vicinity of the surface of the silicon oxide film by the TOF-SIMS analysis performed on Sample 1G, Sample 1H, and Sample 1J that were fabricated in the above manner. In FIG. 20, the horizontal axis represents a depth [nm] from the surface of the silicon oxide film, and the vertical axis represents secondary ion intensity of hydrogen [cps]. For the TOF-SIMS analysis, TOF-SIMS300 manufactured by ION-TOF GmbH was used and Bi was used as a primary ion source.

Overall, Sample 1J in which formation of the silicon oxide film and etching treatment using a methane gas were performed has higher secondary ion intensity of hydrogen than Sample 1G in which only formation the silicon oxide film was performed. Furthermore, the secondary ion intensity of hydrogen of Sample 1H in which the IGZO film (134) and the IGZO film (111) were formed and then etching treatment using a methane gas was performed has a large peak at a depth of the vicinity of 5 nm from the surface of the silicon oxide film. The tails of the peak extend from a depth of approximately 0 nm to 10 nm from the surface of the silicon oxide film as a reference.

As described above, unlike in other samples, in Sample 1H, a region having high hydrogen concentration was formed in the vicinity of the surface of the silicon oxide film. When the results of FIGS. 17 to 19 are also taken into consideration, it can be found that the region having high hydrogen concentration in Sample 1H corresponds to the damaged region described in the above embodiments. A region having high hydrogen concentration was not formed in the vicinity of the surface of the silicon oxide film of Sample 1J that was also subjected to the dry etching using a methane gas; thus, it can be inferred that the damaged region was formed in the vicinity of the surface of the silicon oxide film because the IGZO film (134) and the IGZO film (111) were formed over the silicon oxide film by sputtering and were subjected to dry etching treatment.

Next, change in the results of TDS measurement due to the removal of the damaged region formed in the vicinity of the surface of the silicon oxide film was examined. For the TDS measurement, Sample 1K, Sample 1L, Sample 1M, Sample 1N, and Sample 1P were used. Here, Sample 1K is a sample in which the IGZO film (134) and the IGZO film (111) were not formed over the silicon oxide film. Sample 1L, Sample 1M, and Sample 1N are each a sample in which the IGZO film (134) and the IGZO film (111) were formed over the silicon oxide film and a surface layer of the silicon oxide film was also removed when the IGZO film (134) and the IGZO film (111) were removed. Note that Sample 1L, Sample 1M, and Sample 1N differ from each other in the thickness of the removed surface layer of the silicon oxide film. Sample 1P is a sample in which the IGZO film (134) and the IGZO film (111) were formed over a silicon oxide film, and dry etching was performed using a methane gas to remove the IGZO film (134) and the IGZO film (111) and thus a surface layer of the silicon oxide film was not removed. The methods for fabricating Sample 1K, Sample 1L, Sample 1M, Sample 1N, and Sample 1P are described below.

First, in all samples, by thermal oxidation of a silicon wafer, a silicon oxide film was formed on a surface of the silicon wafer. The silicon oxide film was formed under conditions similar to those of Sample 1A.

Next, in Sample 1L, Sample 1M, Sample 1N, and Sample 1P, the IGZO film (134) was formed, and the IGZO film (111) was formed. The IGZO film (134) and the IGZO film (111) were formed under conditions similar to those of Sample 1B.

Then, in Sample 1L, Sample 1M, Sample 1N, and Sample 1P, heat treatment was performed at 400° C. in a nitrogen atmosphere for one hour, and heat treatment was performed at 400° C. in an oxygen atmosphere for one hour.

Next, in Sample 1L, Sample 1M, Sample 1N, and Sample 1P, dry etching treatment was performed to remove the IGZO film (134) and the IGZO film (111). The IGZO film (134) and the IGZO film (111) were removed under conditions similar to those of Sample 1D.

Then, in Sample 1L, Sample 1M, and Sample 1N, wet etching treatment was performed to remove the surface layer of the silicon oxide film. In Sample 1L, the removal was performed to a depth of 20 nm from the surface of the silicon oxide film. In Sample 1M, the removal was performed to a depth of 15 nm from the surface of the silicon oxide film. In Sample 1N, the removal was performed to a depth of 8 nm from the surface of the silicon oxide film. The wet etching of the silicon oxide film was performed at room temperature using a 0.1% aqueous solution of ammonium hydrogen fluoride ($NH_4HF_2$) (product name: LAL15, produced by Stella Chemifa Corporation) for an etchant.

Next, in all samples, an aluminum oxide film was formed, and then heat treatment was performed in an oxygen atmosphere. The formation of the aluminum oxide film and the heat treatment after the formation of the aluminum oxide film were performed under the similar conditions to those of Sample 1B.

Then, in all samples, wet etching treatment was performed to remove the aluminum oxide film. The aluminum oxide film was removed under similar conditions to those of Sample 1B.

Figure 21:
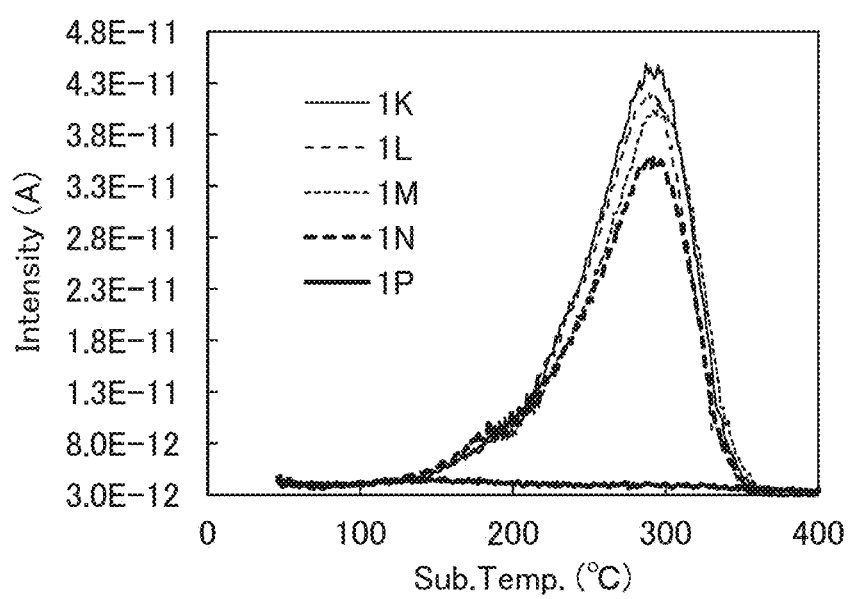
FIG. 21 is a graph showing results of TDS analysis in Example.

Sample 1K, Sample 1L, Sample 1M, Sample 1N, and Sample 1P formed in the above manner were subjected to TDS analysis, and the results are shown in FIG. 21. Note that in the TDS analysis, the amount of a released gas with a mass-to-charge ratio m/z of 32, which corresponds to an oxygen molecule, was measured. In FIG. 21, the horizontal axis represents substrate heating temperature [° C.] and the vertical axis represents intensity proportional to the amount of the released gas with a mass-to-charge ratio.

As shown in FIG. 21, Sample 1K, Sample 1L, Sample 1M, and Sample 1N each show a profile with a peak around a substrate temperature of 300° C., and release of oxygen molecules was observed. Here, Sample 1K has the highest peak around a substrate temperature of 300° C., and the peak becomes lower in the order of Sample 1L, Sample 1M, and Sample 1N. The amount of oxygen molecules released from Sample 1K was $9.0 \times 10^{14}$ [molecules/cm$^2$], the amount of oxygen molecules released from Sample 1L was $8.4 \times 10^{14}$ [molecules/cm$^2$], the amount of oxygen molecules released from Sample 1M was $8.3 \times 10^{14}$ [molecules/cm$^2$], and the amount of oxygen molecules released from Sample 1N was $8.0 \times 10^{14}$ [molecules/cm$^2$]. In contrast, in a profile of Sample 1P, a peak was not observed, and release of oxygen molecules was not observed.

In Sample 1K in which the formation and removal of the IGZO films were not performed, as in Sample 1A, release of oxygen molecules was observed. In contrast, in Sample 1P in which the formation and removal of the IGZO films were performed and the damaged region was formed in the vicinity of the surface of the silicon oxide film, as in Sample 1B, release of oxygen molecules was not observed.

In Sample 1L, Sample 1M, and Sample 1N in which the formation and removal of the IGZO films were performed and the damaged region of the silicon oxide film was removed, the larger the thickness of the removed damaged region was, the more oxygen molecules were released.

Thus, it is shown that by removing the damaged region formed in the vicinity of the surface of the silicon oxide film, oxygen was able to be released from the silicon oxide film. This indicates that, as described in the above embodiment, oxygen can be supplied to the IGZO film over the silicon oxide film from which the damaged region is removed. Furthermore, by taking the results shown in FIG. 20 also into consideration, the damaged region can be removed by removing the silicon oxide film to a depth of at least 5 nm, preferably 10 nm, further preferably 20 nm from the surface of the silicon oxide film.

Example 2

In this example, as the transistors of one embodiment of the present invention, a plurality of samples having different thicknesses T2 illustrated in FIG. 1D were fabricated, observation and evaluation of the electrical characteristics were performed, and the results are described. The transistor 200a illustrated in FIGS. 1A to 1D can be referred to for the structure of the transistors, and FIGS. 4A to 4H, FIGS. 5A to 5F, FIGS. 6A and 6D, and other drawings can be referred to for the method for fabricating the transistors.

In this example, Sample 2A in which T2=T1, Sample 2B in which T2>T1−T2, Sample 2C in which T2<T1−T2 (note that T2>0), and Sample 2D in which T2=0 were fabricated.

First, heat treatment was performed on a silicon substrate having p-type conductivity, so that a silicon oxide film was formed on the surface of the silicon substrate.

Next, as the insulator 214, a 50-nm-thick aluminum oxide film was formed over the silicon oxide film by a sputtering method.

Then, as the insulator 216, a 160-nm-thick silicon oxynitride film was formed over the insulator 214 by a PECVD method. Then, an opening was formed in the insulator 216 by a photolithography method.

Next, a 5-nm-thick titanium nitride film and a 250-nm-thick tungsten film were formed in this order. Then, CMP treatment was performed, so that a stacked-layer film of titanium nitride and tungsten was formed in the opening as the conductor 205 (see FIGS. 4A and 4B).

Next, as the insulator 220, a 10-nm-thick silicon oxynitride film was formed over the insulator 216 and the conductor 205 by a PECVD method.

Then, as the insulator 222, a 20-nm-thick hafnium oxide film was formed over the insulator 220 by an ALD method. Next, as the insulating film 224A, a 30-nm-thick silicon oxynitride film was formed over the insulator 222 by a PECVD method (see FIGS. 4C and 4D).

Then, heat treatment was performed in an oxygen atmosphere at 550° C. for one hour.

Next, a 40-nm-thick In—Ga—Zn oxide film was formed as the oxide film 230A by a DC sputtering method. Note that a target whose atomic ratio of In to Ga and Zn was 1:3:4 was used for the formation of the In—Ga—Zn oxide film. As the deposition gases, an argon gas at 40 sccm and an oxygen gas at 5 sccm were used. The deposition pressure was 0.7 Pa (measured by Miniature Gauge MG-2 manufactured by CANON ANELVA CORPORATION). The deposition power was 500 W. The substrate temperature was 200° C. The distance between the target and the substrate was 60 mm.

Next, a 20-nm-thick In—Ga—Zn oxide film was formed as the oxide film 230B by a DC sputtering method. Note that a target whose atomic ratio of In to Ga and Zn was 1:1:1 was used for the formation of the In—Ga—Zn oxide film. As the deposition gases, an argon gas at 30 sccm and an oxygen gas at 15 sccm were used. The deposition pressure was 0.7 Pa (measured by Miniature Gauge MG-2 manufactured by CANON ANELVA CORPORATION). The deposition power was 500 W. The substrate temperature was 300° C. The distance between the target and the substrate was 60 mm.

Next, heat treatment was performed at 550° C. in a nitrogen atmosphere for one hour. In addition, heat treatment was performed at 550° C. in an oxygen atmosphere for one hour.

Then, as the conductive film 240A, a 50-nm-thick tungsten film was formed by a DC sputtering method (see FIGS. 4E and 4F).

Next, an opening overlapping with the conductor 205 was formed in the conductive film 240A by a photolithography method.

Next, part of the oxide film 230B and part of the conductive film 240A were processed into island shapes by a photolithography method, so that the oxide 230b, the conductor 240a, and the conductor 240b were formed (see FIGS. 4G and 4H). Here, for the etching, dry etching treatment was used. When the oxide 230b was formed, part of the surface of the oxide film 230A was also removed by dry etching treatment, so that the oxide film 230D was formed.

Then, heat treatment was performed in a nitrogen atmosphere at 400° C. for one hour.

Next, a 5-nm-thick In—Ga—Zn oxide film was formed as the oxide film 230C by a DC sputtering method. Note that a target whose atomic ratio of In to Ga and Zn was 1:3:2 was used for the formation of the In—Ga—Zn oxide film. As the deposition gases, an argon gas at 30 sccm and an oxygen gas at 15 sccm were used. The deposition pressure was 0.7 Pa. The deposition power was 500 W. The substrate temperature was 200° C. The distance between the target and the substrate was 60 mm.

Then, as the insulating film 250A, a 13-nm-thick silicon oxynitride film was formed by a PECVD method (see FIGS. 5A and 5B).

Next, a 30-nm-thick titanium nitride film and a 135-nm-thick tungsten film were formed in this order. Then, the stacked-layer film of titanium nitride and tungsten was processed by a photolithography method, so that the conductor 260 was formed (see FIGS. 5C and 5D).

Next, the oxide film 230D, the oxide film 230C, and the insulating film 250A were processed into island shapes by a photolithography method, so that the oxide 230a, the oxide 230c, and the insulator 250 were formed (see FIGS. 5E and 5F). Here, for the etching, dry etching treatment was used. Dry etching treatment was performed with an ICP etching apparatus, and the etching conditions were as follows: the flow rate of a $BCl_3$ gas was 80 sccm; the power supply was 450 W; the bias power was 100 W; the pressure was 1.2 Pa; and the substrate temperature was 70° C.

Here, in Sample 2A, etching of a region of the insulator 224 that does not overlap with the oxide 230a was prevented so that T2=T1. In Sample 2B, the region of the insulator 224 that does not overlap with the oxide 230a was etched so that T2>T1−T2. In Sample 2C, the region of the insulator 224 that does not overlap with the oxide 230a was etched so that T2<T1−T2 (note that T2>0). In Sample 2D, the region of the insulator 224 that does not overlap with the oxide 230a was etched and removed so that T2=0.

Then, a 30-nm-thick aluminum oxide film was formed by an RF sputtering method as the insulator 272 (see FIGS. 6A and 6B). Note that the RF sputtering method was performed under the following conditions: as the deposition gases, an argon gas at 25 sccm and an oxygen gas at 25 sccm were used; the deposition pressure was 0.4 Pa; the deposition power was 2500 W; the substrate temperature was 250° C.; and the distance between the target and the substrate was 60 mm. Furthermore, after the insulator 272 was formed, a 10-nm-thick aluminum oxide film was formed thereover by an ALD method.

Next, heat treatment was performed at 400° C. in an oxygen atmosphere for one hour (see FIGS. 6C and 6D).

In the above manner, Samples 2A to 2D that are transistors each having a channel length L of 0.22 μm and a channel width W of 0.29 μm were fabricated. Note that an insulating film functioning as an interlayer film, a conductive film functioning as a wiring, and the like were further provided over the insulator 272.

Next, the cross sections of Samples 2A to 2D were observed with a scanning transmission electron microscope (STEM). The cross-sectional observation was performed with HD-2300 manufactured by Hitachi High-Technologies Corporation at 200000× magnification.

Figure 22A:
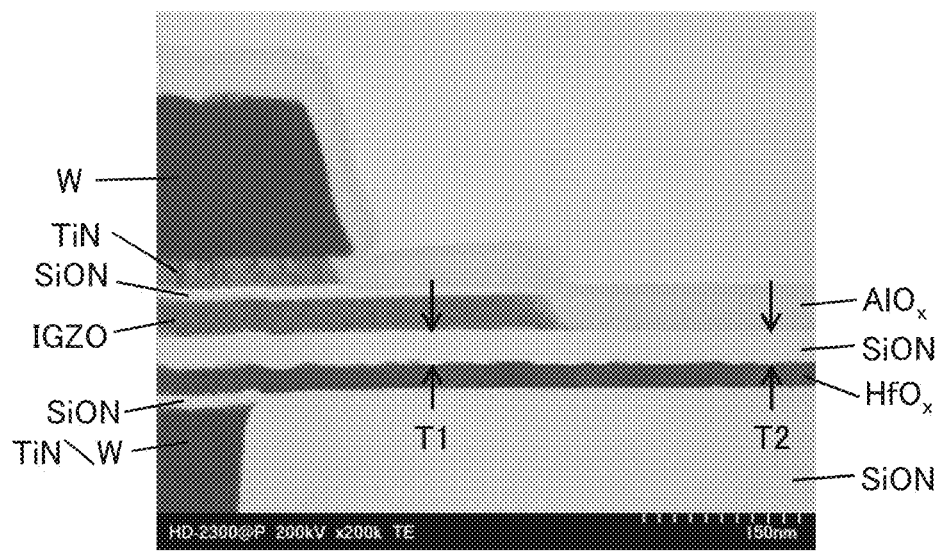
FIG. 22A is a cross-sectional photograph of a transistor observed in Example.
Figure 23A:
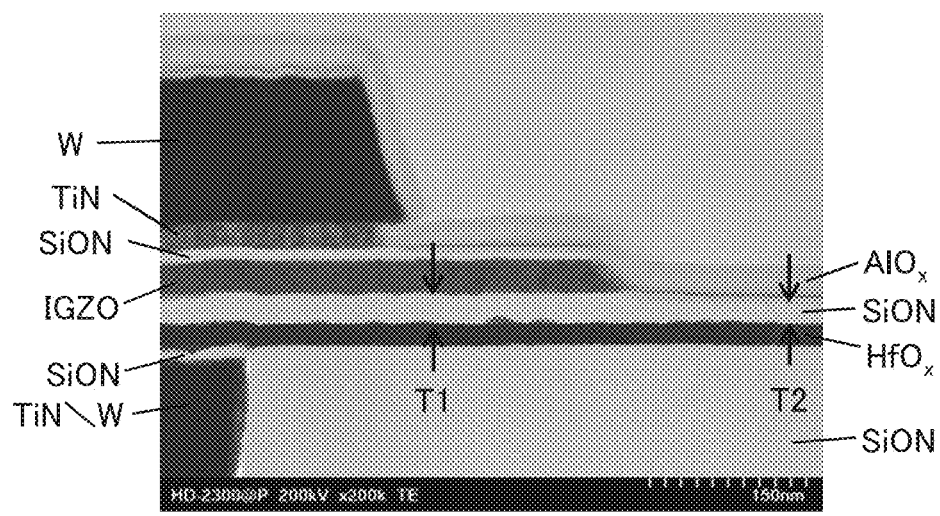
FIG. 23A is a cross-sectional photograph of a transistor observed in Example.
Figure 24A:
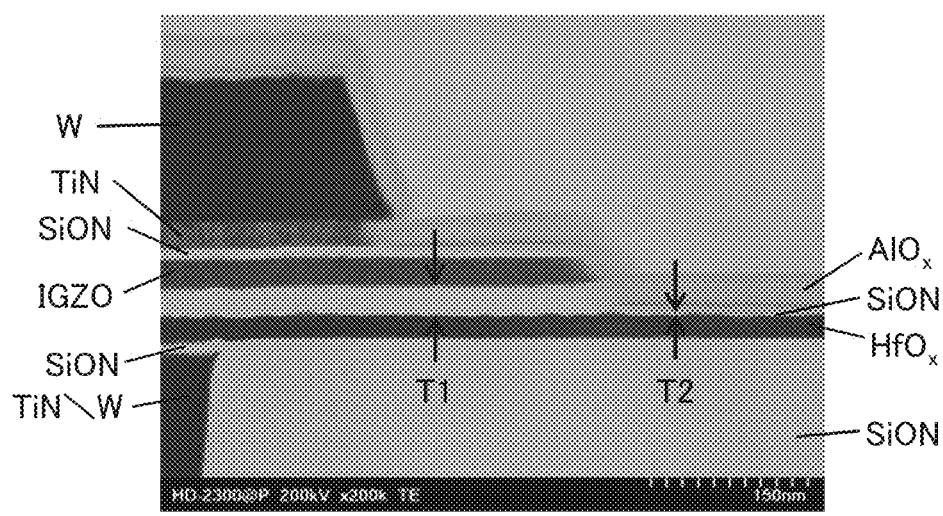
FIG. 24A is a cross-sectional photograph of a transistor observed in Example.
Figure 25A:
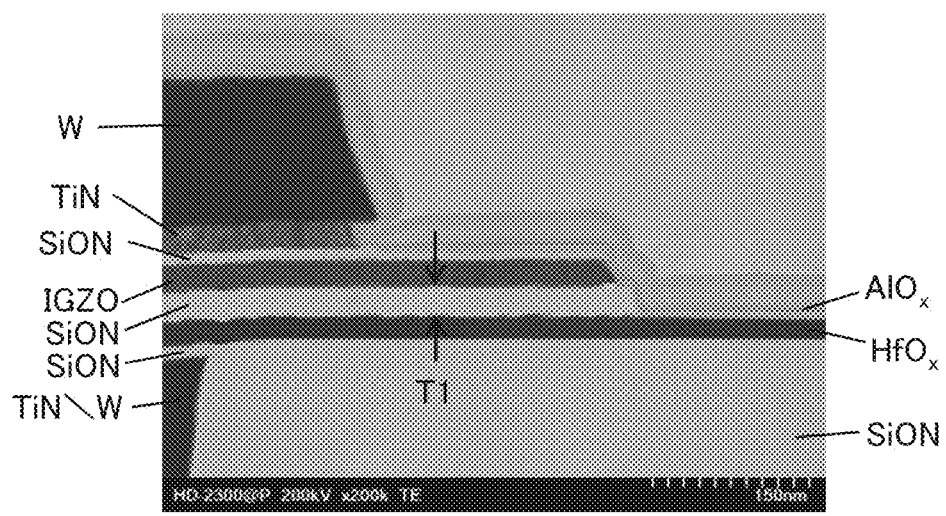
FIG. 25A is a cross-sectional photograph of a transistor observed in Example.

FIG. 22A, FIG. 23A, FIG. 24A, and FIG. 25A show cross-sectional photographs of Samples 2A to 2D. As shown in FIG. 22A, in Sample 2A, T2 is approximately equal to T1, and T2 is 31.7 nm. As shown in FIG. 23A, in Sample 2B, T2>T1-T2, and T2 is 19.8 nm. As shown in FIG. 24A, in Sample 2C, T2<T1-T2, and T2 is approximately 3 nm to 5 nm. As shown in FIG. 25A, in Sample 2D, T2 is 0 nm, and the corresponding region of the insulator 224 was eliminated.

Next, the $I_d$-$V_g$ characteristics (drain current-gate voltage characteristics) of Samples 2A to 2D were measured. The $I_d$-$V_g$ characteristics were measured under the following conditions: the drain voltage ($V_d$) was 0.1 V or 3.3 V; the back gate voltage was 0 V; and the gate voltage was swept from −3.0 V to 3.0 V in increments of 0.1 V.

Furthermore, the gate voltage at the rising of drain current (hereinafter referred to as Shift) was obtained from the measured $I_d$-$V_g$ characteristics. Furthermore, Shift in this specification is defined as, in the $V_g$-$I_d$ curve where the horizontal axis represents the gate voltage $V_g$ [V] and the vertical axis represents the logarithm of the drain current $I_d$ [A], a gate voltage at the intersection point of the line of $I_d$=1.0×10$^{-12}$ [A] and the tangent to the curve at a point where the slope of the curve is the steepest. Note that here, Shift was calculated with a drain voltage $V_d$ of 3.3 V.

FIG. 22B, FIG. 23B, FIG. 24B, and FIG. 25B show measurement results of the $I_d$-$V_g$ characteristics of Samples 2A to 2D. In each graph, the horizontal axis represents the gate voltage $V_g$ [V] and the vertical axis represents the drain current $I_d$ [A]. The drain current at $V_d$ of 0.1 V is shown by a fine solid line, and the drain current at $V_d$ of 3.3 V is shown by a thick solid line.

Figure 22B:
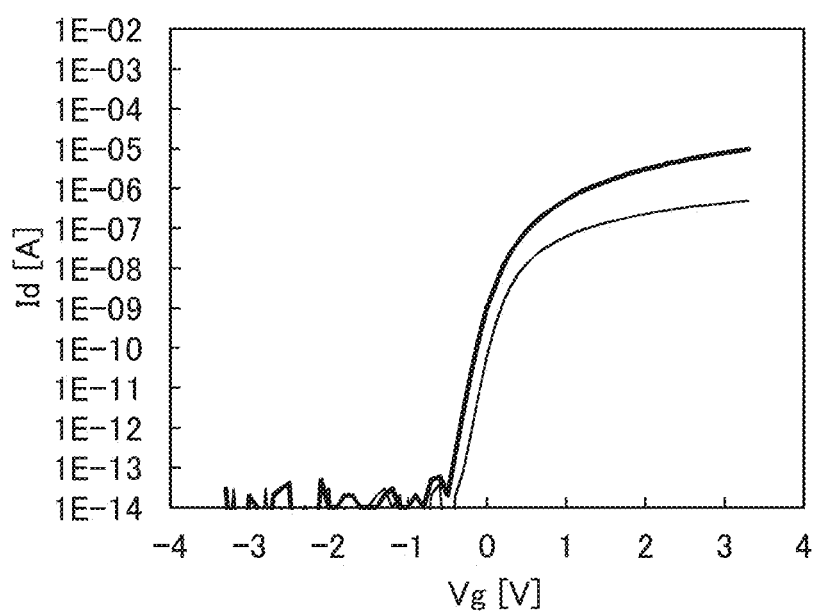
FIG. 22B is a graph showing $I_d$-$V_g$ characteristics of the transistor.
Figure 23B:
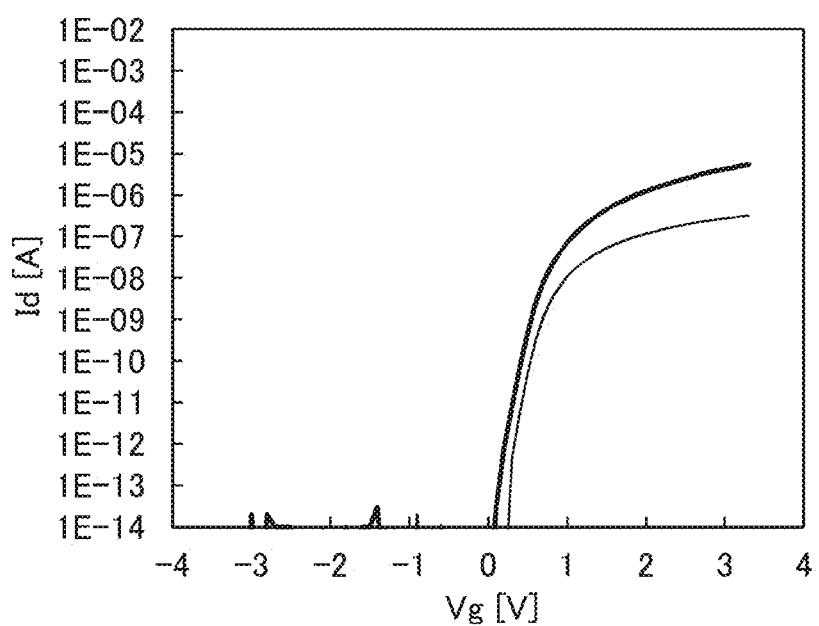
FIG. 23B is a graph showing $I_d$-$V_g$ characteristics of the transistor.
Figure 24B:
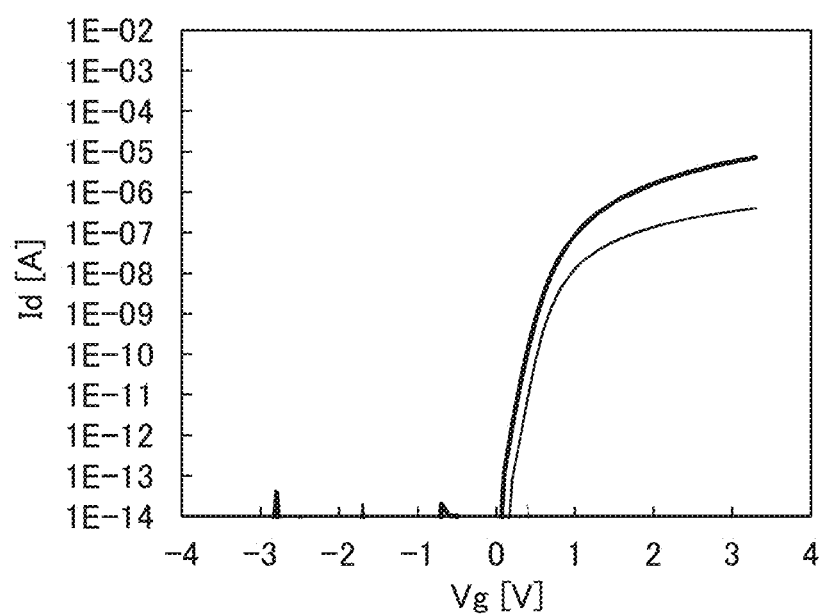
FIG. 24B is a graph showing $I_d$-$V_g$ characteristics of the transistor.
Figure 25B:
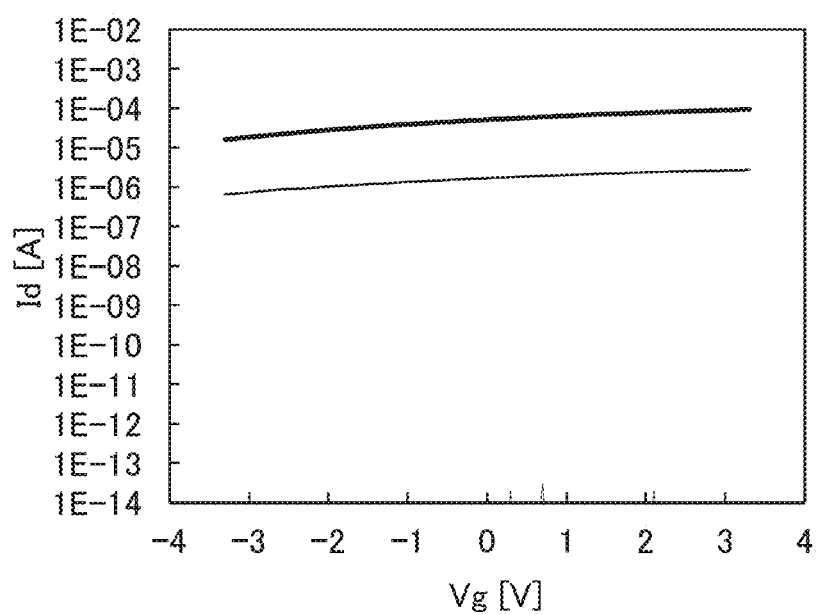
FIG. 25B is a graph showing $I_d$-$V_g$ characteristics of the transistor.

As shown in FIG. 22B, Sample 2A has a Shift of −0.34 V and is normally on. As shown in FIG. 23B, Sample 2B has a Shift of 0.20 V and is normally off. As shown in FIG. 24B, Sample 2C has a Shift of 0.18 V and is normally off. As shown in FIG. 25B, in Sample 2D, drain current flows regardless of $V_g$ and switching characteristics are not obtained.

As shown above, there is a correlation between the thickness T2 of the insulator 224 of each sample and the $I_d$-$V_g$ characteristics. This shows that, as described in Example 1, in the fabrication process of each of the transistors, the above-described damaged region was formed on the surface of the insulator 224.

In Sample 2A, the damaged region formed on the surface of the insulator 224 was not removed, and the transistor was fabricated. Thus, in the step illustrated in FIGS. 6C and 6D, oxygen diffusion was inhibited by the damaged region; accordingly, a sufficient amount of oxygen was not supplied to the oxide 230b. Thus, it can be inferred that, in Sample 2A, oxygen vacancies in the oxide 230b were not able to be sufficiently reduced, and therefore the transistor became normally on.

In contrast, in Samples 2B and 2C, the damaged region formed on the surface of the insulator 224 was removed, and the transistors were fabricated. Thus, in the step illustrated in FIGS. 6C and 6D, oxygen diffusion was not inhibited by the damaged region; accordingly, a sufficient amount of oxygen was supplied to the oxide 230b. Thus, it can be inferred that, in each of Samples 2B and 2C, oxygen vacancies in the oxide 230b were able to be sufficiently reduced, and therefore the transistor became normally off.

In Sample 2B, the surface of the insulator 224 was etched to a depth of approximately 10 nm. This corresponds well with the depth of the damaged region described in Example 1 with reference to FIG. 20 and FIG. 21. Thus, the damaged region can be removed by removing the insulator 224 to a depth of at least 5 nm, preferably 10 nm, further preferably 20 nm from the surface of the insulator 224.

Although the thickness T2 of the insulator 224 was approximately 3 nm to 5 nm in Sample 2C, excellent electrical characteristics were obtained. Accordingly, when the thickness T2 of the insulator 224 is at least greater than or equal to approximately 3 nm to 5 nm, a sufficient amount of oxygen can be supplied to the oxide 230b.

Note that in Sample 2D, a region of the insulator 224 except a region that overlaps with the oxide 230a was eliminated, and thus oxygen was hardly supplied to the oxide 230b in the step illustrated in FIGS. 6C and 6D. Accordingly, in Sample 2D, it can be expected that a large number of oxygen vacancies were left in the oxide 230b and thus the transistor could not have switching characteristics.

As described above, by removing the damaged region of the surface of the insulator 224 and supplying oxygen to the oxide 230b sufficiently, the transistor can be normally off.

This application is based on Japanese Patent Application Serial No. 2016-202389 filed with Japan Patent Office on Oct. 14, 2016, the entire contents of which are hereby incorporated by reference.

What is claimed is:

1. A semiconductor device comprising:
a first insulator over a substrate;
a first oxide semiconductor over the first insulator;
a second oxide semiconductor in contact with at least part of a top surface of the first oxide semiconductor;
a first conductor in contact with at least part of a top surface of the second oxide semiconductor;
a second conductor that is in contact with at least part of the top surface of the second oxide semiconductor and faces the first conductor;
a third oxide semiconductor that is over the first conductor and the second conductor and is in contact with at least part of the top surface of the second oxide semiconductor;
a second insulator over the third oxide semiconductor;
a third conductor which is over the second insulator and at least part of which overlaps with a region between the first conductor and the second conductor; and a third insulator which is over the third conductor and at least part of which is in contact with a top surface of the first insulator, wherein a side surface portion of the first oxide semiconductor, a side surface portion of the third oxide semiconductor, and a side surface portion of the second insulator are substantially aligned with one another, wherein the first insulator comprises a first region that is in contact with the third insulator and a second region that is in contact with the first oxide semiconductor, and a thickness of the first region is less than a thickness of the second region, and wherein the first oxide semiconductor comprises a first region that is in contact with the third oxide semiconductor and a second region that is in contact with the second oxide semiconductor, and a thickness of the first region of the first oxide semiconductor is less than a thickness of the second region of the first oxide semiconductor.

2. The semiconductor device according to claim 1,
wherein a side surface portion of the first conductor is substantially aligned with a side surface portion of the second oxide semiconductor, wherein a side surface portion of the second conductor is substantially aligned with a side surface portion of the second oxide semiconductor, and wherein the side surface portions of the second oxide semiconductor are located inward from side surface portions of the first oxide semiconductor.

3. The semiconductor device according to claim 2, wherein in a cross section in a channel width direction, a side surface portion of the third conductor is located inward from a side surface portion of the first oxide semiconductor.

4. The semiconductor device according to claim 1, wherein a difference between the thickness of the first region of the first insulator and the thickness of the second region of the first insulator is greater than or equal to 5 nm.

5. The semiconductor device according to claim 1, wherein in the first region of the first insulator, a spin density at a g-factor of approximately 2.0 in ESR measurement is lower than or equal to $2.0 \times 10^{17}$ spins/cm$^3$.

6. The semiconductor device according to claim 1, further comprising:

a fourth conductor which is under the first insulator and at least part of which overlaps with the third conductor.

7. The semiconductor device according to claim 1,
wherein each of the first oxide semiconductor, the second oxide semiconductor, and the third oxide semiconductor comprises indium, an element M, zinc, and oxygen, and wherein the element M is Ti, Ga, Y, Zr, La, Ce, Nd, Sn, or Hf.

8. The semiconductor device according to claim 1, wherein the third insulator comprises oxygen and aluminum.

9. The semiconductor device according to claim 1, wherein an energy level of a conduction band minimum of each of the first oxide semiconductor and the third oxide semiconductor is closer to a vacuum level than an energy level of a conduction band minimum of the second oxide semiconductor is.

10. A semiconductor device comprising:
a first insulating film;
a first oxide semiconductor film over the first insulating film;
a second oxide semiconductor film over the first oxide semiconductor film;
a source electrode over the second oxide semiconductor film;
a drain electrode over the second oxide semiconductor film;
a second insulating film over the source electrode and the drain electrode;
a gate electrode over the second insulating film; and
a third insulating film over the gate electrode,
wherein the first insulating film comprises a first region that is in contact with the third insulating film and a second region that is in contact with the first oxide semiconductor film, and a thickness of the first region is less than a thickness of the second region, and wherein a difference between the thickness of the first region and the thickness of the second region is greater than or equal to 10 nm.

11. The semiconductor device according to claim 10, wherein the third insulating film comprises aluminum oxide.

* * * * *